(12) United States Patent
Yamazaki et al.

(10) Patent No.: US 9,437,741 B2
(45) Date of Patent: Sep. 6, 2016

(54) SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Setagaya (JP); Hiroyuki Miyake, Atsugi (JP); Kenichi Okazaki, Tochigi (JP); Masahiko Hayakawa, Tochigi (JP); Shinpei Matsuda, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 14/272,759

(22) Filed: May 8, 2014

(65) Prior Publication Data

US 2014/0339539 A1 Nov. 20, 2014

(30) Foreign Application Priority Data

May 16, 2013 (JP) ................................. 2013-103716

(51) Int. Cl.
*H01L 29/786* (2006.01)
*H01L 29/49* (2006.01)
*H01L 27/12* (2006.01)

(52) U.S. Cl.
CPC ..... *H01L 29/78606* (2013.01); *H01L 27/1225* (2013.01); *H01L 27/1255* (2013.01); *H01L 29/4908* (2013.01); *H01L 29/7869* (2013.01)

(58) Field of Classification Search
CPC .................... H01L 29/78606; H01L 27/1225; H01L 27/1255; H01L 29/4908; H01L 29/7869
USPC .......................................................... 257/43
See application file for complete search history.

(56) References Cited

U.S. PATENT DOCUMENTS 5,299,041 A 3/1994 Morin et al.
5,724,107 A 3/1998 Nishikawa et al.
(Continued)

FOREIGN PATENT DOCUMENTS

EP 1737044 A 12/2006
EP 2226847 A 9/2010
(Continued)

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
(Continued)

*Primary Examiner* — Fernando L Toledo
*Assistant Examiner* — Adam S Bowen
(74) *Attorney, Agent, or Firm* — Eric J. Robinson; Robinson Intellectual Property Law Office, P.C.

(57) ABSTRACT

A semiconductor device including a transistor having excellent electrical characteristics is provided. Alternatively, a semiconductor device having a high aperture ratio and including a capacitor capable of increasing capacitance is provided. The semiconductor device includes a gate electrode, an oxide semiconductor film overlapping the gate electrode, an oxide insulating film in contact with the oxide semiconductor film, a first oxygen barrier film between the gate electrode and the oxide semiconductor film, and a second oxygen barrier film in contact with the first oxygen barrier film. The oxide semiconductor film and the oxide insulating film are provided on an inner side of the first oxygen barrier film and the second oxygen barrier film.

20 Claims, 22 Drawing Sheets

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 5,745,195 A | 4/1998 | Zhang |
| 6,294,274 B1 | 9/2001 | Kawazoe et al. |
| 6,421,101 B1 | 7/2002 | Zhang et al. |
| 6,563,174 B2 | 5/2003 | Kawasaki et al. |
| 6,727,522 B1 | 4/2004 | Kawasaki et al. |
| 6,849,872 B1 | 2/2005 | Yamazaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,142,260 B2 | 11/2006 | Yang |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,515,217 B2 | 4/2009 | Yang |
| 7,674,650 B2 | 3/2010 | Akimoto et al. |
| 7,732,819 B2 | 6/2010 | Akimoto et al. |
| 7,745,798 B2 | 6/2010 | Takahashi |
| 7,773,167 B2 | 8/2010 | Tsai et al. |
| 7,791,072 B2 | 9/2010 | Kumomi et al. |
| 7,872,261 B2 | 1/2011 | Ikeda |
| 8,102,476 B2 | 1/2012 | Son et al. |
| 8,164,152 B2 | 4/2012 | Lee et al. |
| 8,207,531 B2 | 6/2012 | Takahashi et al. |
| 8,237,166 B2 | 8/2012 | Kumomi et al. |
| 8,368,066 B2 | 2/2013 | Yamazaki et al. |
| 8,384,080 B2 | 2/2013 | Taniguchi et al. |
| 8,441,011 B2 | 5/2013 | Yamazaki et al. |
| 8,692,252 B2 | 4/2014 | Takata et al. |
| 9,202,827 B2 | 12/2015 | Koyama et al. |
| 9,207,504 B2 | 12/2015 | Kimura |
| 9,213,206 B2 | 12/2015 | Kimura |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0189156 A1 | 7/2009 | Akimoto |
| 2009/0206332 A1 | 8/2009 | Son et al. |
| 2009/0278122 A1 | 11/2009 | Hosono et al. |
| 2009/0280600 A1 | 11/2009 | Hosono et al. |
| 2009/0283762 A1 | 11/2009 | Kimura |
| 2010/0044711 A1 | 2/2010 | Imai |
| 2010/0051935 A1 | 3/2010 | Lee et al. |
| 2010/0051936 A1* | 3/2010 | Hayashi et al. ............ 257/43 |
| 2010/0065844 A1 | 3/2010 | Tokunaga |
| 2010/0092800 A1 | 4/2010 | Itagaki et al. |
| 2010/0102311 A1 | 4/2010 | Ito et al. |
| 2010/0109002 A1 | 5/2010 | Itagaki et al. |
| 2010/0123136 A1 | 5/2010 | Lee et al. |
| 2010/0163867 A1 | 7/2010 | Yamazaki et al. |
| 2010/0163874 A1 | 7/2010 | Koyama et al. |
| 2011/0024750 A1 | 2/2011 | Yamazaki et al. |
| 2011/0024751 A1 | 2/2011 | Yamazaki et al. |
| 2011/0031491 A1* | 2/2011 | Yamazaki et al. ........... 257/43 |
| 2011/0032435 A1 | 2/2011 | Kimura |
| 2011/0037068 A1 | 2/2011 | Yamazaki et al. |
| 2011/0049509 A1 | 3/2011 | Takahashi et al. |
| 2011/0084271 A1 | 4/2011 | Yamazaki et al. |
| 2011/0281394 A1* | 11/2011 | Yamazaki .................. 438/104 |
| 2012/0062811 A1 | 3/2012 | Miyake |
| 2012/0205651 A1 | 8/2012 | Lee et al. |
| 2012/0273780 A1 | 11/2012 | Yamazaki et al. |
| 2012/0280230 A1 | 11/2012 | Akimoto et al. |
| 2012/0319107 A1 | 12/2012 | Miyake |
| 2013/0069059 A1 | 3/2013 | Yamazaki |
| 2014/0014948 A1 | 1/2014 | Matsukura |
| 2014/0034954 A1 | 2/2014 | Yamazaki et al. |
| 2014/0357019 A1 | 12/2014 | Koyama et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |

(56) References Cited

FOREIGN PATENT DOCUMENTS

| JP | 07-104312 | | 4/1995 |
|---|---|---|---|
| JP | 08-264794 | A | 10/1996 |
| JP | 11-505377 | | 5/1999 |
| JP | 2000-044236 | A | 2/2000 |
| JP | 2000-150900 | A | 5/2000 |
| JP | 2002-076356 | A | 3/2002 |
| JP | 2002-289859 | A | 10/2002 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| JP | 2005-077822 | | 3/2005 |
| JP | 2006-165528 | A | 6/2006 |
| JP | 2011-124360 | A | 6/2011 |
| JP | 2011-138934 | A | 7/2011 |
| WO | WO-2004/114391 | | 12/2004 |

OTHER PUBLICATIONS

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.

Kimizuka.N. et al., "Spinel,YbFe2O4, and Yb2Fe3O7 Types of Structures for Compounds in the In2O3 and Sc2O3-A2O3-BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.

Kitzerow.H et al., "Observation of Blue Phases in Chiral Networks", Liquid Crystals, 1993, vol. 14, No. 3, pp. 911-916.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.

Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Li.C et al., "Modulated Structures of Homologous Compounds InMo3(ZnO)m (M=In,Ga; m=Integer) Described by Four-Dimensional Superspace Group", Journal of Solid State Chemistry, 1998, vol. 139, pp. 347-355.

Kikuchi.H et al., "Polymer-Stabilized Liquid Crystal Blue Phases", Nature Materials, Sep. 2, 2002, vol. 1, pp. 64-68.

Tsuda.K et al., "Ultra Low Power Consumption Technologies for Mobile TFT-LCDs", IDW '02 : Proceedings of the 9th International Display Workshops, Dec. 4, 2002, pp. 295-298.

Nomura.K et al., "Thin-Film Transistor Fabricated in Single-Crystalline Transparent Oxide Semiconductor", Science, May 23, 2003, vol. 300, No. 5623, pp. 1269-1272.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.

Kanno.H et al., "White Stacked Electrophosphorecent Organic Light-Emitting Devices Employing MoO3 as a Charge-Generation Layer", Adv. Mater. (Advanced Materials), 2006, vol. 18, No. 3, pp. 339-342.

Lee.H et al., "Current Status of, Challenges to, and Perspective View of AM-OLED ", IDW '06 : Proceedings of the 13th International Display Workshops, Dec. 7, 2006, pp. 663-666.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hirao.T et al., "Novel Top-Gate Zinc Oxide Thin-Film Transistors (ZnO TFTs) for AMLCDS", Journal of the SID, 2007, vol. 15, No. 1, pp. 17-22.

Park.S et al., "Challenge to Future Displays: Transparent AM-OLED Driven by Peald Grown ZnO TFT", IMID '07 Digest, 2007, pp. 1249-1252.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Miyasaka.M, "Suftla Flexible Microelectronics on Their Way to Business", SID Digest '07 : SID International Symposium Digest of Technical Papers, 2007, vol. 38, pp. 1673-1676.

Kurokawa.Y et al., "UHF RFCPUS on Flexible and Glass Substrates for Secure RFID Systems", Journal of Solid-State Circuits , 2008, vol. 43, No. 1, pp. 292-299.

Jeong.J et al., "3.1: Distinguished Paper: 12.1-Inch WXGA AMOLED Display Driven by Indium—Gallium—Zinc Oxide TFTs Array", SID Digest '08 : SID International Symposium Digest of Technical Papers, May 20, 2008, vol. 39, No. 1, pp. 1-4.

Lee.J et al., "World'S Largest (15-Inch) XGA AMLCD Panel Using IGZO Oxide TFT", SID Digest '08 : SID International Symposium Digest of Technical Papers, May 20, 2008, vol. 39, pp. 625-628.

Park.J et al., "Amorphous Indium—Gallium—Zinc Oxide TFTS and their Application for Large Size AMOLED", AM-FPD '08 Digest of Technical Papers, Jul. 2, 2008, pp. 275-278.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Sakata.J et al., "Development of 4.0-In. AMOLED Display With Driver Circuit Using Amorphous In—Ga—Zn—Oxide TFTS", IDW '09 : Proceedings of the 16th International Display Workshops, 2009, pp. 689-692.

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Nowatari.H et al., "60.2: Intermediate Connector With Suppressed Voltage Loss for White Tandem OLEDS", SID Digest '09 : SID International Symposium Digest of Technical Papers, May 31, 2009, vol. 40, pp. 899-902.

Jin.D et al., "65.2:Distinguished Paper:World-Largest (6.5") Flexible Full Color Top Emission AMOLED Display on Plastic Film and Its bending properties", SID Digest '09 : SID International Symposium Digest of Technical Papers, May 31, 2009, pp. 983-985.

Lee.M et al., "15.4:Excellent Performance of Indium—Oxide-Based Thin-Film Transistors by DC Sputtering", SID Digest '09 : SID International Symposium Digest of Technical Papers, May 31, 2009, pp. 191-193.

Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.

Kikuchi.H et al., "39.1:Invited Paper:Optically Isotropic Nano-Structured Liquid Crystal Composites for Display Application", SID Digest '09 : SID International Symposium Digest of Technical Papers, May 31, 2009, pp. 578-581.

Osada.T et al., "15.2: Development of Driver-Integrated Panel using Amorphous In—Ga—Zn—Oxide TFT", SID Digest '09 : SID International Symposium Digest of Technical Papers, May 31, 2009, pp. 184-187.

(56) References Cited

OTHER PUBLICATIONS

Ohara.H et al., "21.3:4.0 In. QVGA AMOLED Display Using In—Ga—Zn—Oxide TFTs With a Novel Passivation Layer", SID Digest '09 SID International Symposium Digest of Technical Papers, May 31, 2009, pp. 284-287.

Godo.H et al., "P-9:Numerical Analysis on Temperature Dependence of Characteristics of Amorphous In—Ga—Zn—Oxide TFT", SID Digest '09 SID International Symposium Digest of Technical Papers, May 31, 2009, pp. 1110-1112.

Osada.T et al., "Development of Driver-Integrated Panel Using Amorphous In—Ga—Zn—Oxide TFT", AM-FPD '09 Digest of Technical Papers, Jul. 1, 2009, pp. 33-36.

Godo.H et al., "Temperature Dependence of Characteristics and Electronic Structure for Amorphous In—Ga—Zn—Oxide TFT", AM-FPD '09 Digest of Technical Papers, Jul. 1, 2009, pp. 41-44.

Ohara.H et al., "Amorphous In—Ga—Zn—Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent InGaZnO4", Phys. Rev. B. (Physical Review. B), Jan. 15, 2000, vol. 61., No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide InGaO3(ZnO)m (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors By Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium—Gallium—Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn-O TFTS", SID Digest '08 : SID International Symposium Digest of Technical Papers, May 20, 2008, vol. 39, pp. 621-624.

Son.K et al., "42.4L: Late-News Paper: 4 Inch QVGA AMOLED Driven by the Threshold Voltage Controlled Amorphous GIZO (Ga2O3—In2O3—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 16th International Display Workshops, Dec. 3, 2008, pp. 581-584.

Asakuma.N et al., "Crystallization and Reduction of SOL—GEL—Derived Zinc Oxide Films by Irradation with Ultraviolet Lamp", Journal of SOL-GEL Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Socieltry), 2008, vol. 155, No. 12, pp. H1009-H1014.

Park.J at al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on SrTiO3 With Sputtered Al2O3 Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystaline InGaO3(ZnO)5 films", Appl. Phys. Lett. (Applied Physics Letters), Sep. 13, 2004, vol. 85, No. 11, pp. 1993-1995.

\* cited by examiner

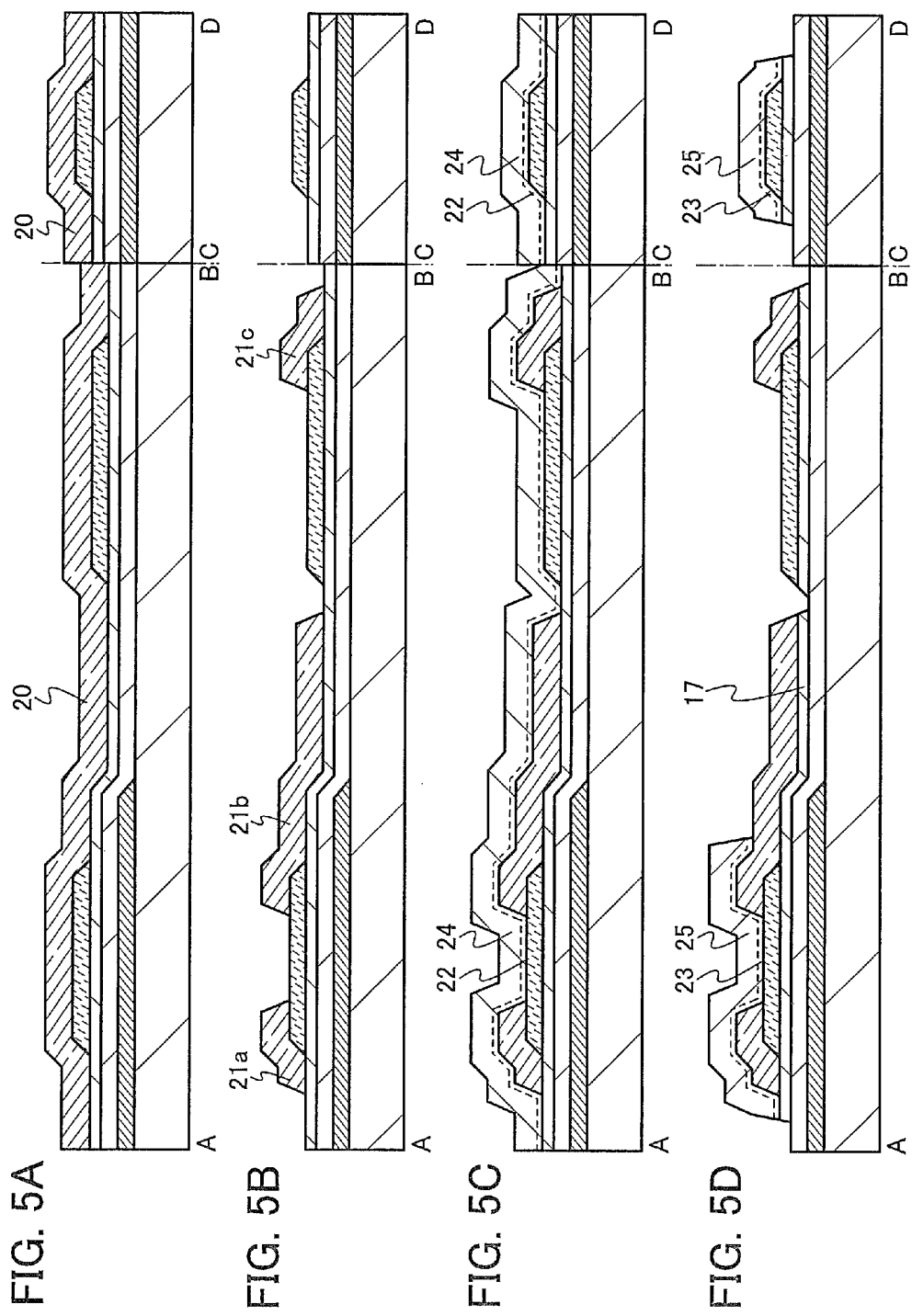

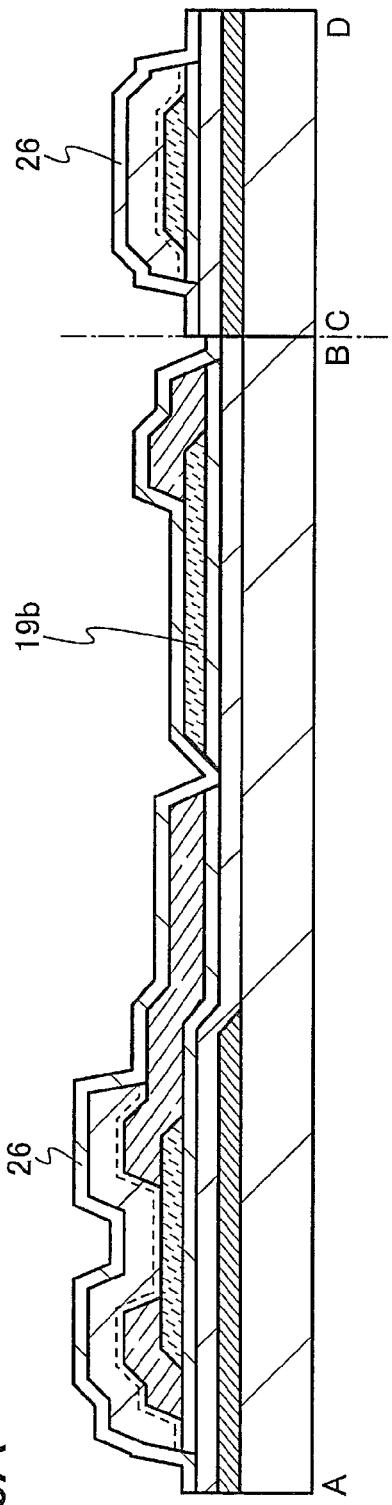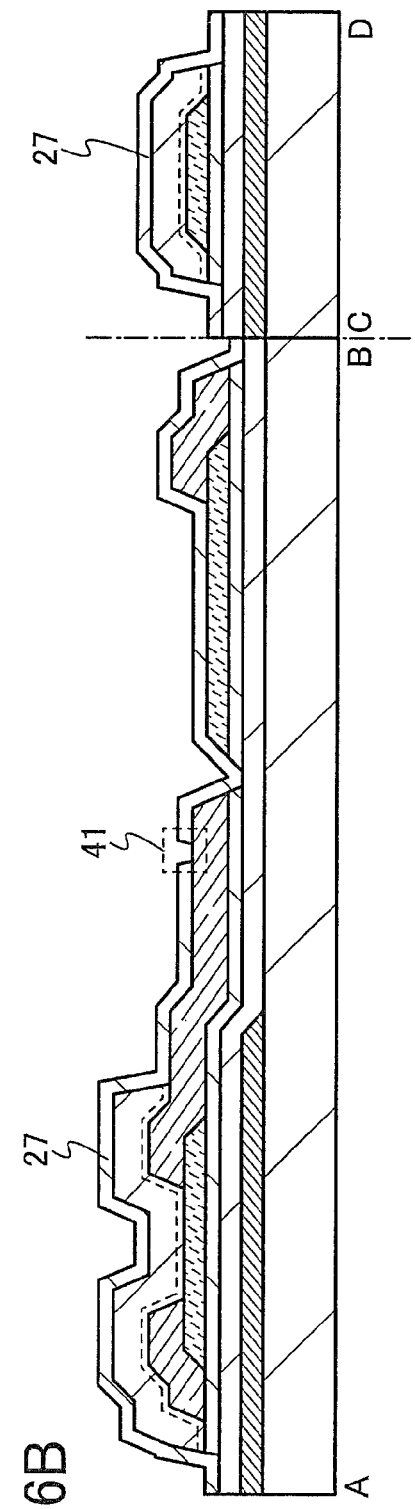

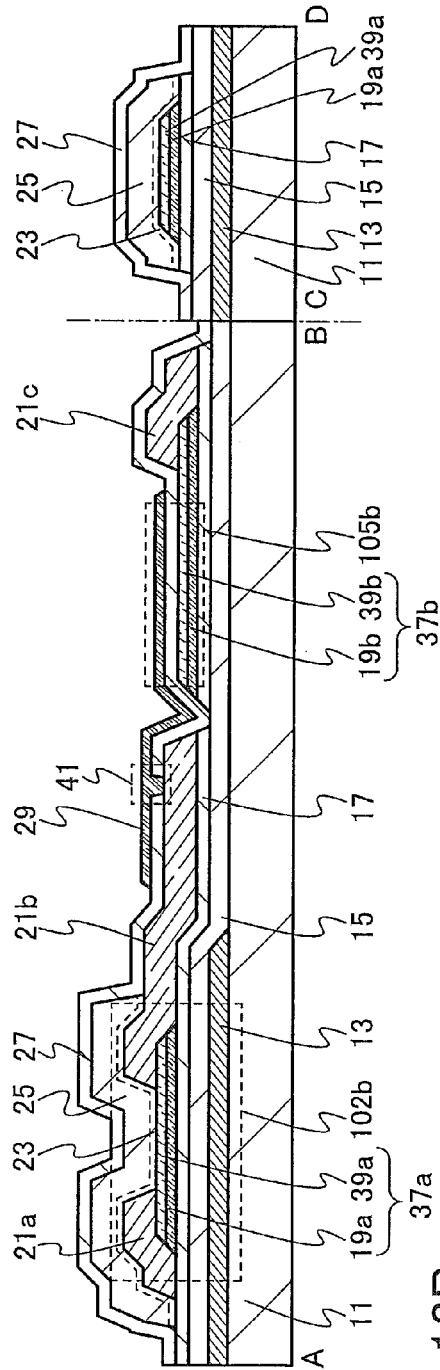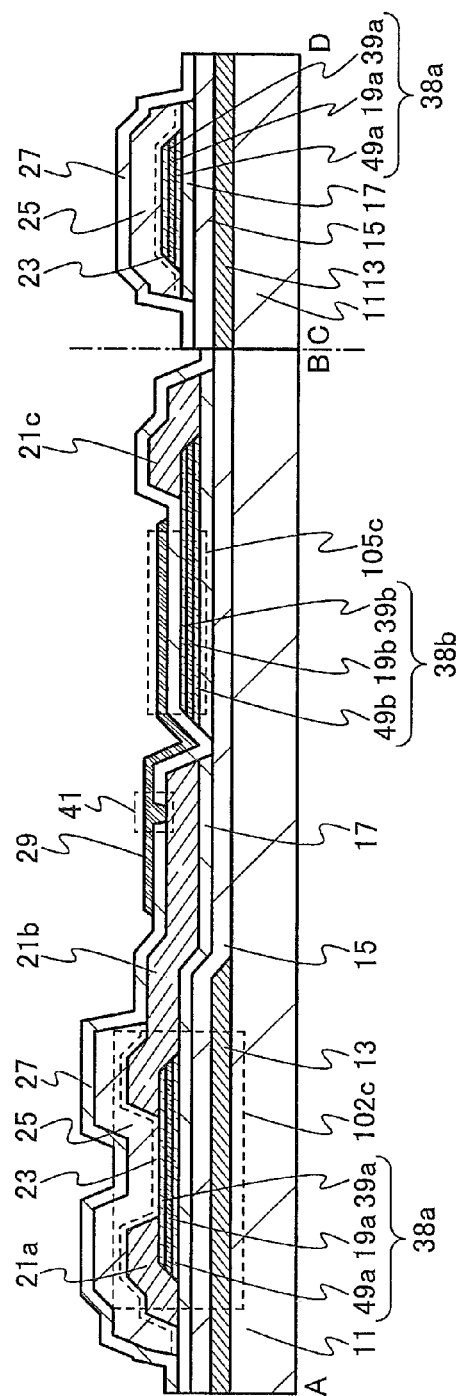

SEMICONDUCTOR DEVICE

BACKGROUND OF THE INVENTION

1. Field of the Invention

The present invention relates to a semiconductor device provided with a transistor including an oxide semiconductor film and a manufacturing method thereof.

2. Description of the Related Art

Attention has been focused on a technique for forming a transistor using a semiconductor thin film formed over a substrate (also referred to as thin film transistor (TFT)). Such a transistor is applied to a wide range of electronic devices such as an integrated circuit (IC) and an image display device (display device). A silicon-based semiconductor material is widely known as a material for a semiconductor thin film applicable to a transistor. As another material, an oxide semiconductor has been attracting attention.

For example, a transistor including an oxide semiconductor containing indium (In), gallium (Ga), and zinc (Zn) as an active layer is disclosed (see Patent Document 1).

Moreover, a technique in which an oxide semiconductor layer having a stacked-layer structure improves carrier mobility is disclosed (see Patent Documents 2 and 3).

REFERENCE

Patent Document

[Patent Document 1] Japanese Published Patent Application No. 2006-165528
[Patent Document 2] Japanese Published Patent Application No. 2011-138934
[Patent Document 3] Japanese Published Patent Application No. 2011-124360

SUMMARY OF THE INVENTION

One of defects included in an oxide semiconductor film is an oxygen vacancy. For example, the threshold voltage of a transistor including an oxide semiconductor film which contains oxygen vacancies in the film easily shifts in the negative direction, and such a transistor tends to have normally-on characteristics. This is because electric charges are generated owing to oxygen vacancies in the oxide semiconductor film and the resistance is thus reduced. The transistor having normally-on characteristics causes various problems in that malfunction is likely to be caused when in operation and that power consumption is increased when not in operation, for example. Further, there is a problem in that the amount of change in electrical characteristics, typically in threshold voltage, of the transistor over time or due to a stress test is increased.

Then, in one embodiment of the present invention, a semiconductor device including a transistor having excellent electrical characteristics is provided. Alternatively, a semiconductor device having a high aperture ratio and including a capacitor capable of increasing charge capacity is provided.

One embodiment of the present invention is a semiconductor device including a gate electrode, an oxide semiconductor film overlapping the gate electrode, an oxide insulating film in contact with the oxide semiconductor film, a first oxygen barrier film provided between the gate electrode and the oxide semiconductor film, and a second oxygen barrier film in contact with the first oxygen barrier film. The oxide semiconductor film and the oxide insulating film are provided on an inner side of the first oxygen barrier film and the second oxygen barrier film.

Another embodiment of the present invention is a semiconductor device including a first gate electrode, an oxide semiconductor film overlapping the first gate electrode, a first oxygen barrier film provided between the first gate electrode and the oxide semiconductor film, an oxide insulating film in contact with the oxide semiconductor film, a second oxygen barrier film in contact with the oxide insulating film, and a second gate electrode overlapping the oxide semiconductor film with the oxide insulating film and the second oxygen barrier film provided therebetween. The first oxygen barrier film and the second oxygen barrier film are in contact with each other. The oxide semiconductor film and the oxide insulating film are provided on an inner side of the first oxygen barrier film and the second oxygen barrier film. Moreover, a side surface of the oxide semiconductor film faces the second gate electrode.

The first gate electrode and the second gate electrode are connected to each other in an opening in the first oxygen barrier film and the second oxygen barrier film.

The oxide insulating film in contact with the oxide semiconductor film may include an oxide insulating film containing more oxygen than that in the stoichiometric composition. The oxide insulating film containing more oxygen than that in the stoichiometric composition is an oxide insulating film of which the amount of released oxygen atoms is greater than or equal to $1.0 \times 10^{18}$ atoms/cm$^3$, or greater than or equal to $3.0 \times 10^{20}$ atoms/cm$^3$ in thermal desorption spectroscopy (TDS) analysis in which heat treatment is performed such that a temperature of a film surface is higher than or equal to 100° C. and lower than or equal to 700° C. or higher than or equal to 100° C. and lower than or equal to 500° C.

Further, a first conductive film in contact with the oxide semiconductor film may be included in the semiconductor device. The first conductive film serves as a pair of electrodes. In addition, a second conductive film in contact with the second oxygen barrier film and the first conductive film may be included. The second conductive film serves as a pixel electrode.

Further, in the semiconductor device, a capacitor may include a film having conductivity over the first oxygen barrier film, the second oxygen barrier film in contact with the film having conductivity, and the second conductive film.

Note that the film having conductivity is a metal oxide film including a metal element contained in the oxide semiconductor film, and includes an impurity. As the impurity, hydrogen, boron, phosphorus, tin, antimony, a rare gas element, alkali metal, alkaline earth metal, and the like are given.

The first oxygen barrier film and the second oxygen barrier film are in contact with each other with the oxide semiconductor film and the oxide insulating film provided on an inner side of the first oxygen barrier film and the second oxygen barrier film. Therefore, the movement of oxygen contained in the oxide insulating film to the outside of the first oxygen barrier film and the second oxygen barrier film can be suppressed. As a result, oxygen contained in the oxide insulating film can be moved to the oxide semiconductor film efficiently, and the amount of oxygen vacancies in the oxide semiconductor film can be reduced.

Further, in the transistor including the first gate electrode and the second gate electrode, the oxide insulating film, which is subjected to element isolation, overlaps the oxide semiconductor film. Moreover, in the cross-sectional view in the channel width direction, end portions of the oxide insulating film are positioned on an outer side than the oxide semiconductor film, and a side surface of the oxide semiconductor film faces the first gate electrode or the second gate electrode. As a result, due to the electric field of the first gate electrode or the second gate electrode, generation of parasitic channels at the end portions of the oxide insulating film are suppressed.

On an element substrate of one embodiment of the present invention, one electrode of the capacitor is formed at the same time as the oxide semiconductor film of the transistor. In addition, the conductive film that serves as a pixel electrode is used as the other electrode of the capacitor. Thus, a step of forming another conductive film is not needed to form the capacitor, and the number of steps of manufacturing the semiconductor device can be reduced. Further, since the pair of electrodes has a light-transmitting property, the capacitor has a light-transmitting property. As a result, the area occupied by the capacitor can be increased and the aperture ratio in a pixel can be increased.

According to one embodiment of the present invention, a semiconductor device including a transistor having excellent electrical characteristics can be provided. Alternatively, a semiconductor device having a high aperture ratio and including a capacitor capable of increasing charge capacity can be provided.

BRIEF DESCRIPTION OF THE DRAWINGS

In the accompanying drawings:

FIGS. 5A to 5D are cross-sectional views illustrating one embodiment of a method for manufacturing a semiconductor device;

FIGS. 6A and 6B are cross-sectional views illustrating one embodiment of a method for manufacturing a semiconductor device;

FIGS. 18A and 18B are cross-sectional views each illustrating one embodiment of a semiconductor device;

DETAILED DESCRIPTION OF THE INVENTION

Figure 1A:
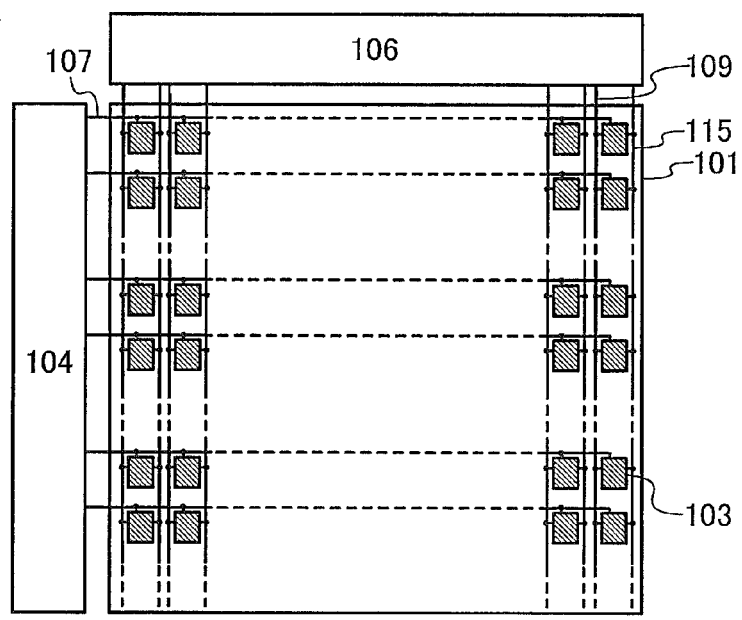
FIGS. 1A to 1C are a block diagram and circuit diagrams illustrating one embodiment of a semiconductor device.

Embodiments of the present invention are described in detail below with reference to the accompanying drawings. However, the present invention is not limited to the following description and it is easily understood by those skilled in the art that the mode and details can be variously changed without departing from the scope and spirit of the present invention. Therefore, the present invention should not be construed as being limited to the description in the following embodiments. In addition, in the following embodiments, the same portions or portions having similar functions are denoted by the same reference numerals or the same hatching patterns in different drawings, and description thereof is not repeated.

Note that in each drawing described in this specification, the size, the film thickness, or the region of each component is exaggerated for clarity in some cases. Therefore, embodiments of the present invention are not limited to such scales.

Note that terms such as "first", "second", and "third" in this specification are used in order to avoid confusion among components, and the terms do not limit the components numerically. Therefore, for example, the term "first" can be replaced with the term "second", "third", or the like as appropriate.

Functions of a "source" and a "drain" are sometimes replaced with each other when the direction of current flow is changed in circuit operation, for example. Therefore, the terms "source" and "drain" can be used to denote the drain and the source, respectively, in this specification.

Note that a voltage refers to a difference between potentials of two points, and a potential refers to electrostatic energy (electric potential energy) of a unit charge at a given point in an electrostatic field. Note that in general, a difference between a potential of one point and a reference potential (e.g., a ground potential) is merely called a potential or a voltage, and a potential and a voltage are used as synonymous words in many cases. Thus, in this specification, a potential may be rephrased as a voltage and a voltage may be rephrased as a potential unless otherwise specified.

In this specification, in the case where an etching step is performed after a photolithography process, a mask formed in the photolithography process is removed after the etching step.

Embodiment 1

In this embodiment, a semiconductor device that is one embodiment of the present invention is described with reference to drawings. Note that in this embodiment, a semiconductor device of one embodiment of the present invention is described taking a display device as an example. In addition, an oxide semiconductor film is used as a semiconductor film in this embodiment.

FIG. 1A illustrates an example of a semiconductor device. The semiconductor device in FIG. 1A includes a pixel portion 101, a scan line driver circuit 104, a signal line driver circuit 106, m scan lines 107 which are arranged in parallel or substantially in parallel and whose potentials are controlled by the scan line driver circuit 104, and n signal lines 109 which are arranged in parallel or substantially in parallel and whose potentials are controlled by the signal line driver circuit 106. Furthermore, the pixel portion 101 includes a plurality of pixels 103 arranged in a matrix. In addition, capacitor lines 115 arranged in parallel or substantially in parallel are provided along the signal lines 109. Note that the capacitor lines 115 may be arranged in parallel or substantially in parallel along the scan lines 107. The scan line driver circuit 104 and the signal line driver circuit 106 are collectively referred to as a driver circuit portion in some cases.

Each scan line 107 is electrically connected to the n pixels 103 in the corresponding row among the pixels 103 arranged in m rows and n columns in the pixel portion 101. Each signal line 109 is electrically connected to the m pixels 103 in the corresponding column among the pixels 103 arranged in m rows and n columns. Note that m and n are each an integer of 1 or more. Each capacitor line 115 is electrically connected to the n pixels 103 in the corresponding row among the pixels 103 arranged in m rows and n columns. Note that in the case where the capacitor lines 115 are arranged in parallel or substantially in parallel along the signal lines 109, each capacitor line 115 is electrically connected to the m pixels 103 in the corresponding column among the pixels 103 arranged in m rows and n columns.

Figure 1B:
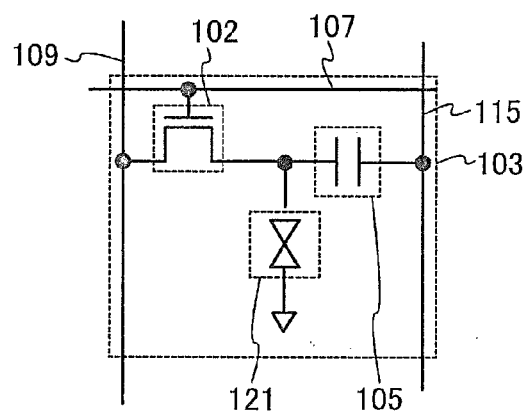
Figure 1C:
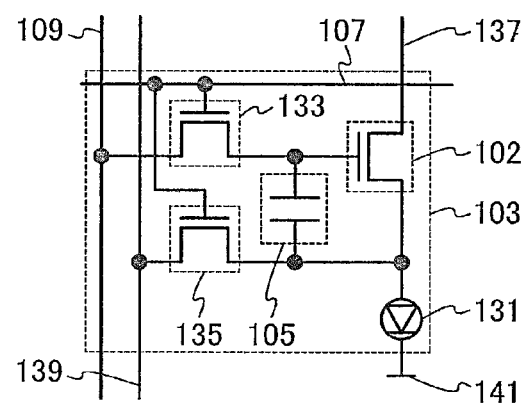

FIGS. 1B and 1C each illustrate an example of circuit configurations that can be used for the pixels 103 in the display device illustrated in FIG. 1A.

The pixel 103 in FIG. 1B includes a liquid crystal element 121, a transistor 102, and a capacitor 105.

The potential of one of a pair of electrodes of the liquid crystal element 121 is set in accordance with the specifications of the pixel 103 as appropriate. The alignment state of the liquid crystal element 121 depends on written data. A common potential may be supplied to one of the pair of electrodes of the liquid crystal element 121 included in each of a plurality of pixels 103. Further, the potential supplied to the one of the pair of electrodes of the liquid crystal element 121 in the pixel 103 in one row may be different from the potential supplied to the one of the pair of electrodes of the liquid crystal element 121 in the pixel 103 in another row.

The liquid crystal element 121 is an element that controls transmission and non-transmission of light by an optical modulation action of liquid crystal. Note that optical modulation action of a liquid crystal is controlled by an electric field applied to the liquid crystal (including a horizontal electric field, a vertical electric field, and an oblique electric field). Examples of the liquid crystal element 121 are a nematic liquid crystal, a cholesteric liquid crystal, a smectic liquid crystal, a thermotropic liquid crystal, a lyotropic liquid crystal, a ferroelectric liquid crystal, and an antiferroelectric liquid crystal.

As examples of a driving method of the display device including the liquid crystal element 121, any of the following modes can be given: a TN mode, a VA mode, an ASM (axially symmetric aligned micro-cell) mode, an OCB (optically compensated birefringence) mode, an MVA mode, a PVA (patterned vertical alignment) mode, an IPS mode, an FFS mode, a TBA (transverse bend alignment) mode, and the like. Note that the present invention is not limited to this, and various liquid crystal elements and driving methods can be used as a liquid crystal element and a driving method thereof.

The liquid crystal element may be formed using a liquid crystal composition including liquid crystal exhibiting a blue phase and a chiral material. The liquid crystal exhibiting a blue phase has a short response time of 1 msec or less and is optically isotropic; therefore, alignment treatment is not necessary and viewing angle dependence is small.

In the structure of the pixel 103 described in FIG. 1B, one of a source electrode and a drain electrode of the transistor 102 is electrically connected to a signal line 109, and the other is electrically connected to the other of the pair of electrodes of the liquid crystal element 121. A gate electrode of the transistor 102 is electrically connected to a scan line 107. The transistor 102 has a function of controlling whether to write a data signal by being turned on or off.

In the structure of the pixel 103 illustrated in FIG. 1B, one of a pair of electrodes of the capacitor 105 is electrically connected to a capacitor line 115 to which a potential is supplied, and the other is electrically connected to the other of the pair of electrodes of the liquid crystal element 121. The potential of the capacitor line 115 is set in accordance with the specifications of the pixel 103 as appropriate. The capacitor 105 functions as a storage capacitor for storing written data.

For example, in the display device including the pixel 103 in FIG. 1B, the pixels 103 are sequentially selected row by row by the scan line driver circuit 104, whereby the transistors 102 are turned on and a data signal is written.

When the transistors 102 are turned off, the pixels 103 in which the data has been written are brought into a holding state. This operation is sequentially performed row by row; thus, an image is displayed.

The pixel 103 in FIG. 1C includes a transistor 133 performing switching of a display element, the transistor 102 controlling pixel driving, a transistor 135, the capacitor 105, and a light-emitting element 131.

One of a source electrode and a drain electrode of the transistor 133 is electrically connected to the signal line 109 to which a data signal is supplied. Moreover, a gate electrode of the transistor 133 is electrically connected to the scan line 107 to which a gate signal is supplied.

The transistor 133 has a function of controlling whether to write a data signal by being turned on or off.

One of a source electrode and a drain electrode of the transistor 102 is electrically connected to a wiring 137 serving as an anode line, and the other is electrically connected to one electrode of the light-emitting element 131. The gate electrode of the transistor 102 is electrically connected to the other of the source and drain electrodes of the transistor 133 and the one electrode of the capacitor 105.

The transistor 102 has a function of controlling current flowing through the light-emitting element 131 by being turned on or off.

One of a source electrode and a drain electrode of the transistor 135 is connected to a wiring 139 to which a reference potential of data is supplied, and the other is electrically connected to the one electrode of the light-emitting element 131 and the other electrode of the capacitor 105. Moreover, a gate electrode of the transistor 135 is electrically connected to the scan line 107 to which the gate signal is supplied.

The transistor 135 has a function of adjusting the current flowing through the light-emitting element 131. For example, when the internal resistance of the light-emitting element 131 increases because of deterioration or the like, the current flowing through the light-emitting element 131 can be corrected by monitoring current flowing through the wiring 139 to which the one of the source and drain electrodes of the transistor 135 is connected. The potential supplied to the wiring 139 can be set to 0 V, for example.

One of the pair of electrodes of the capacitor 105 is electrically connected to the gate electrode of the transistor 102 and the other of the source and drain electrodes of the transistor 133, and the other of the pair of electrodes of the capacitor 105 is electrically connected to the other of the source and drain electrodes of the transistor 135 and the one electrode of the light-emitting element 131.

In the structure of the pixel 103 in FIG. 1C, the capacitor 105 functions as a storage capacitor for storing written data.

The one of the pair of electrodes of the light-emitting element 131 is electrically connected to the other of the source and drain electrodes of the transistor 135, the other electrode of the capacitor 105, and the other of the source and drain electrodes of the transistor 102. Furthermore, the other of the pair of electrodes of the light-emitting element 131 is electrically connected to a wiring 141 serving as a cathode.

As the light-emitting element 131, an organic electroluminescent element (also referred to as an organic EL element) or the like can be used, for example. Note that the light-emitting element 131 is not limited to an organic EL element; an inorganic EL element including an inorganic material may be used.

A high power supply potential VDD is supplied to one of the wiring 137 and the wiring 141, and a low power supply potential VSS is supplied to the other. In the structure of FIG. 1C, the high power supply potential VDD is supplied to the wiring 137, and the low power supply potential VSS is supplied to the wiring 141.

In the display device including the pixel 103 in FIG. 1C, the pixels 103 are sequentially selected row by row by the scan line driver circuit 104, whereby the transistor 133 is turned on and a data signal is written.

When the transistor 133 is turned off, the pixels 103 in which the data has been written are brought into a holding state. Moreover, the transistor 133 is connected to the capacitor 105; thus, the written data can be held for a long time. Further, the amount of current flowing between the source electrode and the drain electrode of the transistor 102 is controlled. The light-emitting element 131 emits light with a luminance corresponding to the amount of flowing current. This operation is sequentially performed row by row; thus, an image can be displayed.

Figure 2:
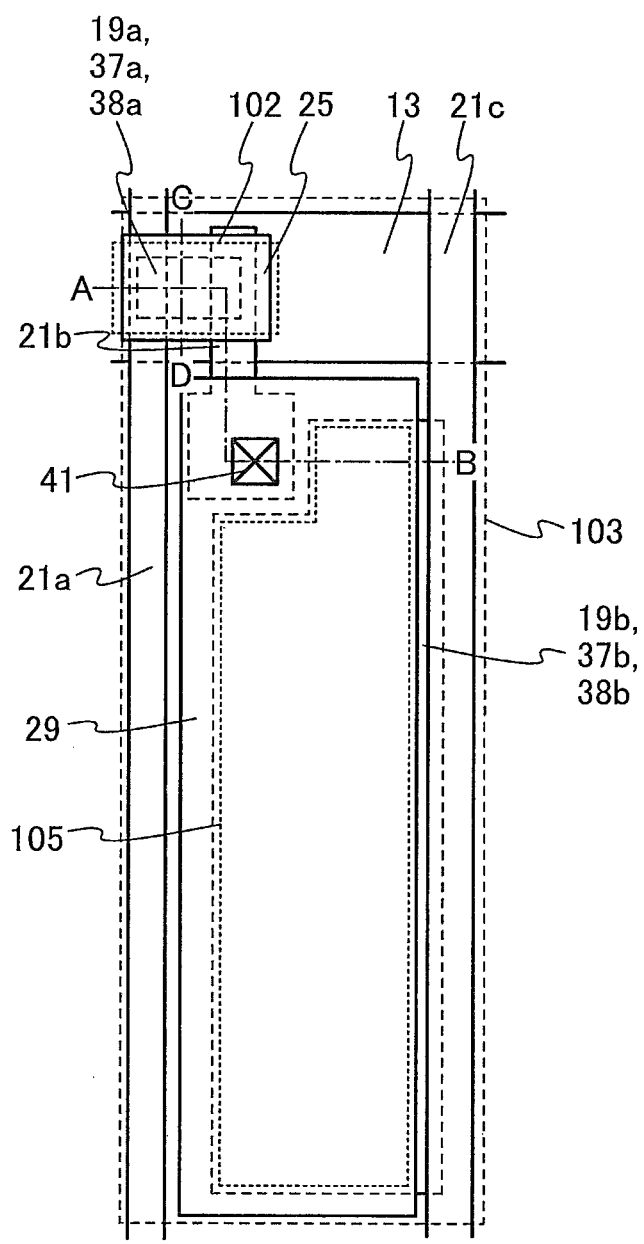
FIG. 2 is a top view illustrating one embodiment of a semiconductor device.

A specific structure of an element substrate included in the display device is described. Here, a specific example of a liquid crystal display device including a liquid crystal element in the pixel 103 is described. FIG. 2 is a top view of the pixel 103 illustrated in FIG. 1B.

In FIG. 2, a conductive film 13 serving as a scan line extends substantially perpendicularly to the signal line (in the horizontal direction in the drawing). A conductive film 21a serving as a signal line extends substantially perpendicularly to the scan line (in the vertical direction in the drawing). A conductive film 21c serving as a capacitor line extends in parallel to the signal line. Note that the conductive film 13 serving as a scan line is electrically connected to the scan line driver circuit 104 (see FIG. 1A), and the conductive film 21a serving as a signal line and the conductive film 21c serving as a capacitor line are electrically connected to the signal line driver circuit 106 (see FIG. 1A).

The transistor 102 is provided at a region where the scan line and the signal line cross each other. The transistor 102 includes the conductive film 13 serving as a gate electrode; the gate insulating film (not illustrated in FIG. 2); an oxide semiconductor film 19a where a channel region is formed, over the gate insulating film; and the conductive films 21a and 21b serving as a pair of electrodes. The conductive film 13 also serves as a scan line, and a region of the conductive film 13 that overlaps with the oxide semiconductor film 19a serves as the gate electrode of the transistor 102. In addition, the conductive film 21a also serves as a signal line, and a region of the conductive film 21a that overlaps the oxide semiconductor film 19a serves as the source electrode or the drain electrode of the transistor 102. Further, in the top view of FIG. 2, an end portion of the scan line is located on the outer side than an end portion of the oxide semiconductor film 19a. Thus, the scan line functions as a light-blocking film for blocking light from a light source such as a backlight. For this reason, the oxide semiconductor film 19a included in the transistor is not irradiated with light, so that a variation in the electrical characteristics of the transistor can be suppressed.

The conductive film 21b is electrically connected to the light-transmitting conductive film 29 that serves as a pixel electrode, through an opening 41.

The capacitor 105 is connected to the conductive film 21c serving as a capacitor line. The capacitor 105 includes the film 19b having conductivity formed over the gate insulating film, a dielectric film formed of a nitride insulating film formed over the transistor 102, and a light-transmitting conductive film 29 that serves as a pixel electrode. The dielectric film is formed using an oxygen barrier film. The film 19b having conductivity formed over the gate insulating film has a light-transmitting property. That is, the capacitor 105 has a light-transmitting property.

Thanks to the light-transmitting property of the capacitor 105, the capacitor 105 can be formed large (covers a large area) in the pixel 103. Thus, a semiconductor device having charge capacity increased while improving the aperture ratio, typically, to 50% or more, 55% or more, or 60% or more can be obtained. For example, in a semiconductor device with high resolution such as a liquid crystal display device, the area of a pixel is small and thus the area of a capacitor is also small. For this reason, the charge capacity of the capacitor is small. However, since the capacitor 105 of this embodiment has a light-transmitting property, when it is provided in a pixel, enough charge capacity can be obtained in the pixel and the aperture ratio can be improved. Typically, the capacitor 105 can be favorably used in a high-resolution semiconductor device with a pixel density of 200 ppi or more, 300 ppi or more, or 500 ppi or more.

Further, according to one embodiment of the present invention, the aperture ratio can be improved even in a display device with high resolution, which makes it possible to use light from a light source such as a backlight efficiently, so that power consumption of the display device can be reduced.

Figure 3:
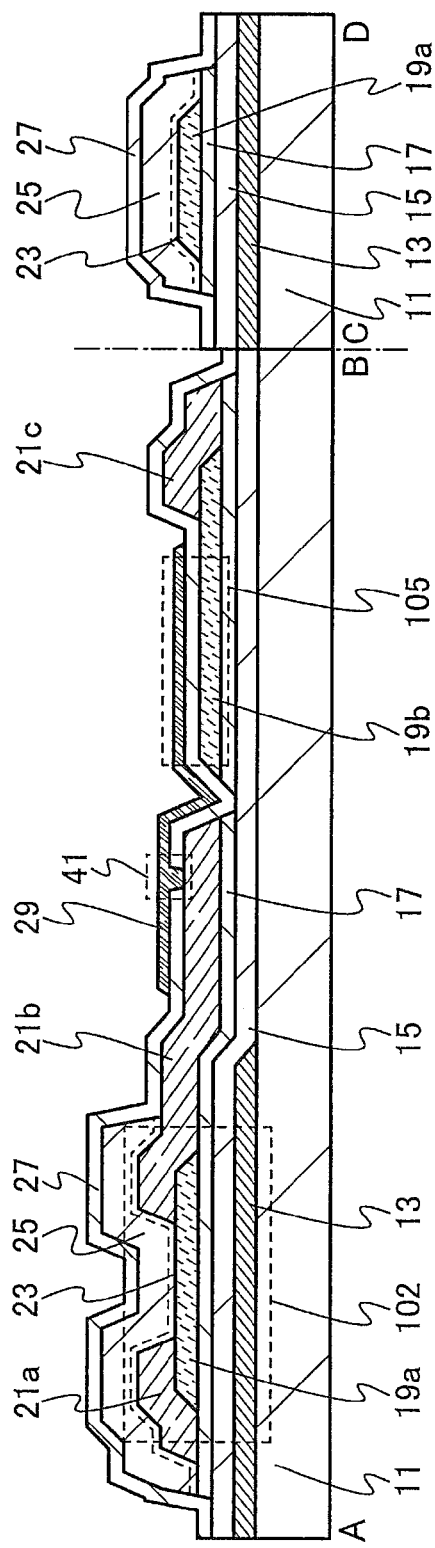
FIG. 3 is a cross-sectional view illustrating one embodiment of a semiconductor device.

Next, FIG. 3 is a cross-sectional view taken along dashed-dotted lines A-B and C-D in FIG. 2. The transistor 102 shown in FIG. 2 is a channel-etched transistor. Note that the transistor 102 in the channel length direction, a connection portion between the transistor 102 and the conductive film 29 serving as a pixel electrode, and the capacitor 105 are illustrated in the cross-sectional view taken along dashed-dotted line A-B, and the transistor 102 in the channel width direction is illustrated in the cross-sectional view taken along dashed-dotted line C-D.

The transistor 102 in FIG. 3 has a single-gate structure and includes the conductive film 13 serving as a gate electrode over the substrate 11. In addition, the transistor 102 includes an oxygen barrier film 15 formed over the substrate 11 and the conductive film 13 serving as a gate electrode, an oxide insulating film 17 formed over the oxygen barrier film 15, the oxide semiconductor film 19a overlapping the conductive film 13 serving as a gate electrode with the oxygen barrier film 15 and the oxide insulating film 17 provided therebetween, and the conductive films 21a and 21b serving as a pair of electrodes which are in contact with the oxide semiconductor film 19a. Moreover, an oxide insulating film 23 is formed over the oxide insulating film 17, the oxide semiconductor film 19a, and the conductive films 21a and 21b serving as a pair of electrodes, and an oxide insulating film 25 is formed over the oxide insulating film 23. An oxygen barrier film 27 is formed over the oxygen barrier film 15, the oxide insulating film 17, the oxide insulating film 23, the oxide insulating film 25, and the conductive films 21a and 21b. In addition, a conductive film 29 connected to one of the conductive films 21a and 21b serving as a pair of electrodes, here the conductive film 21b, is formed over the oxygen barrier film 27. Note that the conductive film 29 serves as a pixel electrode.

The capacitor 105 in FIG. 3 includes a film 19b having conductivity formed over the oxide insulating film 17, the oxygen barrier film 27, and the conductive film 29 serving as a pixel electrode.

Over the transistor 102 in this embodiment, the oxide insulating films 23 and 25, which are subjected to element isolation, are formed. The oxide insulating films 23 and 25 overlap the oxide semiconductor film 19a. Furthermore, the oxygen barrier film 15 is in contact with the oxygen barrier film 27 with the oxide semiconductor film 19a and the oxide insulating films 23 and 25 provided on an inner side of the oxygen barrier films 15 and 27.

As the oxygen barrier films 15 and 27, insulating films each having a low oxygen-transmitting property can be used. Alternatively, an insulating film that hardly permeates oxygen, hydrogen, and water can be used. As the insulating film having a low oxygen-transmitting property and the insulating film that hardly permeates oxygen, hydrogen, and water, nitride insulating films such as a silicon nitride film, a silicon nitride oxide film, an aluminum nitride film, and an aluminum nitride oxide film are given. Alternatively, as the insulating film having a low oxygen-transmitting property and the insulating film that hardly permeates oxygen, hydrogen, and water, oxide insulating films such as an aluminum oxide film, an aluminum oxynitride film, a gallium oxide film, a gallium oxynitride film, an yttrium oxide film, an yttrium oxynitride film, a hafnium oxide film, and a hafnium oxynitride film are given.

The oxide semiconductor film 19a is formed using, typically, an In—Ga oxide film, an In—Zn oxide film, or an In-M-Zn oxide film (M represents Al, Ga, Y, Zr, La, Ce, or Nd).

The oxide insulating film 23 or the oxide insulating film 25 provided over the oxide semiconductor film 19a is an oxide insulating film which contains more oxygen than that in the stoichiometric composition. Part of oxygen is released by heating from the oxide insulating film containing more oxygen than that in the stoichiometric composition. The oxide insulating film containing more oxygen than that in the stoichiometric composition is an oxide insulating film of which the amount of released oxygen atoms is greater than or equal to $1.0 \times 10^{18}$ atoms/cm$^3$, or greater than or equal to $3.0 \times 10^{20}$ atoms/cm$^3$ in TDS analysis in which heat treatment is performed such that a temperature of a film surface is higher than or equal to 100° C. and lower than or equal to 700° C. or higher than or equal to 100° C. and lower than or equal to 500° C.

In the case where the oxide insulating film containing more oxygen than that in the stoichiometric composition is included in the oxide insulating film 23 or the oxide insulating film 25, part of oxygen contained in the oxide insulating film 23 or the oxide insulating film 25 can be moved to the oxide semiconductor film 19a, so that oxygen vacancies contained in the oxide semiconductor film 19a can be reduced.

Furthermore, the oxygen barrier film 15 is in contact with the oxygen barrier film 27 with the oxide semiconductor film 19a and the oxide insulating films 23 and 25 provided on an inner side of the oxygen barrier films 15 and 27.

The threshold voltage of a transistor using an oxide semiconductor film which contains oxygen vacancies easily shifts negatively, and such a transistor tends to be normally-on. This is because electric charges are generated owing to oxygen vacancies in the oxide semiconductor film and the resistance is thus reduced. The transistor having normally-on characteristics causes various problems in that malfunction is likely to be caused when in operation and that power consumption is increased when not in operation, for example. Further, there is a problem in that the amount of change in electrical characteristics, typically in threshold voltage, of the transistor over time or due to a stress test is increased.

However, in the transistor 102 in this embodiment, the oxide insulating film 23 or the oxide insulating film 25 provided over the oxide semiconductor film 19a contains more oxygen than that in the stoichiometric composition. Moreover, the oxide semiconductor film 19a, the oxide insulating film 23, and the oxide insulating film 25 are surrounded by the oxygen barrier film 15 and the oxygen barrier film 27. As a result, oxygen contained in the oxide insulating film 23 or the oxide insulating film 25 is moved to the oxide semiconductor film 19a efficiently, so that oxygen vacancies in the oxide semiconductor film 19a are reduced. Accordingly, a transistor having normally-off characteristics is obtained. Further, the amount of change in electrical characteristics, typically in threshold voltage, of the transistor over time or due to a stress test can be reduced.

In the capacitor 105, the film 19b having conductivity is formed at the same time as the oxide semiconductor film 19a and has increased conductivity by containing impurities. Alternatively, the film 19b having conductivity is formed at the same time as the oxide semiconductor film 19a, and has increased conductivity by containing impurities and containing oxygen vacancies generated by plasma damage or the like.

On an element substrate of the semiconductor device illustrated in this embodiment, one electrode of the capacitor is formed at the same time as the oxide semiconductor film of the transistor. In addition, the conductive film that serves as a pixel electrode is used as the other electrode of the capacitor. Thus, a step of forming another conductive film is not needed to form the capacitor, and the number of steps of manufacturing the semiconductor device can be reduced. Further, since the pair of electrodes has a light-transmitting property, the capacitor has a light-transmitting property. As a result, the area occupied by the capacitor can be increased and the aperture ratio in a pixel can be increased.

Details of the transistor 102 are described below.

There is no particular limitation on a material and the like of the substrate 11 as long as the material has heat resistance high enough to withstand at least heat treatment performed later. For example, a glass substrate, a ceramic substrate, a quartz substrate, or a sapphire substrate may be used as the substrate 11. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used. Still alternatively, any of these substrates provided with a semiconductor element may be used as the substrate 11. In the case where a glass substrate is used as the substrate 11, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

Alternatively, a flexible substrate may be used as the substrate 11, and the transistor 102 may be provided directly on the flexible substrate. Alternatively, a separation layer may be provided between the substrate 11 and the transistor 102. The separation layer can be used when part or the whole of a semiconductor device formed over the separation layer is completed and separated from the substrate 11 and transferred to another substrate. In such a case, the transistor 102 can be transferred to a substrate having low heat resistance or a flexible substrate as well.

The conductive film 13 serving as a gate electrode can be formed using a metal element selected from aluminum, chromium, copper, tantalum, titanium, molybdenum, and tungsten; an alloy containing any of these metal elements as a component; an alloy containing any of these metal elements in combination; or the like. Further, one or more metal elements selected from manganese or zirconium may be used. The conductive film 13 serving as a gate electrode may have a single-layer structure or a stacked structure of two or more layers. For example, a single-layer structure of an aluminum film containing silicon, a two-layer structure in which an aluminum film is stacked over a titanium film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a two-layer structure in which a copper film is stacked over a titanium film, a three-layer structure in which a titanium film, an aluminum film, and a titanium film are stacked in this order, and the like can be given. Alternatively, an alloy film or a nitride film which contains aluminum and one or more elements selected from titanium, tantalum, tungsten, molybdenum, chromium, neodymium, and scandium may be used.

The conductive film 13 serving as a gate electrode can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

As the oxygen barrier film 15, an insulating film having a low oxygen-transmitting property can be used. Alternatively, an insulating film that hardly permeates oxygen, hydrogen, and water can be used. As the insulating film having a low oxygen-transmitting property and the insulating film that hardly permeates oxygen, hydrogen, and water, nitride insulating films such as a silicon nitride film, a silicon nitride oxide film, an aluminum nitride film, and an aluminum nitride oxide film are given. Alternatively, as the insulating film having a low oxygen-transmitting property and the insulating film that hardly permeates oxygen, hydrogen, and water, oxide insulating films such as an aluminum oxide film, an aluminum oxynitride film, a gallium oxide film, a gallium oxynitride film, an yttrium oxide film, an yttrium oxynitride film, a hafnium oxide film, and a hafnium oxynitride film are given.

The thickness of the oxygen barrier film 15 is preferably greater than or equal to 5 nm and less than or equal to 100 nm, or greater than or equal to 20 nm and less than or equal to 80 nm.

The oxide insulating film 17 can be formed to have a single-layer structure or a stacked-layer structure using, for example, any of silicon oxide, silicon oxynitride, silicon nitride oxide, silicon nitride, aluminum oxide, hafnium oxide, gallium oxide, and Ga—Zn-based metal oxide.

The oxide insulating film 17 may also be formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide, so that gate leakage current of the transistor can be reduced.

The thickness of the oxide insulating film 17 is greater than or equal to 5 nm and less than or equal to 400 nm, greater than or equal to 10 nm and less than or equal to 300 nm, or greater than or equal to 50 nm and less than or equal to 250 nm.

The oxide semiconductor film 19a is typically formed using In—Ga oxide, In—Zn oxide, or an In-M-Zn oxide (M represents Al, Ga, Y, Zr, La, Ce, or Nd).

Note that in the case where the oxide semiconductor film 19a is an In-M-Zn oxide film, the proportions of In and M when summation of In and M is assumed to be 100 atomic % are as follows: the atomic percentage of In is greater than or equal to 25 atomic % and the atomic percentage of M is less than 75 atomic %; or the atomic percentage of In is greater than or equal to 34 atomic % and the atomic percentage of M is less than 66 atomic %.

The energy gap of the oxide semiconductor film 19a is 2 eV or more, 2.5 eV or more, or 3 eV or more. With the use of an oxide semiconductor having such a wide energy gap, the off-state current of the transistor 102 can be reduced.

The thickness of the oxide semiconductor film 19a is greater than or equal to 3 nm and less than or equal to 200 nm, greater than or equal to 3 nm and less than or equal to 100 nm, or greater than or equal to 3 nm and less than or equal to 50 nm.

In the case where the oxide semiconductor film 19a is an In-M-Zn oxide film (M represents Al, Ga, Y, Zr, La, Ce, or Nd), it is preferable that the atomic ratio of metal elements of a sputtering target used for forming the In-M-Zn oxide film satisfy In≥M and Zn≥M. As the atomic ratio of metal elements of such a sputtering target, In:M:Zn=1:1:1, In:M:Zn=1:1:1.2, and In:M:Zn=3:1:2 are preferable. Note that the proportion of each metal element in the atomic ratio of the oxide semiconductor film 19a to be formed varies within a range of ±40% of that in the above atomic ratio of the sputtering target as an error.

An oxide semiconductor film with low carrier density is used as the oxide semiconductor film 19a. For example, an oxide semiconductor film whose carrier density is $1\times10^{17}/cm^3$ or lower, $1\times10^{15}/cm^3$ or lower, $1\times10^{13}/cm^3$ or lower, or $1\times10^{11}/cm^3$ or lower is used as the oxide semiconductor film 19a.

Note that, without limitation to that described above, a material with an appropriate composition may be used depending on required semiconductor characteristics and electrical characteristics (e.g., field-effect mobility and threshold voltage) of a transistor. Further, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor film 19a be set to be appropriate.

Note that it is preferable to use, as the oxide semiconductor film 19a, an oxide semiconductor film in which the impurity concentration is low and density of defect states is low, in which case the transistor can have more excellent electrical characteristics. Here, the state in which impurity concentration is low and density of defect states is low (the amount of oxygen vacancies is small) is referred to as "highly purified intrinsic" or "highly purified substantially intrinsic". A highly purified intrinsic or highly purified substantially intrinsic oxide semiconductor has few carrier generation sources, and thus has a low carrier density in some cases. Thus, a transistor including the oxide semiconductor film in which a channel region is formed rarely has a negative threshold voltage (is rarely normally-on). A highly purified intrinsic or highly purified substantially intrinsic oxide semiconductor film has a low density of defect states and accordingly has few carrier traps in some cases. Further, the highly purified intrinsic or highly purified substantially intrinsic oxide semiconductor film has an extremely low off-state current; even when an element has a channel width of $1 \times 10^6$ µm and a channel length (L) of 10 µM, the off-state current can be less than or equal to the measurement limit of a semiconductor parameter analyzer, i.e., less than or equal to $1 \times 10^{-13}$ A, at a voltage (drain voltage) between a source electrode and a drain electrode of from 1 V to 10 V. Thus, the transistor whose channel region is formed in the oxide semiconductor film has a small variation in electrical characteristics and high reliability in some cases. Charges trapped by the trap states in the oxide semiconductor film take a long time to be released and may behave like fixed charges. Thus, the transistor whose channel region is formed in the oxide semiconductor film having a high density of trap states has unstable electrical characteristics in some cases. Examples of the impurities include hydrogen, nitrogen, alkali metal, and alkaline earth metal.

Hydrogen contained in the oxide semiconductor film reacts with oxygen bonded to a metal atom to be water, and in addition, an oxygen vacancy is formed in a lattice from which oxygen is released (or a portion from which oxygen is released). Due to entry of hydrogen into the oxygen vacancy, an electron serving as a carrier is generated in some cases. Further, in some cases, bonding of part of hydrogen to oxygen bonded to a metal element causes generation of an electron serving as a carrier. Thus, a transistor including an oxide semiconductor which contains hydrogen is likely to be normally on.

Accordingly, it is preferable that hydrogen be reduced as much as possible as well as the oxygen vacancies in the oxide semiconductor film 19a. Specifically, the hydrogen concentration of the oxide semiconductor film 19a, which is measured by secondary ion mass spectrometry (SIMS), is lower than or equal to $5 \times 10^{19}$ atoms/cm$^3$, lower than or equal to $1 \times 10^{19}$ atoms/cm$^3$, lower than or equal to $5 \times 10^{18}$ atoms/cm$^3$, lower than or equal to $1 \times 10^{18}$ atoms/cm$^3$, lower than or equal to $5 \times 10^{17}$ atoms/cm$^3$, or lower than or equal to $1 \times 10^{16}$ atoms/cm$^3$.

When silicon or carbon which is one of elements belonging to Group 14 is contained in the oxide semiconductor film 19a, oxygen vacancies are increased, and the oxide semiconductor film 19a becomes an n-type film. Thus, the concentration of silicon or carbon (the concentration is measured by SIMS) of the oxide semiconductor film 19a is lower than or equal to $2 \times 10^{18}$ atoms/cm$^3$, or lower than or equal to $2 \times 10^{17}$ atoms/cm$^3$.

Further, the concentration of alkali metal or alkaline earth metal of the oxide semiconductor film 19a, which is measured by SIMS, is lower than or equal to $1 \times 10^{18}$ atoms/cm$^3$, or lower than or equal to $2 \times 10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of the oxide semiconductor film 19a.

Further, when containing nitrogen, the oxide semiconductor film 19a easily has n-type conductivity by generation of electrons serving as carriers and an increase of carrier density. Thus, a transistor including an oxide semiconductor which contains nitrogen is likely to be normally on. For this reason, nitrogen in the oxide semiconductor film is preferably reduced as much as possible; the concentration of nitrogen which is measured by SIMS is preferably set to, for example, lower than or equal to $5 \times 10^{18}$ atoms/cm$^3$.

The oxide semiconductor film 19a may have a non-single-crystal structure, for example. The non-single crystal structure includes a c-axis aligned crystalline oxide semiconductor (CAAC-OS) which is described later, a polycrystalline structure, a microcrystalline structure described later, or an amorphous structure, for example. Among the non-single crystal structure, the amorphous structure has the highest density of defect levels, whereas CAAC-OS has the lowest density of defect levels.

The oxide semiconductor film 19a may have an amorphous structure, for example. An oxide semiconductor film having an amorphous structure has, for example, disordered atomic arrangement and no crystalline component. Alternatively, an oxide film having an amorphous structure has, for example, an absolutely amorphous structure and has no crystal part.

Note that the oxide semiconductor film 19a may be a mixed film including two or more of the following: a region having an amorphous structure, a region having a microcrystalline structure, a region having a polycrystalline structure, a CAAC-OS region, and a region having a single-crystal structure. The mixed film includes, for example, two or more of a region having an amorphous structure, a region having a microcrystalline structure, a region having a polycrystalline structure, a CAAC-OS region, and a region having a single-crystal structure in some cases. Further, the mixed film has a stacked-layer structure of two or more of a region having an amorphous structure, a region having a microcrystalline structure, a region having a polycrystalline structure, a CAAC-OS region, and a region having a single-crystal structure in some cases.

The film 19b having conductivity is formed by processing an oxide semiconductor film formed at the same time as the oxide semiconductor film 19a. Thus, the film 19b having conductivity contains a metal element similar to that in the oxide semiconductor film 19a. Further, the film 19b having conductivity has a crystal structure similar to or different from that of the oxide semiconductor film 19a. By adding impurities or oxygen vacancies to the oxide semiconductor film formed at the same time as the oxide semiconductor film 19a, the film 19b having conductivity is formed. An example of the impurities contained in the oxide semiconductor film is hydrogen. Instead of hydrogen, as the impurity, boron, phosphorus, tin, antimony, a rare gas element, an alkali metal, an alkaline earth metal, or the like may be included.

The oxide semiconductor film 19a and the film 19b having conductivity are both formed over the oxide insulating film 17, but differ in impurity concentration. Specifically, the film 19b having conductivity has a higher impurity concentration than the oxide semiconductor film 19a. For example, the concentration of hydrogen contained in the oxide semiconductor film 19a is lower than or equal to $5 \times 10^{19}$ atoms/cm$^3$, lower than or equal to $5 \times 10^{18}$ atoms/cm$^3$, lower than or equal to $1 \times 10^{18}$ atoms/cm$^3$, lower than or equal to $5 \times 10^{17}$ atoms/cm$^3$, or lower than or equal to $1 \times 10^{16}$ atoms/cm$^3$. The concentration of hydrogen contained in the film 19b having conductivity is higher than or equal to $8 \times 10^{19}$ atoms/cm$^3$, higher than or equal to $1 \times 10^{20}$ atoms/cm$^3$, or higher than or equal to $5 \times 10^{20}$ atoms/cm$^3$. The concentration of hydrogen contained in the film 19b having conductivity is greater than or equal to 2 times or greater than or equal to 10 times that in the oxide semiconductor film 19a.

On the other hand, when the oxide semiconductor film formed at the same time as the oxide semiconductor film 19a is exposed to plasma, the oxide semiconductor film is damaged, and oxygen vacancies can be generated. For example, when a film is formed over the oxide semiconductor film by a plasma CVD method or a sputtering method, the oxide semiconductor film is exposed to plasma and oxygen vacancies are generated. Alternatively, when the oxide semiconductor film is exposed to plasma in etching treatment for formation of the oxide insulating film 23 and the oxide insulating film 25, oxygen vacancies are generated. Alternatively, when the oxide semiconductor film is exposed to plasma such as a mixed gas of oxygen and hydrogen, hydrogen, a rare gas, and ammonia, oxygen vacancies are generated. As a result, the conductivity of the oxide semiconductor film is increased, so that the film 19b having conductivity is formed.

That is, the film 19b having conductivity can be called an oxide semiconductor film having high conductivity. Alternatively, the film 19b having conductivity can be called a metal oxide film having high conductivity.

In the case where a silicon nitride film is used as the oxygen barrier film 27, the silicon nitride film contains hydrogen. Thus, when hydrogen in the oxygen barrier film 27 is diffused into the oxide semiconductor film formed at the same time as the oxide semiconductor film 19a, hydrogen is bonded to oxygen and electrons serving as carriers are generated in the oxide semiconductor film. Further, when the silicon nitride film is formed as the oxygen barrier film 27 by a plasma CVD method or a sputtering method, the oxide semiconductor film is exposed to plasma, so that oxygen vacancies are generated. When hydrogen contained in the silicon nitride film enters the oxygen vacancies, electrons serving as carriers are generated. As a result, the conductivity of the oxide semiconductor film is increased, so that the film 19b having conductivity is formed.

The film 19b having conductivity has lower resistivity than the oxide semiconductor film 19a. The resistivity of the film 19b having conductivity is preferably greater than or equal to $1 \times 10^{-8}$ times and less than $1 \times 10^{-1}$ times the resistivity of the oxide semiconductor film 19a. The resistivity of the film 19b having conductivity is typically greater than or equal to $1 \times 10^{-3}$ $\Omega$cm and less than $1 \times 10^{4}$ $\Omega$cm, or greater than or equal to $1 \times 10^{-3}$ $\Omega$cm and less than $1 \times 10^{-1}$ $\Omega$cm.

The conductive films 21a and 21b serving as a pair of electrodes are each formed to have a single-layer structure or a stacked-layer structure including any of metals such as aluminum, titanium, chromium, nickel, copper, yttrium, zirconium, molybdenum, silver, tantalum, and tungsten or an alloy containing any of these metals as its main component. For example, a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and the like can be given. Note that a transparent conductive material containing indium oxide, tin oxide, or zinc oxide may be used.

As the oxide insulating film 23 or the oxide insulating film 25, an oxide insulating film which contains more oxygen than that in the stoichiometric composition is preferably used. Here, as the oxide insulating film 23, an oxide insulating film which permeates oxygen is formed, and as the oxide insulating film 25, an oxide insulating film which contains more oxygen than that in the stoichiometric composition is formed.

The oxide insulating film 23 is an oxide insulating film which permeates oxygen. Thus, oxygen released from the oxide insulating film 25 provided over the oxide insulating film 23 can be moved to the oxide semiconductor film 19a through the oxide insulating film 23. Moreover, the oxide insulating film 23 also serves as a film which relieves damage to the oxide semiconductor film 19a at the time of forming the oxide insulating film 25 later.

A silicon oxide film, a silicon oxynitride film, or the like with a thickness greater than or equal to 5 nm and less than or equal to 150 nm, or greater than or equal to 5 nm and less than or equal to 50 nm can be used as the oxide insulating film 23. Note that in this specification, a "silicon oxynitride film" refers to a film that contains oxygen at a higher proportion than nitrogen, and a "silicon nitride oxide film" refers to a film that contains nitrogen at a higher proportion than oxygen.

Further, it is preferable that the amount of defects in the oxide insulating film 23 be small, typically the spin density of a signal which appears at g=2.001 due to a dangling bond of silicon, be lower than or equal to $3 \times 10^{17}$ spins/cm$^3$ by ESR measurement. This is because if the density of defects in the oxide insulating film 23 is high, oxygen is bonded to the defects and the amount of oxygen that passes through the oxide insulating film 23 is decreased.

Further, it is preferable that the amount of defects at the interface between the oxide insulating film 23 and the oxide semiconductor film 19a be small, typically the spin density of a signal which appears at g=1.93 due to an oxygen vacancy in the oxide semiconductor film 19a be lower than or equal to $1 \times 10^{17}$ spins/cm$^3$, more preferably lower than or equal to the lower limit of detection by ESR measurement.

Note that in the oxide insulating film 23, all oxygen having entered the oxide insulating film 23 from the outside moves to the outside in some cases. Alternatively, some oxygen having entered the oxide insulating film 23 from the outside remains in the oxide insulating film 23 in some cases. Further, movement of oxygen occurs in the oxide insulating film 23 in some cases in such a manner that oxygen enters the oxide insulating film 23 from the outside and oxygen contained in the oxide insulating film 23 is moved to the outside of the oxide insulating film 23.

The oxide insulating film 25 is formed in contact with the oxide insulating film 23. The oxide insulating film 25 is formed using an oxide insulating film which contains oxygen at a higher proportion than the stoichiometric composition. Part of oxygen is released by heating from the oxide insulating film which contains oxygen at a higher proportion than the stoichiometric composition. The oxide insulating film containing oxygen at a higher proportion than the stoichiometric composition is an oxide insulating film of which the amount of released oxygen atoms is greater than or equal to $1.0 \times 10^{18}$ atoms/cm$^3$, or greater than or equal to $3.0 \times 10^{20}$ atoms/cm$^3$ in TDS analysis in which heat treatment is performed such that a temperature of a film surface is higher than or equal to 100° C. and lower than or equal to 700° C. or higher than or equal to 100° C. and lower than or equal to 500° C.

A silicon oxide film, a silicon oxynitride film, or the like with a thickness greater than or equal to 30 nm and less than or equal to 500 nm, or greater than or equal to 50 nm and less than or equal to 400 nm can be used as the oxide insulating film 25.

Further, it is preferable that the amount of defects in the oxide insulating film 25 be small, typically the spin density of a signal which appears at g=2.001 originating from a dangling bond of silicon, be lower than $1.5 \times 10^{18}$ spins/cm$^3$, more preferably lower than or equal to $1 \times 10^{18}$ spins/cm$^3$ by ESR measurement. Note that the oxide insulating film 25 is provided more apart from the oxide semiconductor film 19a than the oxide insulating film 23 is; thus, the oxide insulating film 25 may have higher defect density than the oxide insulating film 23.

As the oxygen barrier film 27, an insulating film having a low oxygen-transmitting property can be used. Alternatively, an insulating film that hardly permeates oxygen, hydrogen, and water can be used. As the insulating film having a low oxygen-transmitting property and the insulating film that hardly permeates oxygen, hydrogen, and water, nitride insulating films such as a silicon nitride film, a silicon nitride oxide film, an aluminum nitride film, and an aluminum nitride oxide film are given. Alternatively, as the insulating film having a low oxygen-transmitting property and the insulating film that hardly permeates oxygen, hydrogen, and water, oxide insulating films such as an aluminum oxide film, an aluminum oxynitride film, a gallium oxide film, a gallium oxynitride film, an yttrium oxide film, an yttrium oxynitride film, a hafnium oxide film, and a hafnium oxynitride film are given.

The oxygen barrier film 15 and the oxygen barrier film 27 are provided to be in contact with each other with the oxide semiconductor film 19a and the oxide insulating films 23 and 25 provided on an inner side of the oxygen barrier films 15 and 27. Therefore, the movement of oxygen contained in the oxide insulating film 23 or the oxide insulating film 25 to the outside of the oxygen barrier film 15 and the oxygen barrier film 27 can be suppressed. As a result, oxygen contained in the oxide insulating film 23 or the oxide insulating film 25 can be moved to the oxide semiconductor film 19a efficiently, and the amount of oxygen vacancies in the oxide semiconductor film can be reduced.

The thickness of the oxygen barrier film 27 can be greater than or equal to 50 nm and less than or equal to 300 nm, or greater than or equal to 100 nm and less than or equal to 200 nm.

The conductive film 29 is formed using a light-transmitting conductive film. As the light-transmitting conductive film, an indium oxide film containing tungsten oxide, an indium zinc oxide film containing tungsten oxide, an indium oxide film containing titanium oxide, an indium tin oxide film containing titanium oxide, an indium tin oxide (hereinafter, referred to as ITO) film, an indium zinc oxide film, an indium tin oxide film to which silicon oxide is added, and the like are given.

Next, a method for manufacturing the transistor 102 and the capacitor 105 in FIG. 3 is described with reference to FIGS. 4A to 4D, FIGS. 5A to 5D, FIGS. 6A and 6B, and FIGS. 7A and 7B.

Figure 4A:
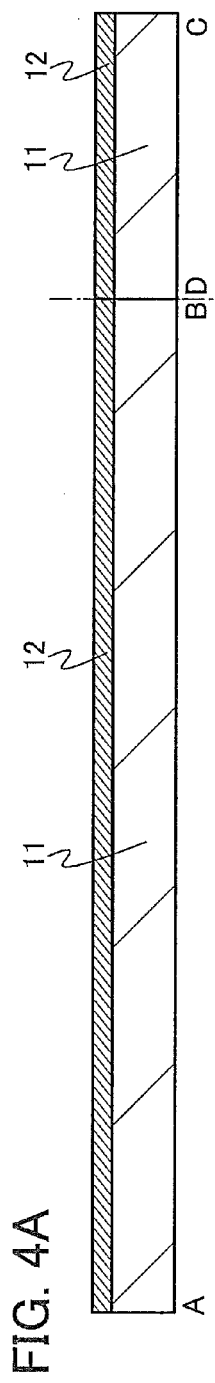
FIGS. 4A to 4D are cross-sectional views illustrating one embodiment of a method for manufacturing a semiconductor device.

As illustrated in FIG. 4A, a conductive film 12 to be the conductive film 13 is formed over the substrate 11. The conductive film 12 is formed by a sputtering method, a CVD method, an evaporation method, or the like.

Here, a glass substrate is used as the substrate 11. Further, as the conductive film 12, a 100 nm-thick tungsten film is formed by a sputtering method.

Figure 4B:
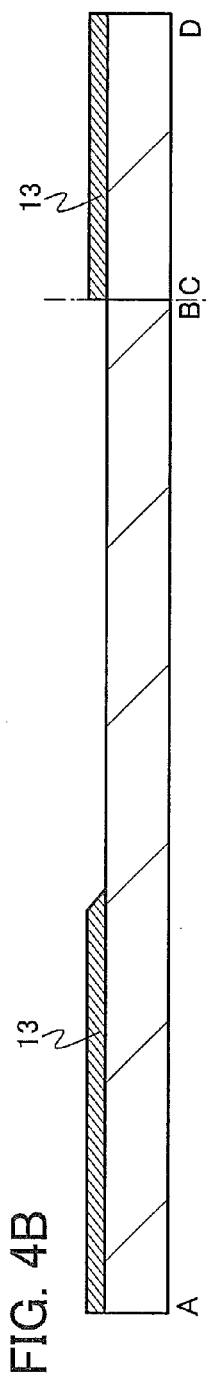

Then, a mask is formed over the conductive film 12 by a photolithography process using a first photomask. Next, as illustrated in FIG. 4B, part of the conductive film 12 is etched with the use of the mask to form the conductive film 13 serving as a gate electrode. After that, the mask is removed.

Note that the conductive film 13 serving as a gate electrode may be formed by an electrolytic plating method, a printing method, an ink jet method, or the like instead of the above formation method.

Here, a tungsten film is etched by dry etching to form the conductive film 13 serving as a gate electrode.

Figure 4C:
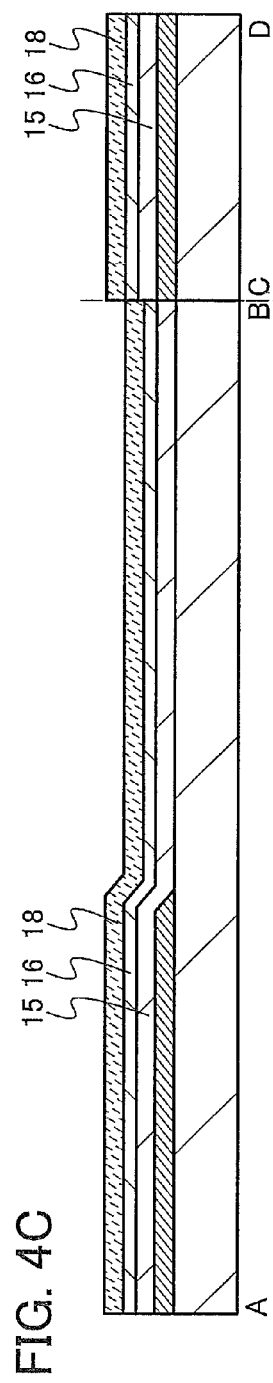

Next, as illustrated in FIG. 4C, over the conductive film 13 serving as a gate electrode, the oxygen barrier film 15 and an oxide insulating film 16 to be the oxide insulating film 17 later are formed. Then, over the oxide insulating film 16, an oxide semiconductor film 18 to be the oxide semiconductor film 19a and the film 19b having conductivity is formed.

The oxygen barrier film 15 and the oxide insulating film 16 are formed by a sputtering method, a CVD method, an evaporation method, or the like.

Here, as the oxygen barrier film 15, a 300-nm-thick silicon nitride film is formed by a plasma CVD method in which silane, nitrogen, and ammonia are used as a source gas.

In the case where a silicon oxide film, a silicon oxynitride film, or a silicon nitride oxide film is formed as the oxide insulating film 16, a deposition gas containing silicon and an oxidizing gas are preferred to be used as a source gas. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

Moreover, in the case of forming a gallium oxide film as the oxide insulating film 16, a metal organic chemical vapor deposition (MOCVD) method can be employed.

Here, as the oxide insulating film 16, a 50-nm-thick silicon oxynitride film is formed by a plasma CVD method in which silane and dinitrogen monoxide are used as a source gas.

The oxide semiconductor film 18 can be formed by a sputtering method, a coating method, a pulsed laser deposition method, a laser ablation method, or the like.

In the case where the oxide semiconductor film is formed by a sputtering method, a power supply device for generating plasma can be an RF power supply device, an AC power supply device, a DC power supply device, or the like as appropriate.

As a sputtering gas, a rare gas (typically argon), an oxygen gas, or a mixed gas of a rare gas and oxygen is used as appropriate. In the case of using the mixed gas of a rare gas and oxygen, the proportion of oxygen to a rare gas is preferably increased.

Further, a target may be appropriately selected in accordance with the composition of the oxide semiconductor film to be formed.

In order to obtain an intrinsic or substantially intrinsic oxide semiconductor film, besides the high vacuum evacuation of the chamber, a highly purification of a sputtering gas is also needed. As an oxygen gas or an argon gas used for a sputtering gas, a gas which is highly purified to have a dew point of −40° C. or lower, −80° C. or lower, −100° C. or lower, or −120° C. or lower is used, whereby entry of moisture or the like into the oxide semiconductor film can be prevented as much as possible.

Here, a 35-nm-thick In—Ga—Zn oxide film is formed as the oxide semiconductor film by a sputtering method using an In—Ga—Zn oxide target (In:Ga:Zn=3:1:2).

Figure 4D:
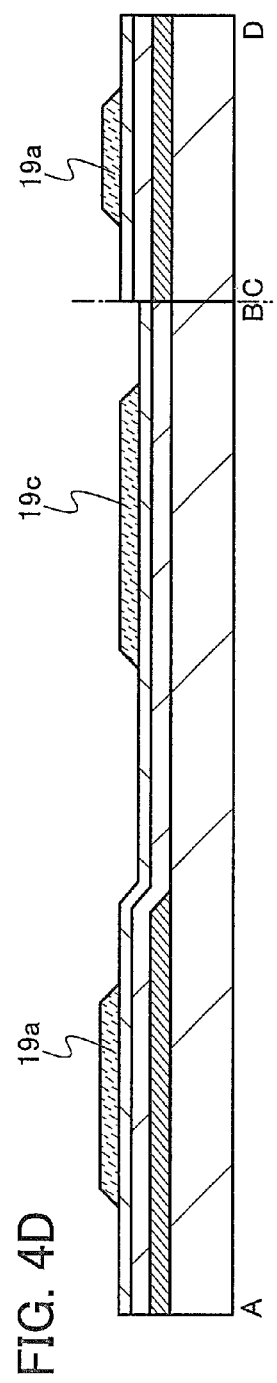

Then, after a mask is formed over the oxide semiconductor film 18 by a photolithography process using a second photomask, the oxide semiconductor film is partly etched using the mask. Thus, the oxide semiconductor films 19a and 19c subjected to element isolation as illustrated in FIG. 4D are formed. After that, the mask is removed.

Next, as illustrated in FIG. 5A, a conductive film 20 to be the conductive films 21a, 21b, and 21c later is formed.

The conductive film 20 is formed by a sputtering method, a CVD method, an evaporation method, or the like.

Here, a 50-nm-thick tungsten film and a 300-nm-thick copper film are sequentially stacked by a sputtering method.

Next, a mask is formed over the conductive film 20 by a photolithography process using a third photomask. Then, the conductive film 20 is etched with the use of the mask, and as illustrated in FIG. 5B, the conductive films 21a and 21b serving as a pair of electrodes and the conductive film 21c serving as a capacitor line are formed. After that, the mask is removed.

Here, a mask is formed over the copper film by a photolithography process. Then, the tungsten film and the copper film are etched with the use of the mask, so that the conductive films 21a, 21b, and 21c are formed. Note that the copper film is etched by a wet etching method. Next, the tungsten film is etched by a dry etching method using $SF_6$, whereby fluoride is formed on the surface of the copper film. By the fluoride, diffusion of copper elements from the copper film is reduced and thus the copper concentration in the oxide semiconductor film 19a can be reduced.

Next, as illustrated in FIG. 5C, an oxide insulating film 22 to be the oxide insulating film 23 later and an oxide insulating film 24 to be the oxide insulating film 25 later are formed over the oxide semiconductor films 19a and 19c and the conductive films 21a, 21b, and 21c.

Note that after the oxide insulating film 22 is formed, the oxide insulating film 24 is preferably formed in succession without exposure to the air. After the oxide insulating film 22 is formed, the oxide insulating film 24 is formed in succession by adjusting at least one of the flow rate of a source gas, pressure, a high-frequency power, and a substrate temperature without exposure to the air, whereby the concentration of impurities attributed to the atmospheric component at the interface between the oxide insulating film 22 and the oxide insulating film 24 can be reduced and oxygen in the oxide insulating film 24 can be moved to the oxide semiconductor film 19a; accordingly, the amount of oxygen vacancies in the oxide semiconductor film 19a can be reduced.

As the oxide insulating film 22, a silicon oxide film or a silicon oxynitride film can be formed under the following conditions: the substrate placed in a treatment chamber of a plasma CVD apparatus that is vacuum-evacuated is held at a temperature higher than or equal to 280° C. and lower than or equal to 400° C., the pressure is greater than or equal to 20 Pa and less than or equal to 250 Pa, or greater than or equal to 100 Pa and less than or equal to 250 Pa with introduction of a source gas into the treatment chamber, and a high-frequency power is supplied to an electrode provided in the treatment chamber.

A deposition gas containing silicon and an oxidizing gas are preferably used as the source gas of the oxide insulating film 22. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

With the use of the above conditions, an oxide insulating film which permeates oxygen can be formed as the oxide insulating film 22. Further, by providing the oxide insulating film 22, damage to the oxide semiconductor film 19a can be reduced in a step of forming the oxide insulating film 25 which is formed later.

A silicon oxide film or a silicon oxynitride film can be formed as the oxide insulating film 22 under the following conditions: the substrate placed in a treatment chamber of a plasma CVD apparatus that is vacuum-evacuated is held at a temperature higher than or equal to 280° C. and lower than or equal to 400° C., the pressure is greater than or equal to 100 Pa and less than or equal to 250 Pa with introduction of a source gas into the treatment chamber, and a high-frequency power is supplied to an electrode provided in the treatment chamber.

Under the above film formation conditions, the bonding strength of silicon and oxygen becomes strong in the above substrate temperature range. Thus, as the oxide insulating film 22, a dense and hard oxide insulating film which permeates oxygen, typically, a silicon oxide film or a silicon oxynitride film of which etching using hydrofluoric acid of 0.5 wt % at 25° C. is performed at a rate lower than or equal to 10 nm/min, or lower than or equal to 8 nm/min can be formed.

The oxide insulating film 22 is formed while heating is performed; thus, hydrogen, water, or the like contained in the oxide semiconductor film 19a can be released in the step. Hydrogen contained in the oxide semiconductor film 19a is bonded to an oxygen radical formed in plasma to form water. Since the substrate is heated in the step of forming the oxide insulating film 22, water formed by bonding of oxygen and hydrogen is released from the oxide semiconductor film. That is, when the oxide insulating film 22 is formed by a plasma CVD method, the amount of water and hydrogen contained in the oxide semiconductor film 19a can be reduced.

Further, time for heating in a state where the oxide semiconductor film 19a is exposed can be shortened because heating is performed in a step of forming the oxide insulating film 22. Thus, the amount of oxygen released from the oxide semiconductor film by heat treatment can be reduced.

That is, the amount of oxygen vacancies in the oxide semiconductor film can be reduced.

Note that by setting the pressure in the treatment chamber to be greater than or equal to 100 Pa and less than or equal to 250 Pa, the amount of water contained in the oxide insulating film 22 is reduced; thus, variation in electrical characteristics of the transistor 102 can be reduced and change in threshold voltage can be inhibited.

Further, by setting the pressure in the treatment chamber to be greater than or equal to 100 Pa and less than or equal to 250 Pa, damage to the oxide semiconductor film 19a can be reduced when the oxide insulating film 22 is formed, so that the amount of oxygen vacancies contained in the oxide semiconductor film 19a can be reduced. In particular, when the film formation temperature of the oxide insulating film 22 or the oxide insulating film 24 which is formed later is set to be high, typically higher than 220° C., part of oxygen contained in the oxide semiconductor film 19a is released and oxygen vacancies are easily formed. Further, when the film formation conditions for reducing the amount of defects in the oxide insulating film 24 which is formed later are used to increase reliability of the transistor, the amount of released oxygen is easily reduced. Thus, it is difficult to reduce oxygen vacancies in the oxide semiconductor film 19a in some cases. However, by setting the pressure in the treatment chamber to be greater than or equal to 100 Pa and less than or equal to 250 Pa to reduce damage to the oxide semiconductor film 19a at the time of forming the oxide insulating film 22, oxygen vacancies in the oxide semiconductor film 19a can be reduced even when the amount of oxygen released from the oxide insulating film 24 is small.

Note that when the ratio of the amount of the oxidizing gas to the amount of the deposition gas containing silicon is 100 or higher, the hydrogen content in the oxide insulating film 22 can be reduced. Consequently, the amount of hydrogen entering the oxide semiconductor film 19a can be reduced; thus, the negative shift in the threshold voltage of the transistor can be inhibited.

Here, as the oxide insulating film 22, a 50-nm-thick silicon oxynitride film is formed by a plasma CVD method in which silane with a flow rate of 30 sccm and dinitrogen monoxide with a flow rate of 4000 sccm are used as a source gas, the pressure in the treatment chamber is 200 Pa, the substrate temperature is 220° C., and a high-frequency power of 150 W is supplied to parallel-plate electrodes with the use of a 27.12 MHz high-frequency power source. Under the above conditions, a silicon oxynitride film which permeates oxygen can be formed.

As the oxide insulating film 24, a silicon oxide film or a silicon oxynitride film is formed under the following conditions: the substrate placed in a treatment chamber of the plasma CVD apparatus that is vacuum-evacuated is held at a temperature higher than or equal to 180° C. and lower than or equal to 280° C., or higher than or equal to 200° C. and lower than or equal to 240° C., the pressure is greater than or equal to 100 Pa and less than or equal to 250 Pa, or greater than or equal to 100 Pa and less than or equal to 200 Pa with introduction of a source gas into the treatment chamber, and a high-frequency power of greater than or equal to 0.17 W/cm$^2$ and less than or equal to 0.5 W/cm$^2$, or greater than or equal to 0.25 W/cm$^2$ and less than or equal to 0.35 W/cm$^2$ is supplied to an electrode provided in the treatment chamber.

A deposition gas containing silicon and an oxidizing gas are preferably used as the source gas of the oxide insulating film 24. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

As the film formation conditions of the oxide insulating film 24, the high-frequency power having the above power density is supplied to the treatment chamber having the above pressure, whereby the degradation efficiency of the source gas in plasma is increased, oxygen radicals are increased, and oxidation of the source gas is promoted; therefore, the oxygen content in the oxide insulating film 24 becomes higher than that in the stoichiometric composition. On the other hand, in the film formed at a substrate temperature within the above temperature range, the bond between silicon and oxygen is weak, and accordingly, part of oxygen in the film is released by heat treatment in the later step. Thus, it is possible to form an oxide insulating film which contains oxygen at a higher proportion than the stoichiometric composition and from which part of oxygen is released by heating. Further, the oxide insulating film 22 is provided over the oxide semiconductor film 19a. Accordingly, in the step of forming the oxide insulating film 24, the oxide insulating film 22 serves as a protective film of the oxide semiconductor film 19a. Consequently, the oxide insulating film 24 can be formed using the high-frequency power having a high power density while damage to the oxide semiconductor film 19a is reduced.

Here, as the oxide insulating film 24, a 400-nm-thick silicon oxynitride film is formed by a plasma CVD method in which silane with a flow rate of 200 sccm and dinitrogen monoxide with a flow rate of 4000 sccm are used as the source gas, the pressure in the treatment chamber is 200 Pa, the substrate temperature is 220° C., and the high-frequency power of 1500 W is supplied to the parallel-plate electrodes with the use of a 27.12 MHz high-frequency power source. Note that a plasma CVD apparatus used here is a parallel-plate plasma CVD apparatus in which the electrode area is 6000 cm$^2$, and the power per unit area (power density) into which the supplied power is converted is 0.25 W/cm$^2$.

Further, when the conductive films 21a and 21b serving as a pair of electrodes is formed, the oxide semiconductor film 19a is damaged by the etching of the conductive film, so that oxygen vacancies are generated on the back channel side (the side of the oxide semiconductor film 19a which is opposite to the side facing to the conductive film 13 serving as a gate electrode) of the oxide semiconductor film 19a. However, with the use of the oxide insulating film containing oxygen at a higher proportion than the stoichiometric composition as the oxide insulating film 24, the oxygen vacancies generated on the back channel side can be repaired by heat treatment. By this, defects contained in the oxide semiconductor film 19a can be reduced, and thus, the reliability of the transistor 102 can be improved.

Then, a mask is formed over the oxide insulating film 24 by a photolithography process using a fourth photomask. Next, as illustrated in FIG. 5D, part of the oxide insulating film 22 and part of the oxide insulating film 24 are etched with the use of the mask to form the oxide insulating film 23 and the oxide insulating film 25. After that, the mask is removed.

In the process, the oxide insulating films 22 and 24 are preferably etched by a dry etching method. As a result, the oxide semiconductor film 19c is exposed to plasma in the etching treatment; thus, oxygen vacancies in the oxide semiconductor film 19c can be increased.

The oxide insulating films 22 and 24 are etched so that end portions of the oxide insulating films 23 and 25 are positioned on an outer side of the oxide semiconductor film 19a in the channel length direction as illustrated in the cross-sectional view taken along the dashed-dotted line A-B, and end portions of the oxide insulating films 23 and 25 are positioned on an outer side of the oxide semiconductor film 19a in the channel width direction as illustrated in the cross-sectional view taken along the dashed-dotted line C-D. As a result, the oxide insulating films 23 and 25, which are subjected to element isolation, can be formed. Part of the oxide insulating film 16 is etched at the same time as the etching of the oxide insulating film 23, so that the oxide insulating film 17 can be formed. As a result, the oxygen barrier film 15 is exposed.

Next, heat treatment is performed. The heat treatment is performed typically at a temperature of higher than or equal to 150° C. and lower than or equal to 400° C., higher than or equal to 300° C. and lower than or equal to 400° C., or higher than or equal to 320° C. and lower than or equal to 370° C.

An electric furnace, an RTA apparatus, or the like can be used for the heat treatment. With the use of an RTA apparatus, the heat treatment can be performed at a temperature of higher than or equal to the strain point of the substrate if the heating time is short. Therefore, the heat treatment time can be shortened.

The heat treatment may be performed under an atmosphere of nitrogen, oxygen, ultra-dry air (air in which a water content is 20 ppm or less, 1 ppm or less, or 10 ppb or less), or a rare gas (argon, helium, or the like). The atmosphere of nitrogen, oxygen, ultra-dry air, or a rare gas preferably does not contain hydrogen, water, and the like.

By the heat treatment, part of oxygen contained in the oxide insulating film 25 can be moved to the oxide semiconductor film 19a, so that the oxygen vacancies contained in the oxide semiconductor film 19a can be reduced.

In the case where water, hydrogen, or the like is contained in the oxide insulating film 23 and the oxide insulating film 25 and a film 26 having a barrier property against oxygen which is formed later also has a barrier property against water, hydrogen, or the like, when the film 26 having a barrier property is formed later and heat treatment is performed, water, hydrogen, or the like contained in the oxide insulating film 23 and the oxide insulating film 25 are moved to the oxide semiconductor film 19a, so that defects are generated in the oxide semiconductor film 19a. However, by the heating, water, hydrogen, or the like contained in the oxide insulating film 23 and the oxide insulating film 25 can be released; thus, variation in electrical characteristics of the transistor 102 can be reduced, and change in threshold voltage can be inhibited.

Note that when the oxide insulating film 24 is formed over the oxide insulating film 22 while being heated, oxygen can be moved to the oxide semiconductor film 19a to reduce the oxygen vacancies in the oxide semiconductor film 19a; thus, the heat treatment is not necessarily performed.

The heat treatment may be performed after the formation of the oxide insulating films 22 and 24. However, the heat treatment is preferably performed after the formation of the oxide insulating films 23 and 25 because a film having conductivity can be formed in such a manner that oxygen is not moved to the oxide semiconductor film 19c and oxygen is released from the oxide semiconductor film 19c because of exposure of the oxide semiconductor film 19c and then oxygen vacancies are generated.

Here, heat treatment is performed at 350° C. for one hour in an atmosphere of nitrogen and oxygen.

Next, as illustrated in FIG. 6A, the film 26 to be the oxygen barrier film 27 later is formed.

The film 26 to be the oxygen barrier film 27 later is formed by a sputtering method, a CVD method, or the like. By forming the film 26 to be the oxygen barrier film 27 later by a sputtering method, a CVD method, or the like, the oxide semiconductor film 19c is exposed to plasma; thus, oxygen vacancies in the oxide semiconductor film 19c can be increased.

Through the process, the oxygen barrier film 15 is in contact with the film 26 to be the oxygen barrier film 27 with the oxide semiconductor film 19a, the oxide insulating film 23, and the oxide insulating film 25 provided on an inner side of the oxygen barrier film 15 and the film 26 to be the oxygen barrier film 27.

In addition, the oxide semiconductor film 19c becomes the film 19b having conductivity. In the case where a silicon nitride film is formed by a plasma CVD method as the film 26 to be the oxygen barrier film 27, hydrogen in the silicon nitride film is diffused to the oxide semiconductor film 19c, so that the film 19b having high conductivity can be formed.

Note that in the case where a silicon nitride film is formed by a plasma CVD method as the film 26 to be the oxygen barrier film 27, the substrate placed in the treatment chamber of the plasma CVD apparatus that is vacuum-evacuated is preferably kept at a temperature higher than or equal to 300° C. and lower than or equal to 400° C., or higher than or equal to 320° C. and lower than or equal to 370° C., so that a dense silicon nitride film can be formed.

In the case where a silicon nitride film is formed, a deposition gas containing silicon, nitrogen, and ammonia are preferably used as a source gas. As the source gas, a small amount of ammonia compared to the amount of nitrogen is used, whereby ammonia is dissociated in the plasma and activated species are generated. The activated species cleave a bond between silicon and hydrogen which are contained in a deposition gas containing silicon and a triple bond between nitrogen molecules. As a result, a dense silicon nitride film having few defects, in which a bond between silicon and nitrogen is promoted and a bond between silicon and hydrogen is few can be formed. On the other hand, when the amount of ammonia with respect to nitrogen is large in a source gas, cleavage of a deposition gas containing silicon and cleavage of nitrogen are not promoted, so that a sparse silicon nitride film in which a bond between silicon and hydrogen remains and defects are increased is formed. Therefore, in a source gas, a flow ratio of the nitrogen to the ammonia is set to be greater than or equal to 5 and less than or equal to 50, or greater than or equal to 10 and less than or equal to 50.

Here, in the treatment chamber of a plasma CVD apparatus, a 50-nm-thick silicon nitride film is formed as the film 26 to be the oxygen barrier film 27 by a plasma CVD method in which silane with a flow rate of 50 sccm, nitrogen with a flow rate of 5000 sccm, and ammonia with a flow rate of 100 sccm are used as the source gas, the pressure in the treatment chamber is 100 Pa, the substrate temperature is 350° C., and high-frequency power of 1000 W is supplied to parallel-plate electrodes with a high-frequency power supply of 27.12 MHz. Note that the plasma CVD apparatus is a parallel-plate plasma CVD apparatus in which the electrode area is 6000 $cm^2$, and the power per unit area (power density) into which the supplied power is converted is $1.7 \times 10^{-1}$ $W/cm^2$.

Next, heat treatment may be performed. The heat treatment is performed typically at a temperature higher than or equal to 150° C. and lower than or equal to 400° C., higher than or equal to 300° C. and lower than or equal to 400° C., or higher than or equal to 320° C. and lower than or equal to 370° C. Since the oxide semiconductor film 19a and the oxide insulating films 23 and 25 are provided in a region surrounded by the oxygen barrier films 15 and 26 which are in contact with each other, the movement of oxygen from the oxide semiconductor film 19a and the oxide insulating films 23 and 25 to the outside can be prevented. As a result, the negative shift of the threshold voltage can be reduced. Moreover, the amount of change in the threshold voltage can be reduced.

Then, after a mask is formed over the film 26 to be the oxygen barrier film 27 later by a photolithography process using a fifth photomask, the film 26 to be the oxygen barrier film 27 later is etched using the mask. Thus, the oxygen barrier film 27 having an opening 41 as illustrated in FIG. 6B is formed.

Figure 7A:
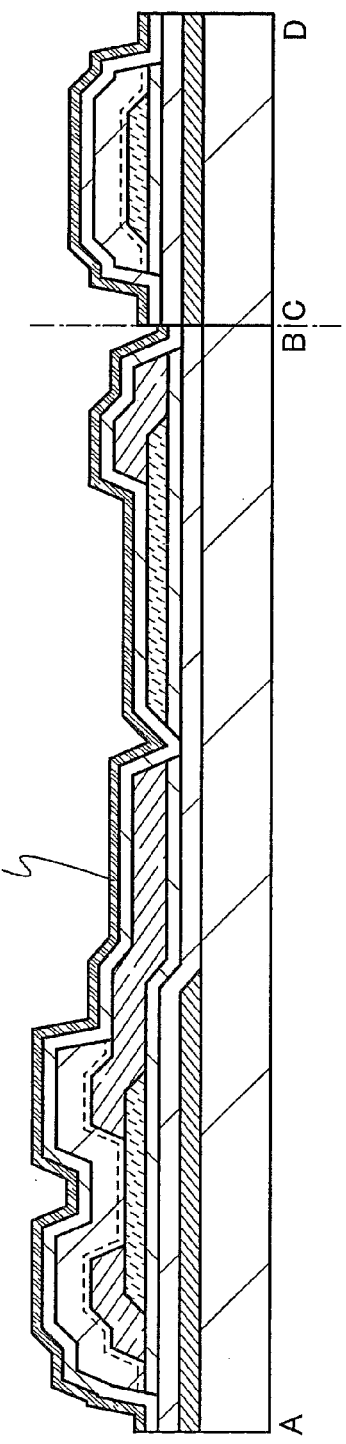
FIGS. 7A and 7B are cross-sectional views illustrating one embodiment of a method for manufacturing a semiconductor device.

Next, as illustrated in FIG. 7A, a conductive film 28 to be the conductive film 29 later is formed over the conductive film 21b and the oxygen barrier film 27.

The conductive film 28 is formed by a sputtering method, a CVD method, an evaporation method, or the like.

Figure 7B:
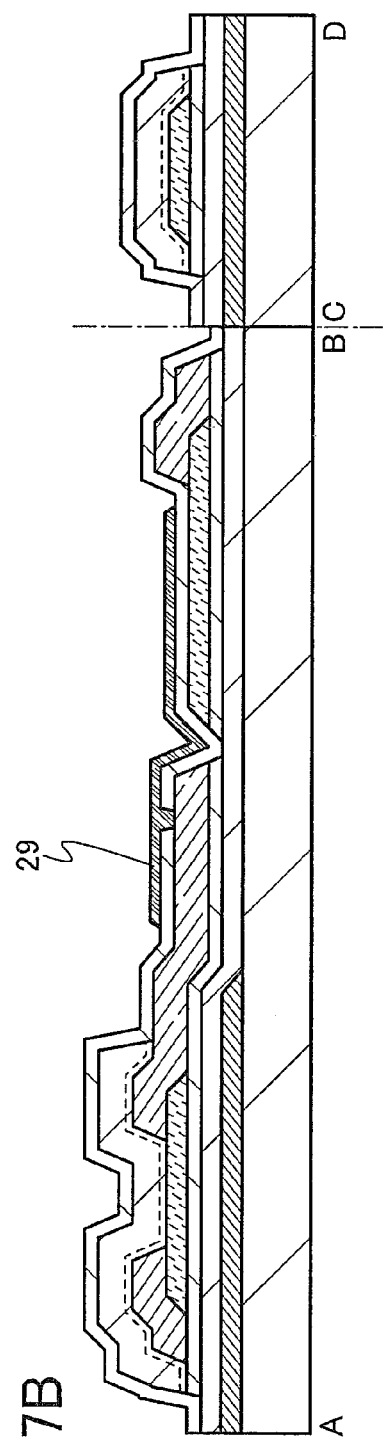

Then, a mask is formed over the conductive film 28 by a photolithography process using a sixth photomask. Next, as illustrated in FIG. 7B, part of the conductive film 28 is etched with the use of the mask to form the conductive film 29. After that, the mask is removed.

Through the above process, the transistor 102 is manufactured and the capacitor 105 can also be manufactured.

In the transistor in this embodiment, the oxygen barrier film 15 is in contact with the oxygen barrier film 27 with the oxide semiconductor film 19a and the oxide insulating films 23 and 25 provided on an inner side of the oxygen barrier films 15 and 27. At least one of the oxide insulating film 23 and the oxide insulating film 25 is formed using an oxide insulating film which contains more oxygen than that in the stoichiometric composition. Therefore, the movement of oxygen contained in the oxide insulating film 23 or the oxide insulating film 25 to the outside of the oxygen barrier film 15 and the oxygen barrier film 27 can be suppressed. As a result, oxygen contained in the oxide insulating film 23 or the oxide insulating film 25 can be moved to the oxide semiconductor film 19a efficiently, and the amount of oxygen vacancies in the oxide semiconductor film 19a can be reduced.

On an element substrate of the semiconductor device illustrated in this embodiment, one electrode of the capacitor is formed at the same time as the oxide semiconductor film of the transistor. In addition, the conductive film that serves as a pixel electrode is used as the other electrode of the capacitor. Thus, a step of forming another conductive film is not needed to form the capacitor, and the number of steps of manufacturing the semiconductor device can be reduced. Further, since the pair of electrodes has a light-transmitting property, the capacitor has a light-transmitting property. As a result, the area occupied by the capacitor can be increased and the aperture ratio in a pixel can be increased.

In this embodiment, the oxide insulating films to be the oxide insulating films 23 and 25 are formed by a plasma CVD method in which heating is performed at a temperature of higher than or equal to 280° C. and lower than or equal to 400° C. Thus, hydrogen, water, or the like contained in the oxide semiconductor film 19a can be released. Further, in the step, the length of heating time in a state where the oxide semiconductor film is exposed is short, and even when the temperature of heat treatment is lower than or equal to 400° C., it is possible to manufacture a transistor in which the amount of change in threshold voltage is equivalent to that of a transistor subjected to heat treatment at a high temperature. Consequently, the manufacturing cost of a semiconductor device can be reduced.

From the above, as for a semiconductor device including an oxide semiconductor film, a semiconductor device with improved electrical characteristics can be obtained.

Note that the structures, methods, and the like described in this embodiment can be used as appropriate in combination with any of the structures, methods, and the like described in the other embodiments.

Embodiment 2

In this embodiment, a semiconductor device and a manufacturing method thereof, which are different from those shown in Embodiment 1, are described with reference to the drawings. The semiconductor device in this embodiment is different from that in Embodiment 1 in that the transistor has a structure in which an oxide semiconductor film is provided between different gate electrodes, that is, a dual-gate structure. Note that the description about the same structures as those in Embodiment 1 is omitted.

Figure 8:
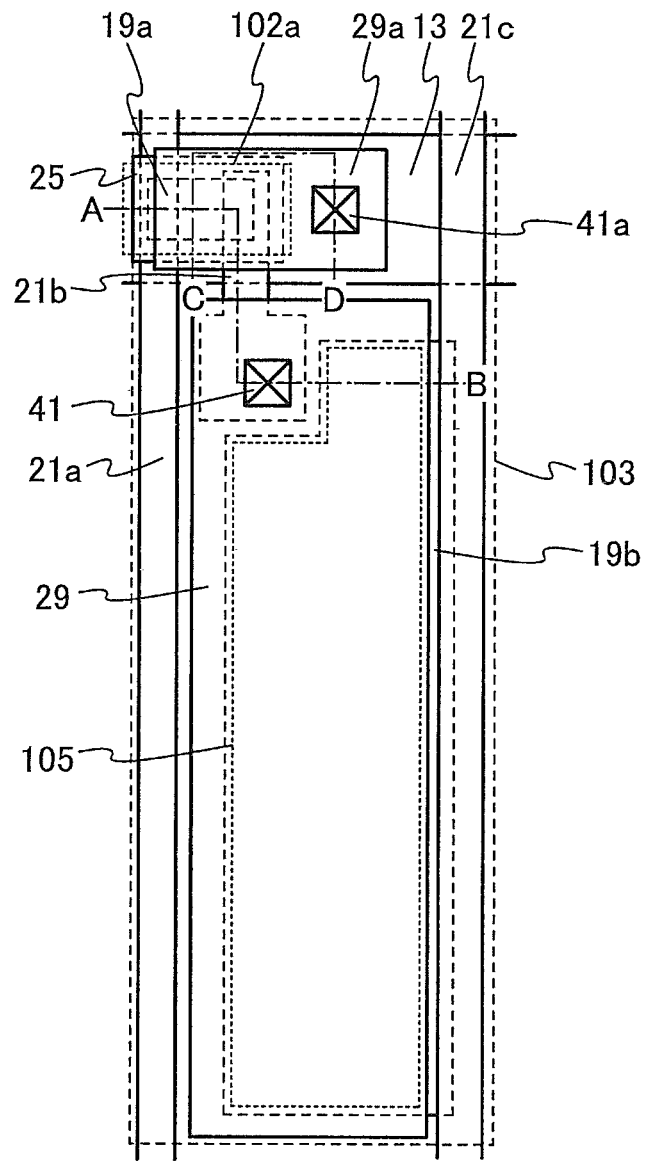
FIG. 8 is a top view illustrating one embodiment of a semiconductor device.

A specific structure of an element substrate included in the display device is described. Here, a specific example of a liquid crystal display device including a liquid crystal element in the pixel 103 is described. FIG. 8 is a top view of the pixel 103 illustrated in FIG. 1B.

The structure in this embodiment is different from that in Embodiment 1 in that, in a plan view of the pixel 103 in FIG. 8, a conductive film 29a serving as a gate electrode and overlapping part of or the whole of each of the conductive film 13 serving as a gate electrode, the oxide semiconductor film 19a, the conductive films 21a and 21b, and the oxide insulating film 25 is provided. The conductive film 29a serving as a gate electrode is connected to the conductive film 13 serving as a gate electrode in an opening 41a.

Figure 9:
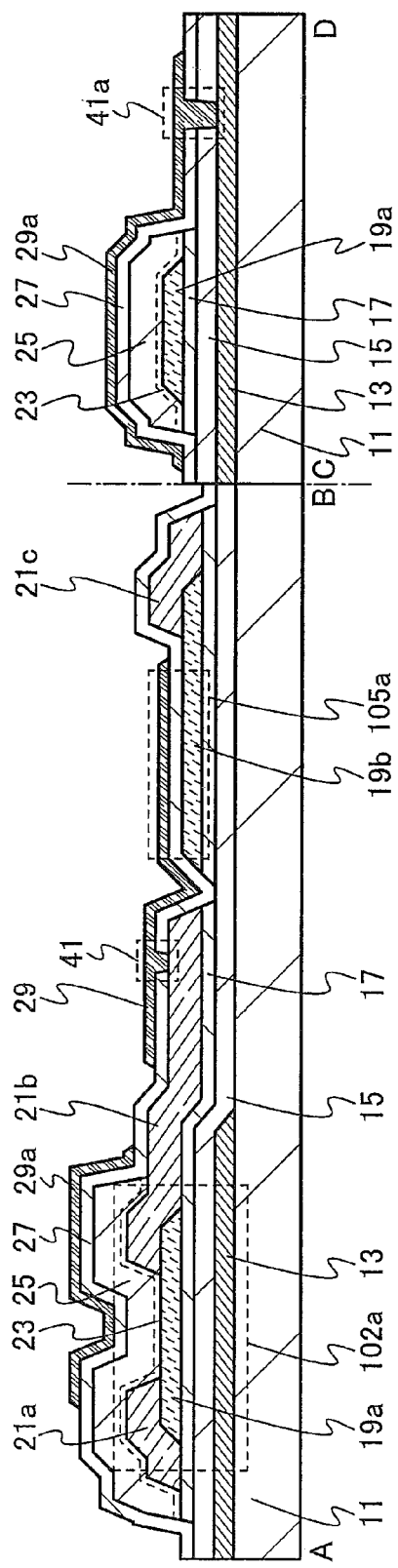
FIG. 9 is a cross-sectional view illustrating one embodiment of a semiconductor device.

Next, FIG. 9 is a cross-sectional view taken along dashed-dotted lines A-B and C-D in FIG. 8. A transistor 102a shown in FIG. 9 is a channel-etched transistor. Note that the transistor 102a in the channel length direction, a connection portion between the transistor 102a and the conductive film 29 serving as a pixel electrode, and the capacitor 105a are illustrated in the cross-sectional view taken along dashed-dotted line A-B, and the transistor 102a in the channel width direction and a cross-sectional view of a connection portion between the conductive film 13 and the conductive film 29a each serving as a gate electrode are illustrated in the cross-sectional view taken along dashed-dotted line C-D.

The transistor 102a in FIG. 9 has a dual-gate structure and includes the conductive film 13 serving as a gate electrode over the substrate 11. In addition, the transistor 102a includes the oxygen barrier film 15 formed over the substrate 11 and the conductive film 13 serving as a gate electrode, an oxide insulating film 17 formed over the oxygen barrier film 15, the oxide semiconductor film 19a overlapping the conductive film 13 serving as a gate electrode with the oxygen barrier film 15 and the oxide insulating film 17 provided therebetween, and the conductive films 21a and 21b which serve as a pair of electrodes and are in contact with the oxide semiconductor film 19a. Moreover, the oxide insulating film 23 is formed over the oxide insulating film 17, the oxide semiconductor film 19a, and the conductive films 21a and 21b serving as a pair of electrodes, and the oxide insulating film 25 is formed over the oxide insulating film 23. The oxygen barrier film 27 is formed over the oxygen barrier film 15, the oxide insulating film 17, the oxide insulating film 23, the oxide insulating film 25, and the conductive films 21a and 21b. In addition, the conductive film 29 connected to one of the conductive films 21a and 21b serving as a pair of electrodes, here the conductive film 21b, and the conductive film 29a serving as a gate electrode are formed over the oxygen barrier film 27.

As illustrated in the cross-sectional view taken along the dashed-dotted line C-D, the conductive film 29a serving as a gate electrode is connected to the conductive film 13 serving as a gate electrode in the opening 41a provided in the oxygen barrier films 15 and 27. That is, the conductive film 13 serving as a gate electrode and the conductive film 29a serving as a gate electrode have the same potential.

Thus, by applying voltage at the same potential to each gate electrode of the transistor 102a, variation in the initial characteristics can be reduced, and degradation of the transistor 102a after the −GBT stress test and a change in the rising voltage of on-state current at different drain voltages can be suppressed. In addition, a region where carriers flow in the oxide semiconductor film 19a becomes larger in the film thickness direction, so that the amount of carrier movement is increased. As a result, the on-state current of the transistor 102a is increased and the field-effect mobility becomes higher, typically becomes higher than or equal to 20 $cm^2/V \cdot s$.

Over the transistor 102a in this embodiment, the oxide insulating films 23 and 25, which are subjected to element isolation, are formed. The oxide insulating films 23 and 25, which are subjected to element isolation, overlap the oxide semiconductor film 19a. In the cross-sectional view in the channel width direction, end portions of the oxide insulating films 23 and 25 are positioned on an outer side than the oxide semiconductor film 19a. Furthermore, in the channel width direction in FIG. 9, the conductive film 29a serving as a gate electrode faces a side surface of the oxide semiconductor film 19a with the oxide insulating films 23 and 25 provided therebetween.

An end portion processed by etching or the like of the oxide semiconductor film, in which defects are generated by damage due to processing, is also contaminated by the attachment of an impurity, or the like. Thus, the end portion of the oxide semiconductor film is easily activated by application of a stress such as an electric field, thereby easily becoming n-type (having a low resistance). Therefore, the end portion of the oxide semiconductor film 19a overlapping the conductive film 13 serving as a gate electrode easily becomes n-type. When the end portion which becomes n-type is provided between the conductive films 21a and 21b serving as the pair of electrodes, the region which becomes n-type serves as a carrier path, resulting in a parasitic channel. However, as illustrated in the cross-sectional view taken along the dashed-dotted line C-D, when the conductive film 29a serving as a gate electrode faces a side surface of the oxide semiconductor film 19a with the oxide insulating films 23 and 25 provided therebetween in the channel width direction, due to the electric field of the conductive film 29a serving as a gate electrode, generation of a parasitic channel on the side surface of the oxide semiconductor film 19a or in a region including the side surface and the vicinity of the side surface is suppressed. As a result, a transistor which has excellent electrical characteristics such as a sharp increase in the drain current at the threshold voltage is obtained.

The oxide insulating film 23 or the oxide insulating film 25 provided over the oxide semiconductor film 19a is an oxide insulating film which contains more oxygen than that in the stoichiometric composition.

In the case where the oxide insulating film containing more oxygen than that in the stoichiometric composition is included in the oxide insulating film 23 or the oxide insulating film 25, part of oxygen contained in the oxide insulating film 23 or the oxide insulating film 25 can be moved to the oxide semiconductor film 19a, so that oxygen vacancies contained in the oxide semiconductor film 19a can be reduced.

The oxygen barrier film 15 and the oxygen barrier film 27 are provided to be in contact with each other with the oxide semiconductor film 19a and the oxide insulating films 23 and 25 provided on an inner side of the oxygen barrier films 15 and 27. Therefore, the movement of oxygen contained in the oxide insulating film 23 or the oxide insulating film 25 to the outside of the oxygen barrier film 15 and the oxygen barrier film 27 can be suppressed. As a result, oxygen contained in the oxide insulating film 23 or the oxide insulating film 25 can be moved to the oxide semiconductor film 19a efficiently, and the amount of oxygen vacancies in the oxide semiconductor film can be reduced.

The threshold voltage of a transistor using an oxide semiconductor film which contains oxygen vacancies easily shifts negatively, and such a transistor tends to be normally-on. This is because electric charges are generated owing to oxygen vacancies in the oxide semiconductor film and the resistance is thus reduced. The transistor having normally-on characteristics causes various problems in that malfunction is likely to be caused when in operation and that power consumption is increased when not in operation, for example. Further, there is a problem in that the amount of change in electrical characteristics, typically in threshold voltage, of the transistor over time or due to a stress test is increased.

However, in the transistor 102a in this embodiment, the oxide insulating film 23 or the oxide insulating film 25 provided over the oxide semiconductor film 19a contains more oxygen than that in the stoichiometric composition. Moreover, the oxide semiconductor film 19a, the oxide insulating film 23, and the oxide insulating film 25 are surrounded by the oxygen barrier film 15 and the oxygen barrier film 27. As a result, oxygen contained in the oxide insulating film 23 or the oxide insulating film 25 is moved to the oxide semiconductor film 19a efficiently, so that oxygen vacancies in the oxide semiconductor film 19a can be reduced. Accordingly, a transistor having normally-off characteristics is obtained. Further, the amount of change in electrical characteristics, typically in threshold voltage, of the transistor over time or due to a stress test can be reduced.

In the capacitor 105a, the film 19b having conductivity is formed at the same time as the oxide semiconductor film 19a and has high conductivity owing to impurities. Alternatively, the film 19b having conductivity is formed at the same time as the oxide semiconductor film 19a, and has high conductivity by containing impurities and oxygen vacancies generated by plasma damage or the like.

On an element substrate of the semiconductor device illustrated in this embodiment, one electrode of the capacitor is formed at the same time as the oxide semiconductor film of the transistor. In addition, the conductive film that serves as a pixel electrode is used as the other electrode of the capacitor. Thus, a step of forming another conductive film is not needed to form the capacitor, and the number of steps of manufacturing the semiconductor device can be reduced. Further, since the pair of electrodes has a light-transmitting property, the capacitor has a light-transmitting property. As a result, the area occupied by the capacitor can be increased and the aperture ratio in a pixel can be increased.

Details of the transistor 102a are described below. Note that the description of the components with the same reference numerals as those in Embodiment 1 is omitted.

The conductive film 29a serving as a gate electrode can be formed using a material similar to that of the conductive film 29 in Embodiment 1.

Next, a method for manufacturing the transistor 102a and the capacitor 105a in FIG. 9 is described with reference to FIGS. 4A to 4D, FIGS. 5A to 5D, FIG. 6A, and FIGS. 10A to 10C.

In a manner similar to that of Embodiment 1, through the processes of FIGS. 4A to 4D, FIGS. 5A to 5D, and FIG. 6A, the conductive film 13 serving as a gate electrode, the oxygen barrier film 15, the oxide insulating film 16, the oxide semiconductor film 19a, the film 19b having conductivity, the conductive films 21a and 21b serving as a pair of electrodes, the oxide insulating film 23, the oxide insulating film 25, and the film 26 to be the oxygen barrier film 27 are formed over the substrate 11. In these processes, photography processes using the first photomask to the fourth photomask are performed.

Then, after a mask is formed over the film 26 to be the oxygen barrier film 27 by a photolithography process using a fifth photomask, part of the film 26 to be the oxygen barrier film 27 is etched using the mask. Thus, the oxygen barrier film 27 having the opening 41 and an opening 41a as illustrated in FIG. 10A is formed.

Figures 10A, 10B, 10C:
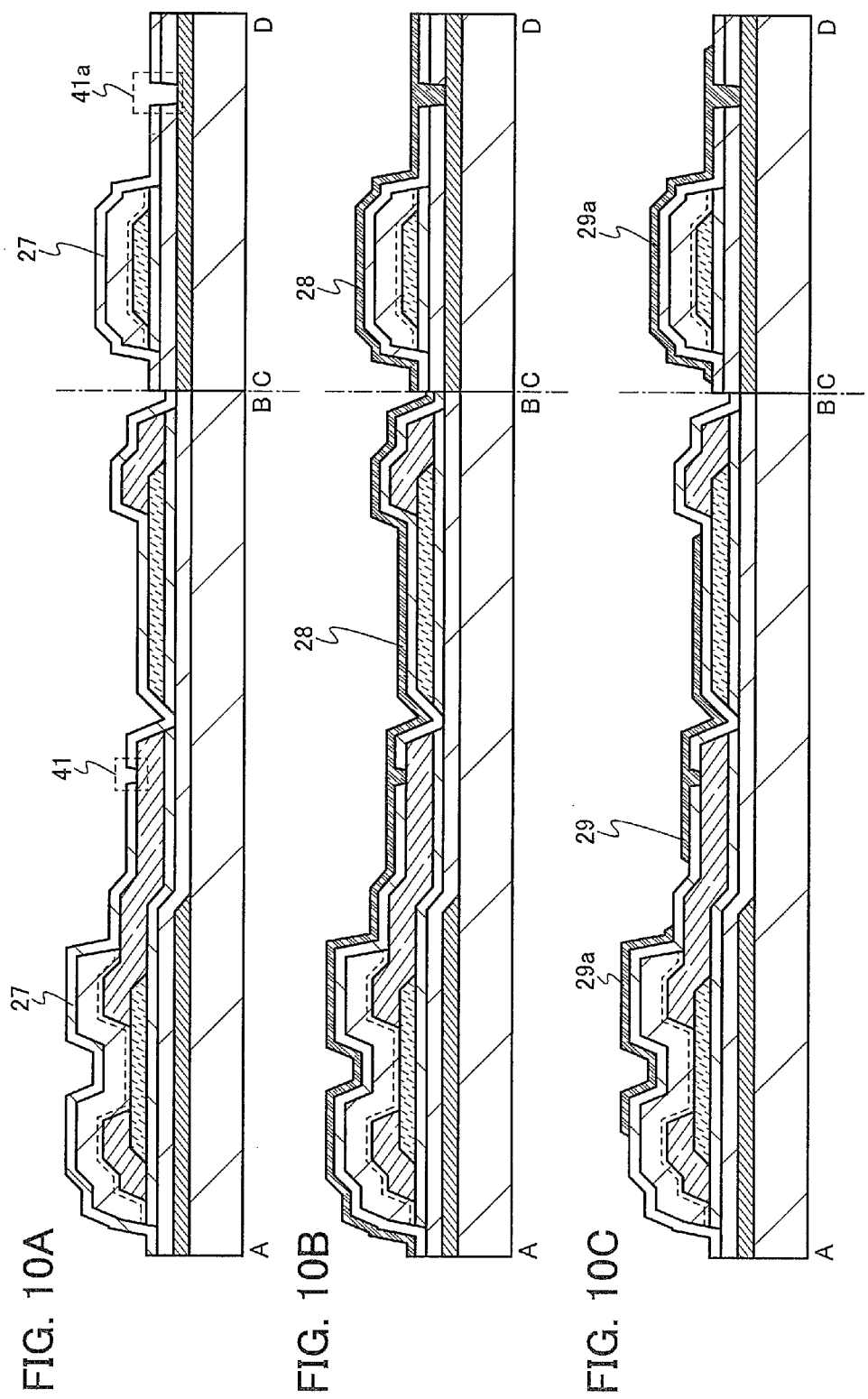
FIGS. 10A to 10C are cross-sectional views illustrating one embodiment of a method for manufacturing a semiconductor device.

Next, as illustrated in FIG. 10B, the conductive film 28 to be the conductive films 29 and 29a later is formed over the conductive film 13 serving as a gate electrode, the conductive film 21b, and the oxygen barrier film 27.

Then, a mask is formed over the conductive film 28 by a photolithography process using a sixth photomask. Next, as illustrated in FIG. 10C, part of the conductive film 28 is etched with the use of the mask to form the conductive film 29 serving as a pixel electrode and the conductive film 29a serving as a gate electrode. After that, the mask is removed.

Through the above process, the transistor 102a is manufactured and the capacitor 105a can also be manufactured.

In the transistor described in this embodiment, when the conductive film 29a serving as a gate electrode faces a side surface of the oxide semiconductor film 19a with the oxide insulating films 23 and 25 provided therebetween in the channel width direction, due to the electric field of the conductive film 29a serving as a gate electrode, generation of a parasitic channel on the side surface of the oxide semiconductor film 19a or in a region including the side surface and the vicinity of the side surface is suppressed. As a result, a transistor which has excellent electrical characteristics such as a sharp increase in the drain current at the threshold voltage is obtained.

In the transistor in this embodiment, the oxygen barrier film 15 is in contact with the oxygen barrier film 27 with the oxide semiconductor film 19a and the oxide insulating films 23 and 25 provided on an inner side of the oxygen barrier films 15 and 27. At least one of the oxide insulating film 23 and the oxide insulating film 25 is formed using an oxide insulating film which contains more oxygen than that in the stoichiometric composition. Therefore, the movement of oxygen contained in the oxide insulating film 23 or the oxide insulating film 25 to the outside of the oxygen barrier film 15 and the oxygen barrier film 27 can be suppressed. As a result, oxygen contained in the oxide insulating film 23 or the oxide insulating film 25 can be moved to the oxide semiconductor film 19a efficiently, and the amount of oxygen vacancies in the oxide semiconductor film 19a can be reduced.

On an element substrate of the semiconductor device illustrated in this embodiment, one electrode of the capacitor is formed at the same time as the oxide semiconductor film of the transistor. In addition, the conductive film that serves as a pixel electrode is used as the other electrode of the capacitor. Thus, a step of forming another conductive film is not needed to form the capacitor, and the number of steps of manufacturing the semiconductor device can be reduced. Further, since the pair of electrodes has a light-transmitting property, the capacitor has a light-transmitting property. As a result, the area occupied by the capacitor can be increased and the aperture ratio in a pixel can be increased.

In this embodiment, the oxide insulating films to be the oxide insulating films 23 and 25 are formed by a plasma CVD method in which heating is performed at a temperature of higher than or equal to 280° C. and lower than or equal to 400° C. Thus, hydrogen, water, or the like contained in the oxide semiconductor film 19a can be released. Further, in the step, the length of heating time in a state where the oxide semiconductor film is exposed is short, and even when the temperature of heat treatment is lower than or equal to 400° C., it is possible to manufacture a transistor in which the amount of change in threshold voltage is equivalent to that of a transistor subjected to heat treatment at a high temperature. Consequently, the manufacturing cost of a semiconductor device can be reduced.

From the above, as for a semiconductor device including an oxide semiconductor film, a semiconductor device with improved electrical characteristics can be obtained.

Note that the structures, methods, and the like described in this embodiment can be used as appropriate in combination with any of the structures, methods, and the like described in the other embodiments.

Embodiment 3

In this embodiment, the electrical characteristics of the transistor having a dual-gate structure described in Embodiment 2 that includes gate electrodes connected to each other and having the same potential are described with reference to FIG. 9 and FIGS. 11A to 16C.

Note that here a driving method in which the conductive films 13 and 29a serving as gate electrodes in FIG. 9 are electrically short-circuited and are supplied with a gate voltage is referred to as dual-gate driving. In other words, in dual-gate driving, the voltages of the conductive films 13 and 29a serving as gate electrodes are always equal to each other.

Figure 11A:
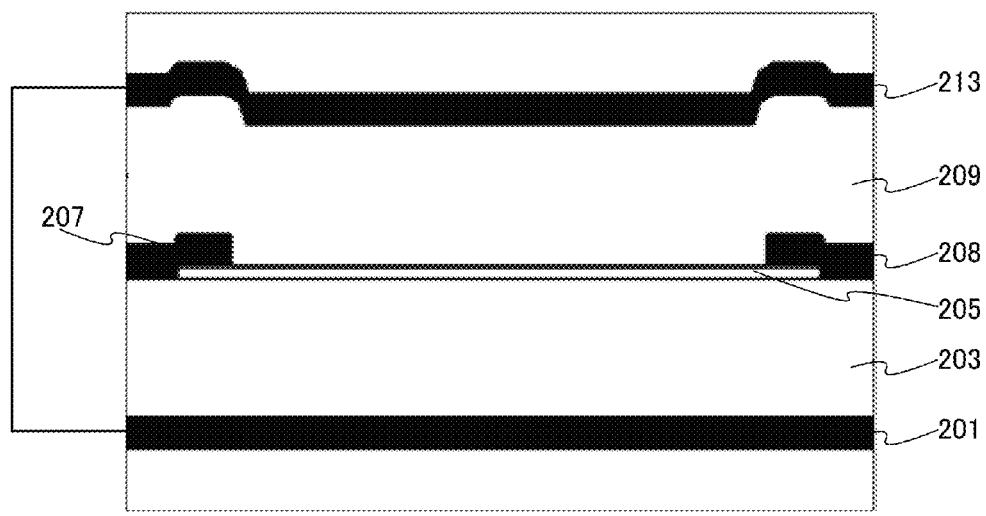
FIGS. 11A and 11B are cross-sectional view each illustrating a structure of a transistor.
Figure 11B:
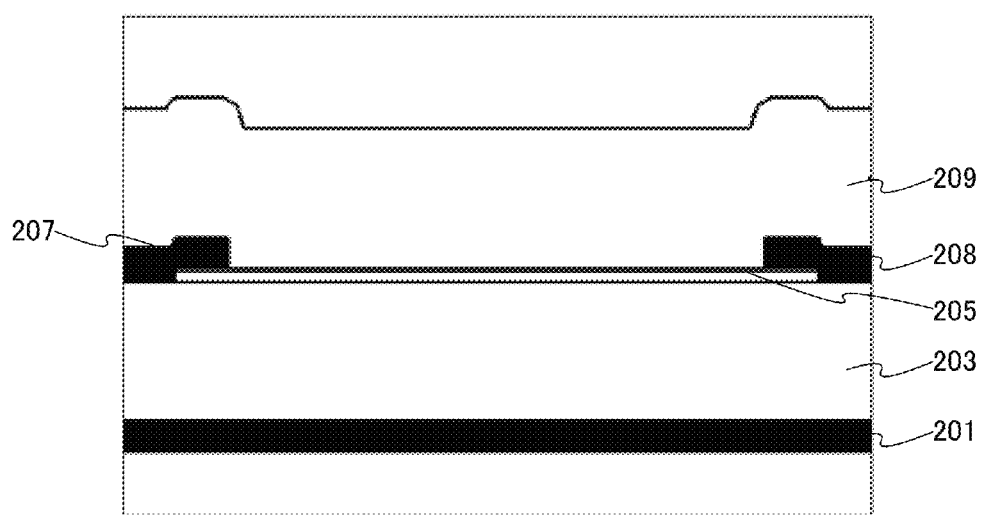

Here, the electrical characteristics of the transistor were evaluated. FIGS. 11A and 11B illustrate the structures of transistors used for the calculation. Note that device simulation software "Atlas" produced by Silvaco Inc. was used for the calculation.

A transistor having Structure 1 in FIG. 11A is a dual-gate transistor.

In the transistor having Structure 1, an insulating film 203 is formed over a gate electrode 201, and an oxide semiconductor film 205 is formed over the insulating film 203. A pair of electrodes 207 and 208 are formed over the insulating film 203 and the oxide semiconductor film 205, and an insulating film 209 is formed over the oxide semiconductor film 205 and the pair of electrodes 207 and 208. A gate electrode 213 is formed over the insulating film 209. The gate electrode 201 is connected to the gate electrode 213 at an opening (not illustrated) formed in the insulating films 203 and 209.

A transistor having Structure 2 in FIG. 11B is a single-gate transistor.

In the transistor having Structure 2, the insulating film 203 is formed over the gate electrode 201, and the oxide semiconductor film 205 is formed over the insulating film 203. The pair of electrodes 207 and 208 are formed over the insulating film 203 and the oxide semiconductor film 205, and the insulating film 209 is formed over the oxide semiconductor film 205 and the pair of electrodes 207 and 208.

Note that in the calculation, the work function $\phi_M$ of the gate electrode 201 was set to 5.0 eV. The insulating film 203 was a 100-nm-thick film having a dielectric constant of 4.1. The oxide semiconductor film 205 was a single-layer In—Ga—Zn oxide film (In:Ga:Zn=1:1:1). The band gap $E_g$ of the In—Ga—Zn oxide film was 3.15 eV, the electron affinity $\chi$ was 4.6 eV, the dielectric constant was 15, the electron mobility was 10 cm$^2$/Vs, and the donor density $N_d$ was $3 \times 10^{17}$ atoms/cm$^3$. The work function $\phi_{sd}$ of the pair of electrodes 207 and 208 was set to 4.6 eV. Ohmic junction was made between the oxide semiconductor film 205 and each of the pair of electrodes 207 and 208. The insulating film 209 was a 100-nm-thick film having a dielectric constant of 4.1. Note that defect levels, surface scattering, and the like in the oxide semiconductor film 205 were not considered. Further, the channel length and the channel width of the transistor were 10 μm and 100 μm, respectively.

<Reduction in Variation in Initial Characteristics>

As in the case of the transistor having Structure 1, by the dual-gate driving, variation in initial characteristics can be reduced. This is because on account of the dual-gate driving, the amount of change in the threshold voltage $V_{th}$, which is one of Id-Vg characteristics, of the transistor having Structure 1 can be small as compared to that of the transistor having Structure 2.

Here, as one example, a negative shift in the threshold voltage of the Id-Vg characteristics that is caused because a semiconductor film becomes n-type is described.

The sum of the amount of charges of donor ions in the oxide semiconductor film is Q (C), the capacitance formed by the gate electrode 201, the insulating film 203, and the oxide semiconductor film 205 is $C_{Bottom}$, the capacitance formed by the oxide semiconductor film 205, the insulating film 209, and the gate electrode 213 is $C_{Top}$. The amount of change ΔV of $V_{th}$ of the transistor having Structure 1 in that case is expressed by Formula 1. The amount of change ΔV of $V_{th}$ of the transistor having Structure 2 in that case is expressed by Formula 2.

$$\Delta V = -\frac{Q}{C_{Bottom} + C_{Top}} \quad \text{[Formula 1]}$$

$$\Delta V = -\frac{Q}{C_{Bottom}} \quad \text{[Formula 2]}$$

As expressed by Formula 1, by the dual-gate driving performed in the transistor having Structure 1, the capacitance between donor ions in the oxide semiconductor film and the gate electrode becomes the sum of $C_{Bottom}$ and $C_{Top}$; thus, the amount of change in the threshold voltage is small.

Figure 12A:
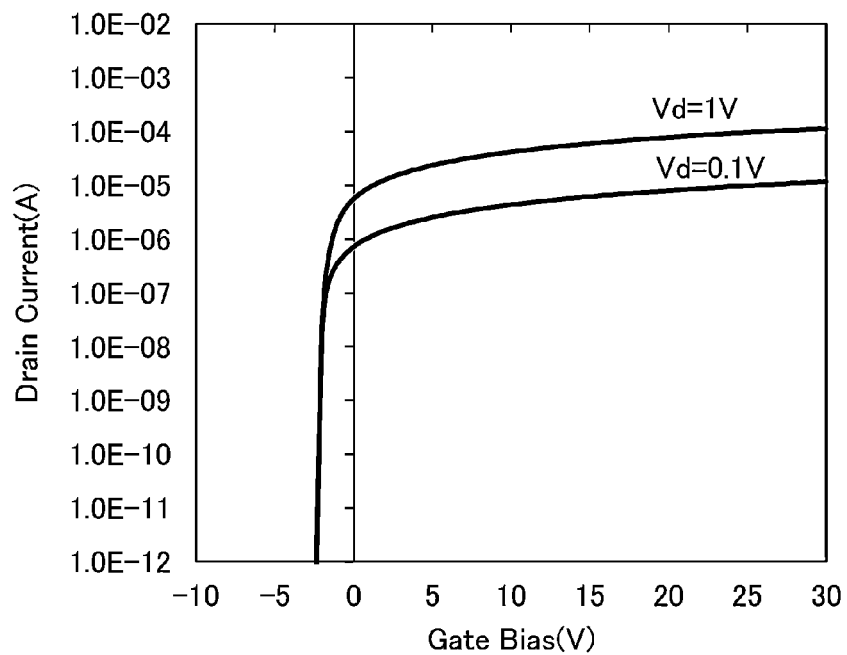
FIGS. 12A and 12B each show calculation results of current-voltage curves.
Figure 12B:
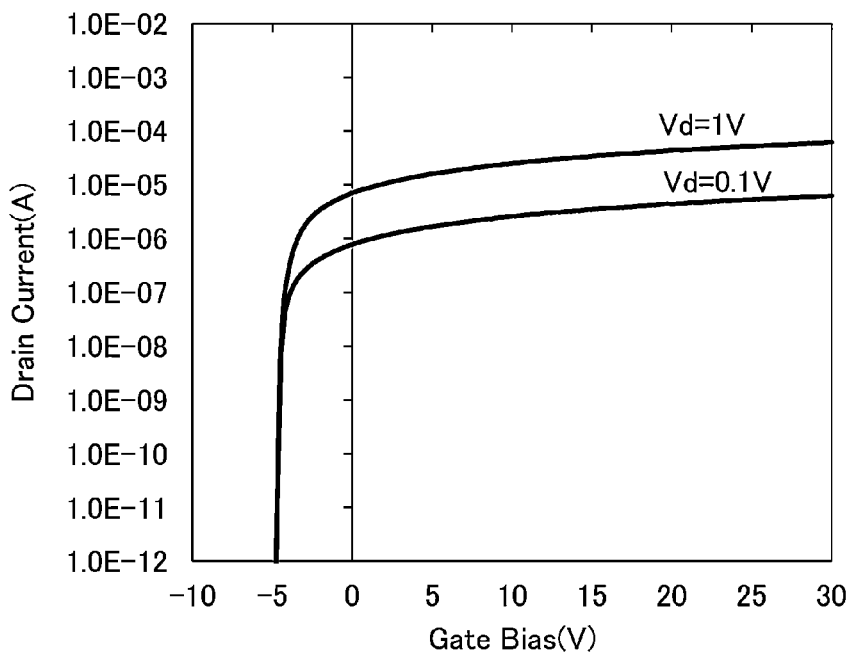

FIG. 12A shows the calculation results of the current-voltage curves at drain voltages of 0.1 V and 1 V of the transistor having Structure 1. FIG. 12B shows the calculation results of the current-voltage curves at drain voltages of 0.1 V and 1 V of the transistor having Structure 2. When the drain voltage Vd is 0.1 V, the threshold voltage of the transistor having Structure 1 is −2.26 V and the threshold voltage of the transistor having Structure 2 is −4.73 V.

As in the case of the transistor having Structure 1, when the dual-gate driving is employed, the amount of change of the threshold voltage can be small. Thus, variation in electrical characteristics among a plurality of transistors can also be small.

Note that although a negative shift in the threshold voltage due to the donor ions in the oxide semiconductor film is considered here, a positive shift in the threshold voltage due to fixed charges, mobile charges, or negative charges (electrons trapped by acceptor-like states) in the insulating films 203 and 209 is similarly suppressed, which might reduce the variation.

<Reduction in Degradation Due to −GBT Stress Test>

By the dual-gate driving performed in the transistor having Structure 1, degree of degradation due to a −GBT stress test can be low. Some reasons why degree of degradation due to a −GBT stress test can be low are described below.

Figure 13A:
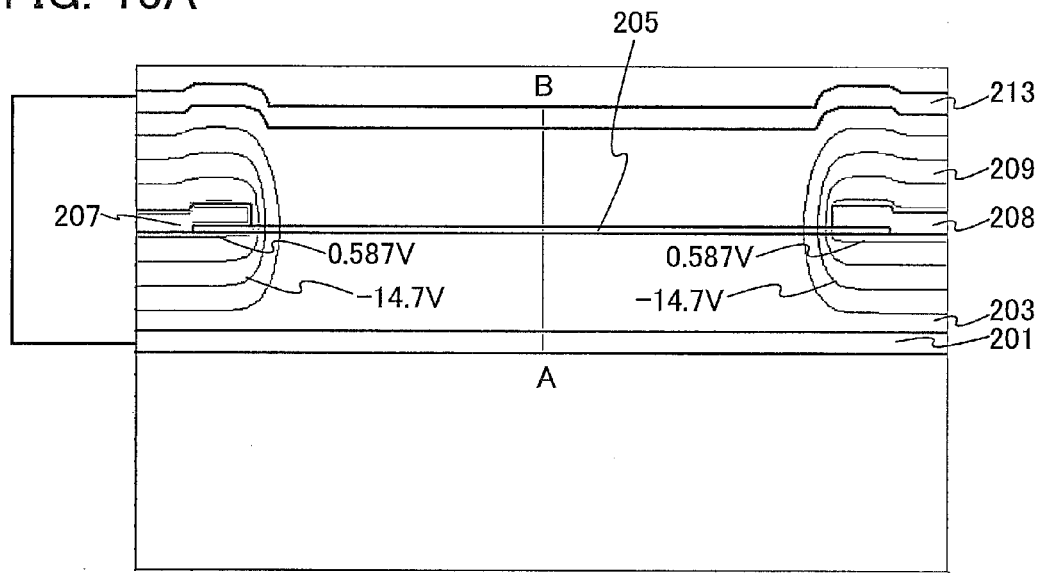
FIGS. 13A and 13B show calculation results of potentials of a transistor.
Figure 13B:
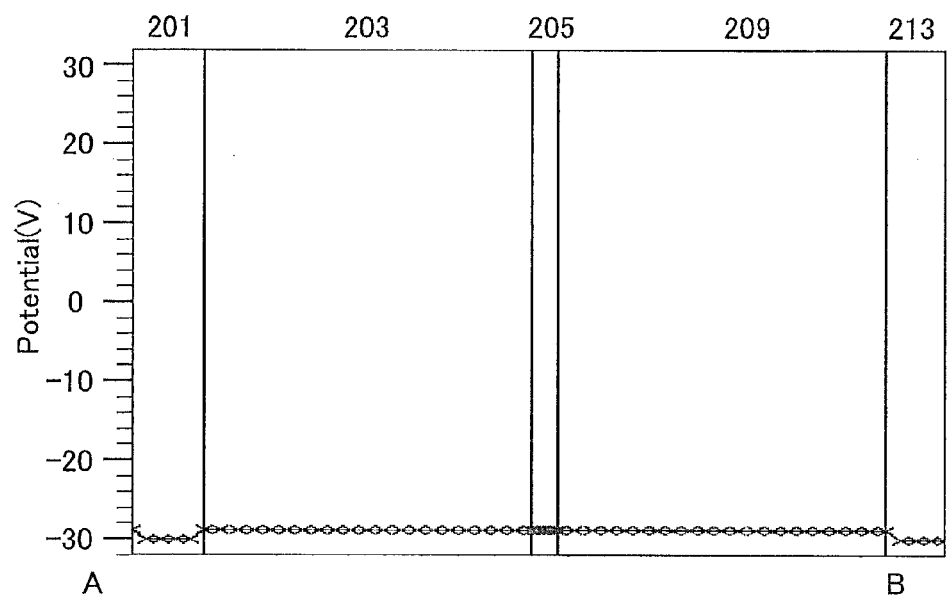

One of the reasons is that electrostatic stress is not caused on account of the dual-gate driving. FIG. 13A is a diagram in which potential contour lines are plotted in the case where −30 V is applied to each of the gate electrodes 201 and 213 in the transistor having Structure 1. FIG. 13B shows potentials at the cross section A-B in FIG. 13A.

The oxide semiconductor film 205 is an intrinsic semiconductor, and when a negative voltage is applied to the gate electrodes 201 and 213 and the oxide semiconductor film 205 is fully depleted, no charge exists between the gate electrodes 201 and 213. With this state, when the same potential is supplied to the gate electrodes 201 and 213, as illustrated in FIG. 13B, the potential of the gate electrode 201 becomes completely equal to that of the gate electrode 213. Since the potentials are equal to each other, electrostatic stress is not caused on the insulating film 203, the oxide semiconductor film 205, and the insulating film 209. As a result, phenomena causing degradation due to the −GBT stress test, such as mobile ions and trap and detrap of carriers in the insulating films 203 and 209, do not occur.

Figure 14A:
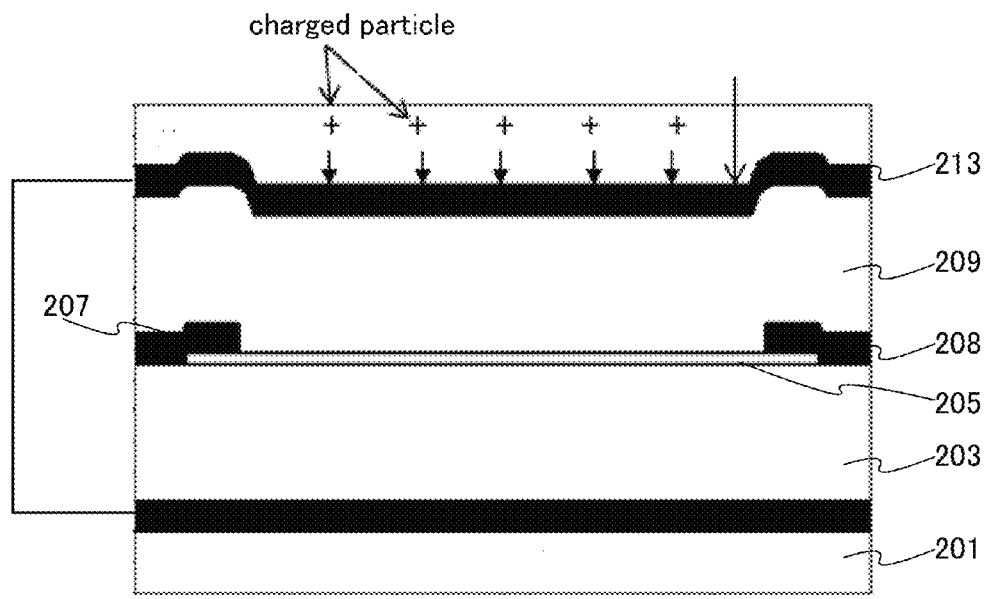
FIGS. 14A and 14B illustrate a model.
Figure 14B:
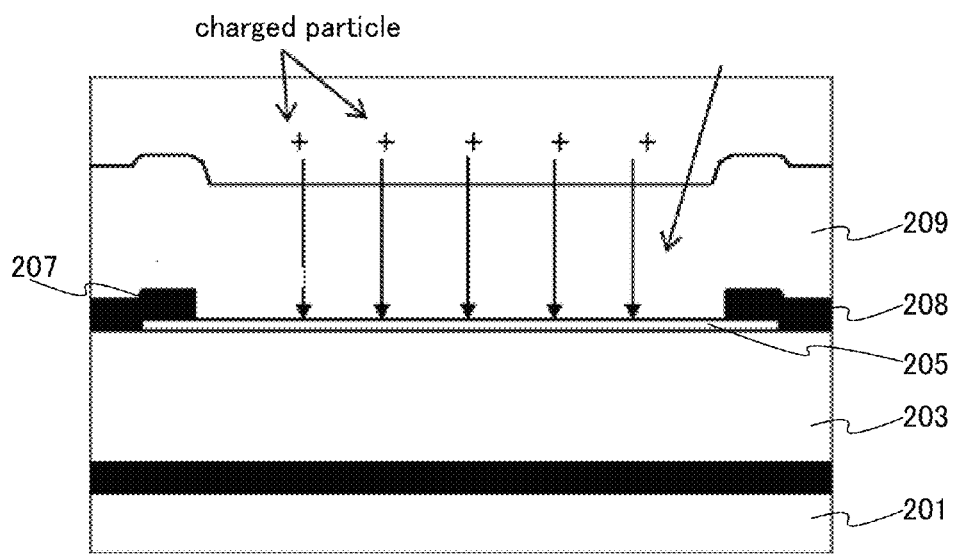

Another reason is that an external electric field of an FET can be blocked in the case of the dual-gate driving. FIG. 14A illustrates a model in which charged particles in the air are adsorbed on the gate electrode 213 in the transistor having Structure 1 illustrated in FIG. 11A. FIG. 14B illustrates a model in which charged particles in the air are adsorbed on the insulating film 209 in the transistor having Structure 2 illustrated in FIG. 11B.

As illustrated in FIG. 14B, in the transistor having Structure 2, positively charged particles in the air are adsorbed on a surface of the insulating film 209. When a negative voltage is applied to the gate electrode 201, positively charged particles are adsorbed on the insulating film 209. As a result, as indicated by arrows in FIG. 14B, an electric field of the positively charged particles affects the interface of the oxide semiconductor film 205 with the insulating film 209, so that a state similar to the state when a positive bias is applied is brought about. As a result, the threshold voltage might shift in the negative direction.

In contrast, even if positively charged particles are adsorbed on a surface of the gate electrode 213 in the transistor having Structure 1 illustrated in FIG. 14A, as indicated by arrows in FIG. 14A, the gate electrode 213 blocks the electric field of the positively charged particles; thus, the positively charged particles do not affect the electrical characteristics of the transistor. In sum, the transistor can be electrically protected against external charges by the gate electrode 213, leading to suppression of the degradation due to the −GBT stress test.

For the above two reasons, in the transistor operated by the dual-gate driving, the degradation due to the −GBT stress test can be suppressed.

<Suppression of Changes in Rising Voltages of on-State Current at Different Drain Voltages>

Here, in the case of Structure 2, changes in the rising voltages of on-state current at different drain voltages and a cause of the changes are described.

Figure 15A:
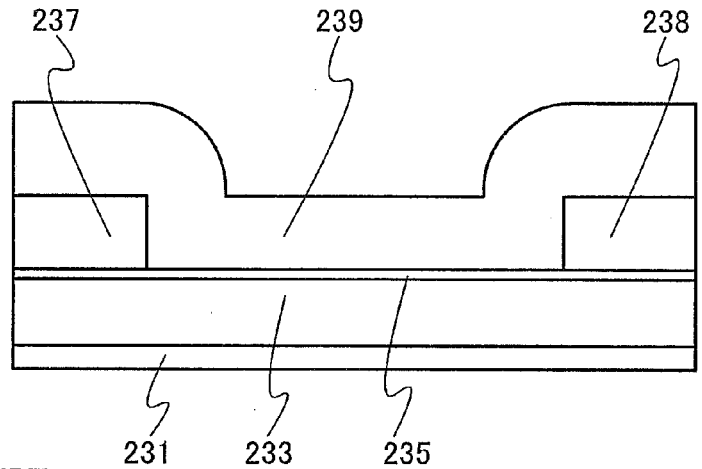
FIGS. 15A to 15C illustrate a model.
Figure 15B:
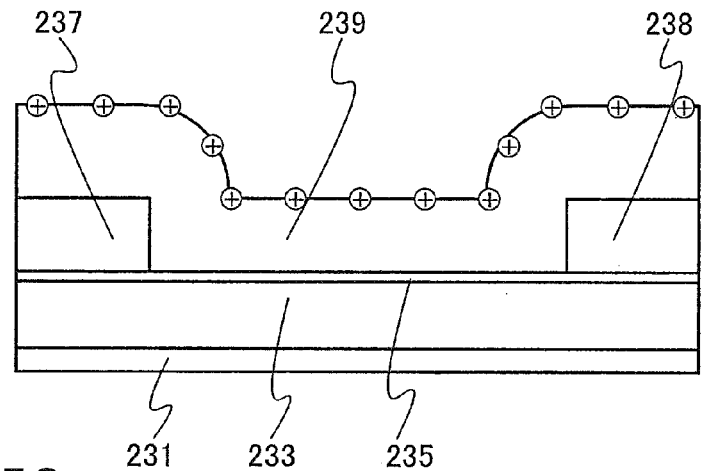
Figure 15C:
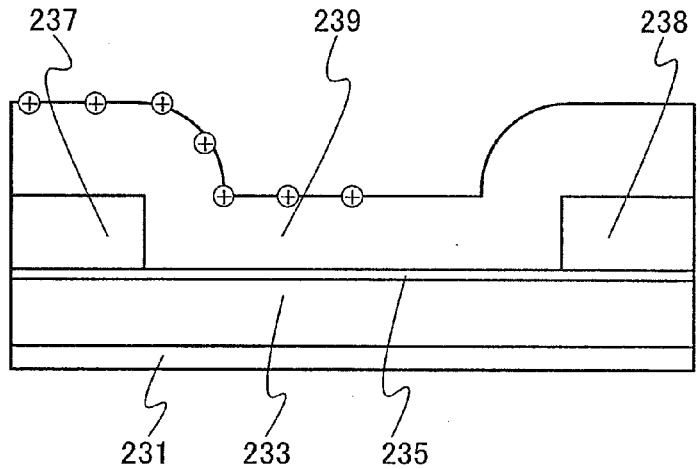

In a transistor illustrated in FIGS. 15A to 15C, a gate insulating film 233 is provided over a gate electrode 231, and an oxide semiconductor film 235 is provided over the gate insulating film 233. A pair of electrodes 237 and 238 are provided over the oxide semiconductor film 235, and an insulating film 239 is provided over the gate insulating film 233, the oxide semiconductor film 235, and the pair of electrodes 237 and 238.

Note that in the calculation, the work function $\phi_M$ of the gate electrode 231 was set to 5.0 eV. The gate insulating film 233 had a stacked-layer structure including a 400-nm-thick film having a dielectric constant of 7.5 and a 50-nm-thick film having a dielectric constant of 4.1. The oxide semiconductor film 235 was a single-layer In—Ga—Zn oxide film (In:Ga:Zn=1:1:1). The band gap $E_g$ of the In—Ga—Zn oxide film was 3.15 eV, the electron affinity χ was 4.6 eV, the dielectric constant was 15, the electron mobility was 10 cm$^2$/Vs, and the donor density $N_d$ was 1×10$^{13}$/cm$^3$. The work function $\phi_{sd}$ of the pair of electrodes 237 and 238 was set to 4.6 eV. Ohmic junction was made between the oxide semiconductor film 235 and each of the pair of electrodes 207 and 208. The insulating film 239 was a 550-nm-thick film having a dielectric constant of 3.9. Note that defect levels, surface scattering, and the like in the oxide semiconductor film 235 were not considered. Further, the channel length and the channel width of the transistor were 3 μm and 50 μm, respectively.

Next, models of a transistor illustrated in FIG. 15A in which positively charged particles are adsorbed on a surface of the insulating film 239 are illustrated in FIGS. 15B and 15C. FIG. 15B illustrates an assumed structure in which positive fixed charges are uniformly adsorbed on the surface of the insulating film 239. FIG. 15C illustrates an assumed structure in which positive fixed charges are partly adsorbed on the surface of the insulating film 239.

Figure 16A:
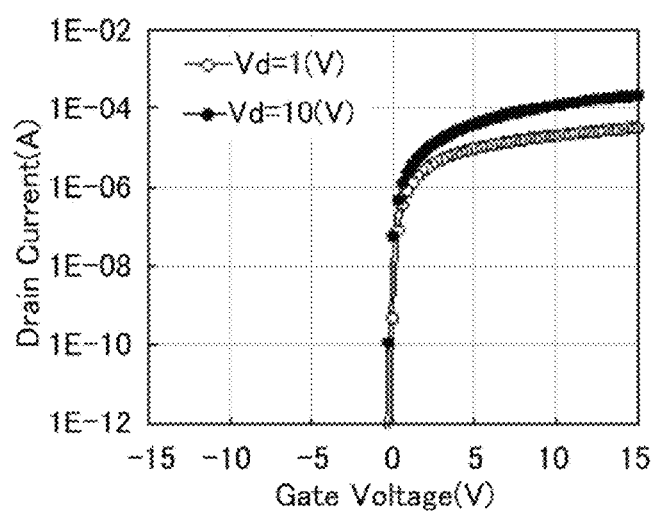
FIGS. 16A to 16C each show calculation results of current-voltage curves.
Figure 16B:
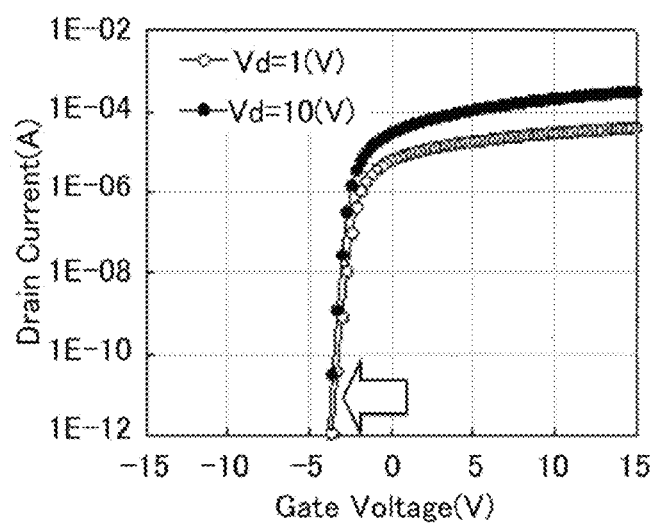
Figure 16C:
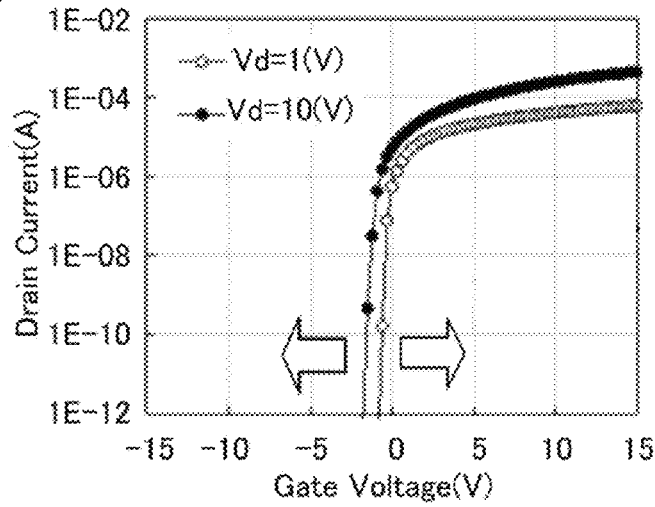

Calculation results of the electrical characteristics of the transistors illustrated in FIGS. 15A to 15C are shown in FIGS. 16A to 16C, respectively.

In the case where it is assumed that no positive fixed charge is adsorbed on the insulating film 239 in the transistor illustrated in FIG. 15A, the rising voltage at a drain voltage $V_d$ of 1 V approximately corresponds to that at a drain voltage $V_d$ of 10 V as shown in FIG. 16A.

In contrast, in the case where it is assumed that positive fixed charges are uniformly adsorbed on the insulating film 239 in the transistor illustrated in FIG. 15B, the threshold voltages shift in the negative direction and the rising voltage at a drain voltage $V_d$ of 1 V approximately corresponds to that at a drain voltage $V_d$ of 10 V as shown in FIG. 16B.

In the case where it is assumed that positive fixed charges are partly adsorbed on the insulating film 239 in the transistor illustrated in FIG. 15C, the rising voltage at a drain voltage $V_d$ of 1 V is different from that at a drain voltage $V_d$ of 10 V as shown in FIG. 16C.

Since the gate electrode 213 is provided in the transistor having Structure 1, as described in <Reduction in degradation due to −GBT stress test>, the gate electrode 213 blocks the electric field of external charged particles; thus, the charged particles do not affect the electrical characteristics of the transistor. In other words, the transistor can be electrically protected against external charges by the gate electrode 213, and changes in the rising voltages of on-state current at different drain voltages can be suppressed.

As described above, in the case where a dual-gate structure is employed and a given voltage is given to each gate electrode, degradation due to a −GBT stress test and changes in the rising voltages of on-state current at different drain voltages can be suppressed. Moreover, in the case where a dual-gate structure is employed and voltages having the same potential are given to each gate electrode, variation in initial characteristics can be reduced, degradation due to a −GBT stress test can be suppressed, and changes in the rising voltages of on-state current at different drain voltages can be suppressed.

Note that the structures, methods, and the like described in this embodiment can be used as appropriate in combination with any of the structures, methods, and the like described in the other embodiments.

Embodiment 4

In each of the transistors described in Embodiments 1 to 3, a base insulating film can be provided between the substrate 11 and the conductive film 13 serving as a gate electrode as necessary. As a material of the base insulating film, silicon oxide, silicon oxynitride, silicon nitride, silicon nitride oxide, gallium oxide, hafnium oxide, yttrium oxide, aluminum oxide, aluminum oxynitride, and the like can be given as examples. Note that when silicon nitride, gallium oxide, hafnium oxide, yttrium oxide, aluminum oxide, or the like is used as a material of the base insulating film, it is possible to suppress diffusion of impurities such as alkali metal, water, and hydrogen into the oxide semiconductor film 19a from the substrate 11.

The base insulating film can be formed by a sputtering method, a CVD method, or the like.

Note that the structures, methods, and the like described in this embodiment can be used as appropriate in combination with any of the structures, methods, and the like described in the other embodiments.

Embodiment 5

Figure 17:
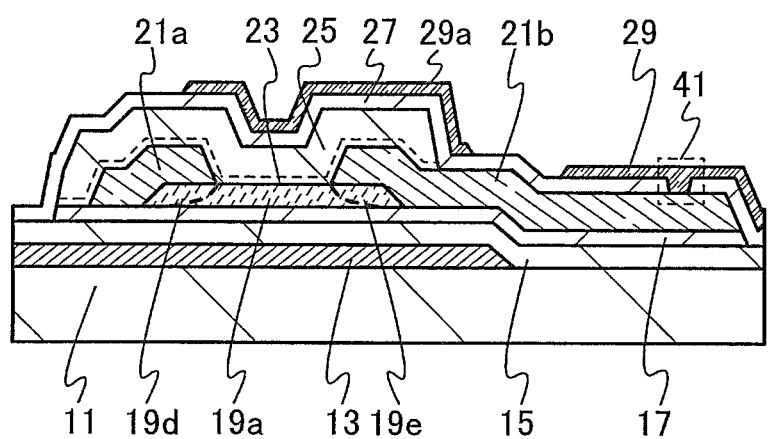
FIG. 17 is a cross-sectional view illustrating one embodiment of a transistor.

As for the conductive films 21a and 21b serving as a pair of electrodes provided in each of the transistors described in Embodiments 1 to 4, it is possible to use a conductive material which is easily bonded to oxygen, such as tungsten, titanium, aluminum, copper, molybdenum, chromium, or tantalum, or an alloy thereof. Thus, oxygen contained in the oxide semiconductor film 19a and the conductive material contained in the conductive films 21a and 21b serving as a pair of electrodes are bonded to each other, so that an oxygen deficient region is formed in the oxide semiconductor film 19a. Further, in some cases, part of constituent elements of the conductive material that forms the conductive films 21a and 21b serving as a pair of electrodes is mixed into the oxide semiconductor film 19a. Consequently, as shown in FIG. 17, low-resistance regions 19d and 19e are formed in the vicinity of regions of the oxide semiconductor film 19a which are in contact with the conductive films 21a and 21b serving as a pair of electrodes. The low-resistance regions 19d and 19e are formed between the oxide insulating film 17 and the conductive films 21a and 21b serving as a pair of electrodes so as to be in contact with the conductive films 21a and 21b serving as a pair of electrodes. Since the low-resistance regions 19d and 19e have high conductivity, contact resistance between the oxide semiconductor film 19a and the conductive films 21a and 21b serving as a pair of electrodes can be reduced, and thus, the on-state current of the transistor can be increased.

Further, the conductive films 21a and 21b serving as a pair of electrodes may each have a stacked-layer structure of the conductive material which is easily bonded to oxygen and a conductive material which is not easily bonded to oxygen, such as titanium nitride, tantalum nitride, or ruthenium. With such a stacked-layer structure, oxidization of the conductive films 21a and 21b serving as a pair of electrodes can be prevented at the interface between the conductive films 21a and 21b serving as a pair of electrodes and the oxide insulating film 23, so that the increase of the resistance of the conductive films 21a and 21b serving as a pair of electrodes can be inhibited.

Note that the structures, methods, and the like described in this embodiment can be used as appropriate in combination with any of the structures, methods, and the like described in the other embodiments.

Embodiment 6

In this embodiment, a semiconductor device including a transistor in which the amount of defects in an oxide semiconductor film can be further reduced as compared to Embodiments 1 and 2 is described with reference to drawings. Transistors described in this embodiment are different from those in Embodiments 1 and 2 in that a multilayer film in which oxide semiconductor films are stacked is included. Here, details are described using the transistor in Embodiment 1.

FIGS. 18A and 18B each illustrate a cross-sectional view of an element substrate included in a semiconductor device. FIGS. 18A and 18B are cross-sectional views taken along the dashed-dotted lines A-B and C-D in FIG. 2.

A transistor 102b in FIG. 18A includes a multilayer film 37a overlapping the conductive film 13 serving as a gate electrode with the oxygen barrier film 15 and the oxide insulating film 17 provided therebetween and the conductive films 21a and 21b serving as a pair of electrodes in contact with the multilayer film 37a. Moreover, over the oxygen barrier film 15, the oxide insulating film 17, the multilayer film 37a, and the conductive films 21a and 21b serving as a pair of electrodes, the oxide insulating film 23, the oxide insulating film 25, and the oxygen barrier film 27 are formed.

A capacitor 105b in FIG. 18A includes a multilayer film 37b formed over the oxide insulating film 17, the oxygen barrier film 27 in contact with the multilayer film 37b, and the conductive film 29 in contact with the oxygen barrier film 27. The multilayer film 37b is in contact with the conductive film 21c serving as a capacitor line. The oxygen barrier film 15 and the oxygen barrier film 27 are in contact with each other, and the multilayer film 37b is provided between the oxygen barrier film 15 and the oxygen barrier film 27.

In the transistor 102b described in this embodiment, the multilayer film 37a includes the oxide semiconductor film 19a and an oxide semiconductor film 39a. That is, the multilayer film 37a has a two-layer structure. Further, part of the oxide semiconductor film 19a serves as a channel region. Furthermore, the oxide insulating film 23 is formed in contact with the oxide semiconductor film 39a, and the oxide insulating film 25 is formed in contact with the oxide insulating film 23. That is, the oxide semiconductor film 39a is provided between the oxide semiconductor film 19a and the oxide insulating film 23.

The oxide semiconductor film 39a is a film containing one or more elements that form the oxide semiconductor film 19a. Thus, interface scattering is unlikely to occur at the interface between the oxide semiconductor films 19a and 39a. Thus, the transistor can have a high field-effect mobility because the movement of carriers is not hindered at the interface.

The oxide semiconductor film 39a is typically an In—Ga oxide film, an In—Zn oxide film, or an In-M-Zn oxide film (M represents Al, Ga, Y, Zr, La, Ce, or Nd). The energy at the conduction band bottom of the oxide semiconductor film 39a is closer to a vacuum level than that of the oxide semiconductor film 19a is, and typically, the difference between the energy at the conduction band bottom of the oxide semiconductor film 39a and the energy at the conduction band bottom of the oxide semiconductor film 19a is any one of 0.05 eV or more, 0.07 eV or more, 0.1 eV or more, or 0.15 eV or more, and any one of 2 eV or less, 1 eV or less, 0.5 eV or less, or 0.4 eV or less. That is, the difference between the electron affinity of the oxide semiconductor film 39a and the electron affinity of the oxide semiconductor film 19a is any one of 0.05 eV or more, 0.07 eV or more, 0.1 eV or more, or 0.15 eV or more, and any one of 2 eV or less, 1 eV or less, 0.5 eV or less, or 0.4 eV or less.

The oxide semiconductor film 39a preferably contains In because carrier mobility (electron mobility) can be increased.

When the oxide semiconductor film 39a contains a larger amount of Al, Ga, Y, Zr, La, Ce, or Nd in an atomic ratio than the amount of In in an atomic ratio, any of the following effects may be obtained: (1) the energy gap of the oxide semiconductor film 39a is widened; (2) the electron affinity of the oxide semiconductor film 39a decreases; (3) an impurity from the outside is blocked; (4) an insulating property of the oxide semiconductor film 39a increases as compared to that of the oxide semiconductor film 19a; and (5) oxygen vacancies are less likely to be generated because Al, Ga, Y, Zr, La, Ce, or Nd is a metal element that is strongly bonded to oxygen.

In the case where the oxide semiconductor film 39a is an In-M-Zn oxide film, the proportions of In and M when summation of In and M is assumed to be 100 atomic % are as follows: the atomic percentage of In is less than 50 atomic % and the atomic percentage of M is greater than or equal to 50 atomic %; or the atomic percentage of In is less than 25 atomic % and the atomic percentage of M is greater than or equal to 75 atomic %.

Further, in the case where each of the oxide semiconductor films 19a and 39a is an In-M-Zn oxide film (M represents Al, Ga, Y, Zr, La, Ce, or Nd), the proportion of M atoms (M represents Al, Ga, Y, Zr, La, Ce, or Nd) in the oxide semiconductor film 39a is higher than that in the oxide semiconductor film 19a. Typically, the proportion of M in the oxide semiconductor film 39a is 1.5 or more times, twice or more, or three or more times as high as that in the oxide semiconductor film 19a.

Furthermore, in the case where each of the oxide semiconductor films 19a and 39a is an In-M-Zn-based oxide film (M represents Al, Ga, Y, Zr, La, Ce, or Nd), when In:M:Zn=$x_1$:$y_1$:$z_1$ [atomic ratio] is satisfied in the oxide semiconductor film 39a and In:M:Zn=$x_2$:$y_2$:$z_2$ [atomic ratio] is satisfied in the oxide semiconductor film 19a, $y_1/x_1$ is higher than $y_2/x_2$, or $y_1/x_1$ be 1.5 or more times as high as $y_2/x_2$. Alternatively, $y_1/x_1$ be twice or more as high as $y_2/x_2$.

Further alternatively, $y_1/x_1$ be three or more times as high as $y_2/x_2$. In this case, it is preferable that in the oxide semiconductor film, $y_2$ be higher than or equal to $x_2$ because a transistor including the oxide semiconductor film can have stable electrical characteristics.

In the case where the oxide semiconductor film 19a is an In-M-Zn oxide film (M is Al, Ga, Y, Zr, La, Ce, or Nd) and a target having the atomic ratio of metal elements of In:M:Zn=$x_1$:$y_1$:$z_1$ is used for forming the oxide semiconductor film 19a, $x_1/y_1$ is preferably greater than or equal to ⅓ and less than or equal to 6, further preferably greater than or equal to 1 and less than or equal to 6, and $z_1/y_1$ is preferably greater than or equal to ⅓ and less than or equal to 6, further preferably greater than or equal to 1 and less than or equal to 6. Note that when $z_1/y_1$ is greater than or equal to 1 and less than or equal to 6, a CAAC-OS film to be described later as the oxide semiconductor film 19a is easily formed. Typical examples of the atomic ratio of the metal elements of the target are In:M:Zn=1:1:1, In:M:Zn=1:1:1.2, and In:M:Zn=3:1:2.

In the case where the oxide semiconductor film 39a is an In-M-Zn oxide film (M is Al, Ga, Y, Zr, La, Ce, or Nd) and a target having the atomic ratio of metal elements of In:M:Zn=$x_2$:$y_2$:$z_2$ is used for forming the oxide semiconductor film 39a, $x_2/y_2$ is preferably less than $x_1/y_1$, and $z_2/y_2$ is preferably greater than or equal to ⅓ and less than or equal to 6, further preferably greater than or equal to 1 and less than or equal to 6. Note that when $z_2/y_2$ is greater than or equal to 1 and less than or equal to 6, a CAAC-OS film to be described later as the oxide semiconductor film 39a is easily formed. Typical examples of the atomic ratio of the metal elements of the target are In:M:Zn=1:3:2, In:M:Zn=1:3:4, In:M:Zn=1:3:6, In:M:Zn=1:3:8, and the like.

Note that the proportion of each metal element in the atomic ratio of each of the oxide semiconductor films 19a and the oxide semiconductor film 39a varies within a range of ±40% of that in the above atomic ratio as an error.

The oxide semiconductor film 39a also serves as a film that relieves damage to the oxide semiconductor film 19a at the time of forming the oxide insulating film 25 later.

The thickness of the oxide semiconductor film 39a is greater than or equal to 3 nm and less than or equal to 100 nm, or greater than or equal to 3 nm and less than or equal to 50 nm.

The oxide semiconductor film 39a may have a non-single-crystal structure, for example, like the oxide semiconductor film 19a. The non-single crystal structure includes a CAAC-OS that is described later, a polycrystalline structure, a microcrystalline structure described later, or an amorphous structure, for example.

The oxide semiconductor film 39a may have an amorphous structure, for example. An amorphous oxide semiconductor film, for example, has disordered atomic arrangement and no crystalline component. Alternatively, an amorphous oxide film is, for example, absolutely amorphous and has no crystal part.

Note that the oxide semiconductor films 19a and 39a may each be a mixed film including two or more of the following: a region having an amorphous structure, a region having a microcrystalline structure, a region having a polycrystalline structure, a CAAC-OS region, and a region having a single-crystal structure. The mixed film has a single-layer structure including, for example, two or more of a region having an amorphous structure, a region having a microcrystalline structure, a region having a polycrystalline structure, a CAAC-OS region, and a region having a single-crystal structure in some cases. Further, in some cases, the mixed film has a stacked-layer structure in which two or more of the following regions are stacked: a region having an amorphous structure, a region having a microcrystalline structure, a region having a polycrystalline structure, a CAAC-OS region, and a region having a single-crystal structure.

Here, the oxide semiconductor film 39a is provided between the oxide semiconductor film 19a and the oxide insulating film 23. Hence, if trap states are formed between the oxide semiconductor film 39a and the oxide insulating film 23 owing to impurities and defects, electrons flowing in the oxide semiconductor film 19a are less likely to be captured by the trap states because there is a distance between the trap states and the oxide semiconductor film 19a. Accordingly, the amount of on-state current of the transistor can be increased, and the field-effect mobility can be increased. When the electrons are captured by the trap states, the electrons become negative fixed charges. As a result, a threshold voltage of the transistor varies. However, by the distance between the oxide semiconductor film 19a and the trap states, capture of the electrons by the trap states can be reduced, and accordingly change in the threshold voltage can be reduced.

Impurities from the outside can be blocked by the oxide semiconductor film 39a, and accordingly, the amount of impurities that are transferred from the outside to the oxide semiconductor film 19a can be reduced. Further, an oxygen vacancy is less likely to be formed in the oxide semiconductor film 39a. Consequently, the impurity concentration and the number of oxygen vacancies in the oxide semiconductor film 19a can be reduced.

Note that the oxide semiconductor films 19a and 39a are not formed by simply stacking each film, but are formed to form a continuous junction (here, in particular, a structure in which the energy of the bottom of the conduction band is changed continuously between each film). In other words, a stacked-layer structure in which there exist no impurity that forms a defect level such as a trap center or a recombination center at each interface is provided. If an impurity exists between the oxide semiconductor films 19a and 39a that are stacked, a continuity of the energy band is damaged, and the carrier is captured or recombined at the interface and then disappears.

In order to form such a continuous energy band, it is necessary to form films continuously without being exposed to the air, with use of a multi-chamber deposition apparatus (sputtering apparatus) including a load lock chamber. Each chamber in the sputtering apparatus is preferably evacuated to be a high vacuum state (to the degree of about $5 \times 10^{-7}$ Pa to $1 \times 10^{-4}$ Pa) with an adsorption vacuum evacuation pump such as a cryopump in order to remove water or the like, which serves as an impurity against the oxide semiconductor film, as much as possible. Alternatively, a turbo molecular pump and a cold trap are preferably combined so as to prevent a backflow of a gas, especially a gas containing carbon or hydrogen from an exhaust system to the inside of the chamber.

As in a transistor 102c in FIG. 18B, a multilayer film 38a may be provided instead of the multilayer film 37a.

In addition, as in a capacitor 105c in FIG. 18B, a multilayer film 38b may be provided instead of the multilayer film 37b.

The multilayer film 38a includes an oxide semiconductor film 49a, the oxide semiconductor film 19a, and the oxide semiconductor film 39a. That is, the multilayer film 38a has a three-layer structure. Further, the oxide semiconductor film 19a serves as a channel region.

Further, the oxide insulating film 17 and the oxide semiconductor film 49a are in contact with each other. That is, the oxide semiconductor film 49a is provided between the oxide insulating film 17 and the oxide semiconductor film 19a.

The multilayer film 38a and the oxide insulating film 23 are in contact with each other. In addition, the oxide semiconductor film 39a and the oxide insulating film 23 are in contact with each other. That is, the oxide semiconductor film 39a is provided between the oxide semiconductor film 19a and the oxide insulating film 23.

The oxide film 49a can be formed using a material and a formation method similar to those of the oxide semiconductor film 39a.

It is preferable that the thickness of the oxide film 49a be smaller than that of the oxide semiconductor film 19a. When the thickness of the oxide film 49a is greater than or equal to 1 nm and less than or equal to 5 nm, preferably greater than or equal to 1 nm and less than or equal to 3 nm, the amount of change in threshold voltage of the transistor can be reduced.

In the transistor described in this embodiment, the oxide semiconductor film 39a is provided between the oxide semiconductor film 19a and the oxide insulating film 23. Hence, if trap states are formed between the oxide semiconductor film 39a and the oxide insulating film 23 owing to impurities and defects, electrons flowing in the oxide semiconductor film 19a are less likely to be captured by the trap states because there is a distance between the trap states and the oxide semiconductor film 19a. Accordingly, the amount of on-state current of the transistor can be increased, and the field-effect mobility can be increased. When the electrons are captured by the trap states, the electrons become negative fixed charges. As a result, a threshold voltage of the transistor varies. However, by the distance between the oxide semiconductor film 19a and the trap states, capture of the electrons by the trap states can be reduced, and accordingly change in the threshold voltage can be reduced.

Impurities from the outside can be blocked by the oxide semiconductor film 39a, and accordingly, the amount of impurities that are transferred from the outside to the oxide semiconductor film 19a can be reduced. Further, an oxygen vacancy is less likely to be formed in the oxide semiconductor film 39a. Consequently, the impurity concentration and the number of oxygen vacancies in the oxide semiconductor film 19a can be reduced.

Further, the oxide film 49a is provided between the oxide insulating film 17 and the oxide semiconductor film 19a, and the oxide semiconductor film 39a is provided between the oxide semiconductor film 19a and the oxide insulating film 23. Thus, it is possible to reduce the concentration of silicon or carbon in the vicinity of the interface between the oxide semiconductor film 49a and the oxide semiconductor film 19a, the concentration of silicon or carbon in the oxide semiconductor film 19a, or the concentration of silicon or carbon in the vicinity of the interface between the oxide semiconductor film 39a and the oxide semiconductor film 19a. Consequently, in the multilayer film 38a, the absorption coefficient derived from a constant photocurrent method is lower than $1 \times 10^{-3}$/cm or lower than $1 \times 10^{-4}$/cm, and thus density of localized levels is extremely low.

The transistors 102b and 102c each having such a structure include very few defects in the multilayer film 38a including the oxide semiconductor film 32, thus, the electrical characteristics of these transistors can be improved, and typically, the on-state current can be increased and the field-effect mobility can be improved. Further, in a BT stress test and a BT photostress test that are examples of a stress test, the amount of change in threshold voltage is small, and thus, reliability is high.

<Band Structure of Transistor>

Next, band structures of the multilayer film 37a provided in the transistor 102b illustrated in FIG. 18A and the multilayer film 38a provided in the transistor 102c illustrated in FIG. 18B are described with reference to FIGS. 19A to 19C.

Here, for example, In—Ga—Zn oxide having an energy gap of 3.15 eV is used as the oxide semiconductor film 19a, and In—Ga—Zn oxide having an energy gap of 3.5 eV is used as the oxide semiconductor film 39a. The energy gaps can be measured using a spectroscopic ellipsometer (UT-300 manufactured by HORIBA JOBIN YVON SAS.).

The energy difference between the vacuum level and the top of the valence band (also called ionization potential) of the oxide semiconductor film 19a and the energy difference between the vacuum level and the top of the valence band of the oxide semiconductor film 39a are 8 eV and 8.2 eV, respectively. Note that the energy difference between the vacuum level and the valence band top can be measured using an ultraviolet photoelectron spectroscopy (UPS) device (VersaProbe manufactured by ULVAC-PHI, Inc.).

Thus, the energy difference between the vacuum level and the bottom of the conduction band (also called electron affinity) of the oxide semiconductor film 19a and the energy gap therebetween of the oxide semiconductor film 39a are 4.85 eV and 4.7 eV, respectively.

Figure 19A:
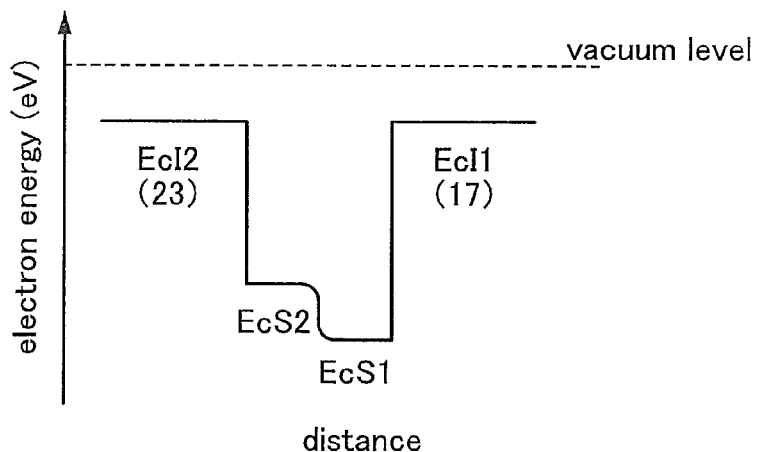
FIGS. 19A to 19C each illustrate a band structure of a transistor.

FIG. 19A schematically illustrates a part of the band structure of the multilayer film 37a. Here, the case where a silicon oxide film is provided in contact with the multilayer film 37a is described. In FIG. 19A, EcI1 denotes the energy of the bottom of the conduction band in the silicon oxide film; EcS1 denotes the energy of the bottom of the conduction band in the oxide semiconductor film 19a; EcS2 denotes the energy of the bottom of the conduction band in the oxide semiconductor film 39a; and EcI2 denotes the energy of the bottom of the conduction band in the silicon oxide film. Further, EcI1 and EcI2 correspond to the oxide insulating film 17 and the oxide insulating film 23 in FIG. 18B, respectively.

As illustrated in FIG. 19A, there is no energy barrier between the oxide semiconductor films 19a and 39a, and the energy level of the bottom of the conduction band gradually changes therebetween. In other words, the energy level of the bottom of the conduction band is continuously changed. This is because the multilayer film 37a contains an element contained in the oxide semiconductor film 19a and oxygen is transferred between the oxide semiconductor films 19a and 39a, so that a mixed layer is formed.

As shown in FIG. 19A, the oxide semiconductor film 19a in the multilayer film 37a serves as a well and a channel region of the transistor including the multilayer film 37a is formed in the oxide semiconductor film 19a. Note that since the energy of the bottom of the conduction band of the multilayer film 37a is continuously changed, it can be said that the oxide semiconductor films 19a and 39a are continuous.

Although trap states due to impurities or defects might be formed in the vicinity of the interface between the oxide semiconductor film 39a and the oxide insulating film 23 as shown in FIG. 19A, the oxide semiconductor film 19a can be distanced from the trap states owing to the existence of the oxide semiconductor film 39a. However, when the energy difference between EcS1 and EcS2 is small, an electron in the oxide semiconductor film 19a might reach the trap state across the energy difference. When the electron is captured by the trap state, a negative fixed charge is generated at the interface with the insulating film, whereby the threshold voltage of the transistor shifts in the positive direction. Therefore, it is preferable that the energy difference between EcS1 and EcS2 be 0.1 eV or more, more preferably 0.15 eV or more, because change in the threshold voltage of the transistor is reduced and stable electrical characteristics are obtained.

Figure 19B:
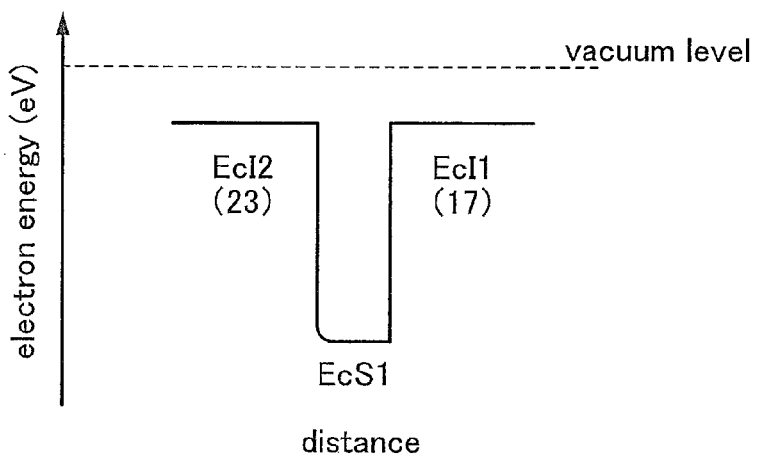

FIG. 19B schematically illustrates a part of the band structure of the multilayer film 37a, which is a variation of the band structure shown in FIG. 19A. Here, a structure where silicon oxide films are provided in contact with the multilayer film 37a is described. In FIG. 19B, EcI1 denotes the energy of the bottom of the conduction band in the silicon oxide film; EcS1 denotes the energy of the bottom of the conduction band in the oxide semiconductor film 19a; and EcI2 denotes the energy of the bottom of the conduction band in the silicon oxide film. Further, EcI1 and EcI2 correspond to the oxide insulating film 17 and the oxide insulating film 23 in FIG. 18B, respectively.

In the transistor illustrated in FIG. 18B, an upper portion of the multilayer film 37a, that is, the oxide semiconductor film 39a might be etched in formation of the conductive films 21a and 21b serving as a pair of electrodes. Further, a mixed layer of the oxide semiconductor films 19a and 39a is likely to be formed on the top surface of the oxide semiconductor film 19a in formation of the oxide semiconductor film 39a.

For example, when the oxide semiconductor film 19a is an oxide semiconductor film formed with use of, as a sputtering target, In—Ga—Zn oxide whose atomic ratio of In to Ga and Zn is 1:1:1 or In—Ga—Zn oxide whose atomic ratio of In to Ga and Zn is 3:1:2, and the oxide semiconductor film 39a is an oxide film formed with use of, as a sputtering target, In—Ga—Zn oxide whose atomic ratio of In to Ga and Zn is 1:3:2, In—Ga—Zn oxide whose atomic ratio of In to Ga and Zn is 1:3:4, or In—Ga—Zn oxide whose atomic ratio of In to Ga and Zn is 1:3:6, the Ga content in oxide semiconductor film 39a is higher than that in the oxide semiconductor film 19a. Thus, a GaOx layer or a mixed layer whose Ga content is higher than that in the oxide semiconductor film 19a can be formed on the top surface of the oxide semiconductor film 19a.

For that reason, even in the case where oxide semiconductor film 39a is etched, the energy of the bottom of the conduction band of EcS1 on the EcI2 side is increased and the band structure shown in FIG. 19B can be obtained in some cases.

As in the band structure shown in FIG. 19B, in observation of a cross section of a channel region, only the oxide semiconductor film 19a in the multilayer film 37a is apparently observed in some cases. However, a mixed layer that contains Ga more than the oxide semiconductor film 19a does is formed over the oxide semiconductor film 19a in fact, and thus the mixed layer can be regarded as a 1.5-th layer. Note that the mixed layer can be confirmed by analyzing a composition in the upper portion of the oxide semiconductor film 19a, when the elements contained in the multilayer film 37a are measured by an EDX analysis, for example. The mixed layer can be confirmed, for example, in such a manner that the Ga content in the composition in the upper portion of the oxide semiconductor film 19a is larger than the Ga content in the oxide semiconductor film 19a.

Figure 19C:
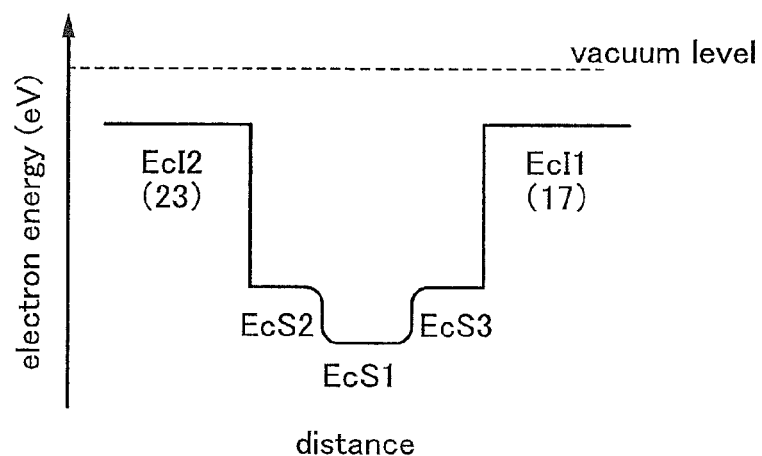

FIG. 19C schematically illustrates a part of the band structure of the multilayer film 38a. Here, the case where silicon oxide films are provided in contact with the multilayer film 38a is described. In FIG. 19C, EcI1 denotes the energy of the bottom of the conduction band in the silicon oxide film; EcS1 denotes the energy of the bottom of the conduction band in the oxide semiconductor film 19a; EcS2 denotes the energy of the bottom of the conduction oxide semiconductor film 39a; EcS3 denotes the energy of the bottom of the conduction oxide semiconductor film 49a; and EcI2 denotes the energy of the bottom of the conduction band in the silicon oxide film. Further, EcI1 and EcI2 correspond to the oxide insulating film 17 and the oxide insulating film 23 in FIG. 18B, respectively.

As illustrated in FIG. 19C, there is no energy barrier between the oxide semiconductor films 49a, 19a, and 39a, and the energy level of the bottom of the conduction band gradually changes therebetween. In other words, the energy level of the bottom of the conduction band is continuously changed. This is because the multilayer film 38a contains an element contained in the oxide semiconductor film 19a and oxygen is transferred between the oxide semiconductor films 19a and 49a and between the oxide semiconductor films 19a and 39a, so that a mixed layer is formed.

As shown in FIG. 19C, the oxide semiconductor film 19a in the multilayer film 38a serves as a well and a channel region of the transistor including the multilayer film 38a is formed in the oxide semiconductor film 19a. Note that since the energy of the bottom of the conduction band of the multilayer film 38a is continuously changed, it can be said that the oxide semiconductor films 49a, 19a, and 39a are continuous.

Although, in the case where the oxide insulating film 17, the oxide semiconductor film 19a, and the oxide insulating film 23 are stacked in this order, trap states due to impurities or defects might be formed in the vicinity of the interface between the oxide semiconductor film 19a and the oxide insulating film 23 and in the vicinity of the interface between the oxide semiconductor film 19a and the oxide insulating film 17, as illustrated in FIG. 19C, the oxide semiconductor film 19a can be distanced from the trap states owing to the existence of the oxide semiconductor films 39a and 49a. However, when the energy difference between EcS1 and EcS2 and the energy difference between EcS1 and EcS3 are small, electrons in the oxide semiconductor film 19a might reach the trap state across the energy difference. When the electrons are captured by the trap state, a negative fixed charge is generated at the interface with the oxide insulating film, whereby the threshold voltage of the transistor shifts in the positive direction. Therefore, it is preferable that the energy difference between EcS1 and EcS2 and the energy difference between EcS1 and EcS3 be 0.1 eV or more, more preferably 0.15 eV or more, because change in the threshold voltage of the transistor is reduced and stable electrical characteristics are obtained.

Note that the structures, methods, and the like described in this embodiment can be used as appropriate in combination with any of the structures, methods, and the like described in the other embodiments.

Embodiment 7

In this embodiment, one embodiment that can be applied to an oxide semiconductor film in the transistor included in the semiconductor device described in the above embodiment is described.

The oxide semiconductor film may include one or more of the following: an oxide semiconductor having a single-crystal structure (hereinafter referred to as a single-crystal oxide semiconductor); an oxide semiconductor having a polycrystalline structure (hereinafter referred to as a polycrystalline oxide semiconductor); an oxide semiconductor having a microcrystalline structure (hereinafter referred to as a microcrystalline oxide semiconductor), and an oxide semiconductor having an amorphous structure (hereinafter referred to as an amorphous oxide semiconductor). Further, the oxide semiconductor film may be formed of a CAAC-OS film. Furthermore, the oxide semiconductor film may include an amorphous oxide semiconductor and an oxide semiconductor having a crystal grain. Described below are the single-crystal oxide semiconductor, the CAAC-OS, the polycrystalline oxide semiconductor, the microcrystalline oxide semiconductor, and the amorphous oxide semiconductor.

<Single Crystal Oxide Semiconductor>

The single-crystal oxide semiconductor film has a lower impurity concentration and a lower density of defect states (few oxygen vacancies). Thus, the carrier density can be decreased. Accordingly, a transistor including the single-crystal oxide semiconductor film is unlikely to be normally on. Moreover, since the single-crystal oxide semiconductor film has a lower impurity concentration and a lower density of defect states, carrier traps might be reduced. Thus, the transistor including the single-crystal oxide semiconductor film has small variation in electrical characteristics and accordingly has high reliability.

Note that when the oxide semiconductor film has few defects, the density thereof is increased. When the oxide semiconductor film has high crystallinity, the density thereof is increased. When the oxide semiconductor film has a lower concentration of impurities such as hydrogen, the density thereof is increased. The single-crystal oxide semiconductor film has a higher density than the CAAC-OS film. The CAAC-OS film has a higher density than the microcrystalline oxide semiconductor film. The polycrystalline oxide semiconductor film has a higher density than the microcrystalline oxide semiconductor film. The microcrystalline oxide semiconductor film has a higher density than the amorphous oxide semiconductor film.

<CAAC-OS>

The CAAC-OS film is one of oxide semiconductor films having a plurality of crystal parts. The crystal parts included in the CAAC-OS film each have c-axis alignment. In a plan TEM image, the area of the crystal parts included in the CAAC-OS film is greater than or equal to 2500 nm$^2$, greater than or equal to 5 $\mu$m$^2$, or greater than or equal to 1000 $\mu$m$^2$. Further, in a cross-sectional TEM image, when the proportion of the crystal parts is greater than or equal to 50%, greater than or equal to 80%, or greater than or equal to 95% of the CAAC oxide film, the CAAC oxide film is a thin film having physical properties similar to those of a single crystal.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to the TEM image of the CAAC-OS film observed in a direction substantially parallel to a sample surface (cross-sectional TEM image), metal atoms are arranged in a layered manner in the crystal parts. Each metal atom layer has a morphology reflected by a surface over which the CAAC-OS film is formed (hereinafter, a surface over which the CAAC-OS film is formed is referred to as a formation surface) or the top surface of the CAAC-OS film, and is arranged in parallel to the formation surface or the top surface of the CAAC-OS film. In this specification, a term "parallel" indicates that the angle formed between two straight lines is greater than or equal to −10° and less than or equal to 10°, and accordingly also includes the case where the angle is greater than or equal to −5° and less than or equal to 5°. In addition, a term "perpendicular" indicates that the angle formed between two straight lines is greater than or equal to 80° and less than or equal to 100°, and accordingly includes the case where the angle is greater than or equal to 85° and less than or equal to 95°.

On the other hand, according to the TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

Note that in an electron diffraction pattern of the CAAC-OS film, spots (luminescent spots) having alignment are shown.

From the results of the cross-sectional TEM image and the plan TEM image, alignment is found in the crystal parts in the CAAC-OS film.

A CAAC-OS film is subjected to structural analysis with an X-ray diffraction (XRD) apparatus. When the CAAC-OS film is analyzed by an out-of-plane method, a peak appears frequently when the diffraction angle (2θ) is around 31°. This peak is derived from the (00x) plane (x is an integer) of the InGaZn oxide crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the InGaZn oxide crystal. Here, analysis (φ scan) is performed under conditions where the sample is rotated around a normal vector of a sample surface as an axis (φ axis) with 2θ fixed at around 56°. In the case where the sample is a single-crystal oxide semiconductor film of InGaZn oxide, six peaks appear. The six peaks are derived from crystal planes equivalent to the (110) plane. On the other hand, in the case of a CAAC-OS film, a peak is not clearly observed even when φ scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal is formed concurrently with deposition of the CAAC-OS film or is formed through crystallization treatment such as heat treatment. As described above, the c-axis of the crystal is aligned with a direction parallel to a normal vector of a formation surface or a normal vector of a top surface. Thus, for example, in the case where a shape of the CAAC-OS film is changed by etching or the like, the c-axis might not be necessarily parallel to a normal vector of a formation surface or a normal vector of the top surface of the CAAC-OS film.

Further, the degree of crystallinity in the CAAC-OS film is not necessarily uniform. For example, in the case where crystal growth leading to the CAAC-OS film occurs from the vicinity of the top surface of the film, the degree of the crystallinity in the vicinity of the top surface is higher than that in the vicinity of the formation surface in some cases. Furthermore, when an impurity is added to the CAAC-OS film, the crystallinity in a region to which the impurity is added is changed, and the degree of crystallinity in the CAAC-OS film varies depending on regions.

Note that when the CAAC-OS film is analyzed by an out-of-plane method, a peak of $2\theta$ may also be observed at around 36°, in addition to the peak of $2\theta$ at around 31°. The peak of $2\theta$ at around 36° indicates that a crystal part having no c-axis alignment is included in part of the CAAC-OS film. It is preferable that in the CAAC-OS film, a peak of $2\theta$ appear at around 31° and a peak of $2\theta$ do not appear at around 36°.

The CAAC-OS film is an oxide semiconductor film having low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which impurity concentration is low and density of defect states is low (the number of oxygen vacancies is small) is referred to as a "highly purified intrinsic" or "highly purified substantially intrinsic" state. A highly purified intrinsic or highly purified substantially intrinsic oxide semiconductor film has few carrier generation sources, and thus can have a low carrier density. Thus, a transistor including the oxide semiconductor film rarely has negative threshold voltage (is rarely normally on). The highly purified intrinsic or highly purified substantially intrinsic oxide semiconductor film has a low density of defect states, and thus has few carrier traps. Accordingly, the transistor including the oxide semiconductor film has little variation in electrical characteristics and high reliability. Charges trapped by the carrier traps in the oxide semiconductor film take a long time to be released, and might behave like fixed charges. Thus, the transistor that includes the oxide semiconductor film having high impurity concentration and a high density of defect states has unstable electrical characteristics in some cases.

With the use of the CAAC-OS film in a transistor, variation in the electrical characteristics of the transistor due to irradiation with visible light or ultraviolet light is small.

<Polycrystalline Oxide Semiconductor>

In an image obtained with a TEM, for example, crystal grains can be found in the polycrystalline oxide semiconductor film. In most cases, the size of a crystal grain in the polycrystalline oxide semiconductor film is greater than or equal to 2 nm and less than or equal to 300 nm, greater than or equal to 3 nm and less than or equal to 100 nm, or greater than or equal to 5 nm and less than or equal to 50 nm in an image obtained with the TEM, for example. Moreover, in an image obtained with the TEM, a boundary between crystals can be found in the polycrystalline oxide semiconductor film in some cases.

The polycrystalline oxide semiconductor film may include a plurality of crystal grains, and alignment of crystals may be different in the plurality of crystal grains. When a polycrystalline oxide semiconductor film is analyzed by an out-of-plane method with use of an XRD apparatus, a single peak or a plurality of peaks appear in some cases. For example, in the case of a polycrystalline IGZO film, a peak at $2\theta$ of around 31° that shows alignment or plural peaks that show plural kinds of alignment appear in some cases.

The polycrystalline oxide semiconductor film has high crystallinity and thus has high electron mobility in some cases. Accordingly, a transistor including the polycrystalline oxide semiconductor film has high field-effect mobility. Note that there are cases in which an impurity is segregated at the grain boundary in the polycrystalline oxide semiconductor film. Moreover, the grain boundary of the polycrystalline oxide semiconductor film serves as a defect state. Since the grain boundary of the polycrystalline oxide semiconductor film may serve as a carrier generation source or a trap state, a transistor including the polycrystalline oxide semiconductor film has larger variation in electrical characteristics and lower reliability than a transistor including a CAAC-OS film in some cases.

<Microcrystalline Oxide Semiconductor>

In an image obtained with the TEM, crystal parts cannot be found clearly in the microcrystalline oxide semiconductor in some cases. In most cases, a crystal part in the microcrystalline oxide semiconductor is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm is specifically referred to as nanocrystal (nc). An oxide semiconductor film including nanocrystal is referred to as an nc-OS (nanocrystalline oxide semiconductor) film. In an image obtained with TEM, a crystal grain cannot be found clearly in the nc-OS film in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. However, there is no regularity of crystal orientation between different crystal parts in the nc-OS film; thus, the orientation of the whole film is not observed. Accordingly, in some cases, the nc-OS film cannot be distinguished from an amorphous oxide semiconductor depending on an analysis method. For example, when the nc-OS film is subjected to structural analysis by an out-of-plane method with an XRD apparatus using an X-ray having a diameter larger than the diameter of a crystal part, a peak that shows a crystal plane does not appear. Further, a halo pattern is shown in an electron diffraction pattern (also referred to as a selected-area electron diffraction pattern) of the nc-OS film obtained by using an electron beam having a probe diameter (e.g., larger than or equal to 50 nm) larger than the diameter of a crystal part. Meanwhile, spots are shown in a nanobeam electron diffraction pattern of the nc-OS film obtained by using an electron beam having a probe diameter (e.g., larger than or equal to 1 nm and smaller than or equal to 30 nm) close to, or smaller than or equal to the diameter of a crystal part. Furthermore, in a nanobeam electron diffraction pattern of the nc-OS film, regions with high luminance in a circular (ring) pattern are observed in some cases. Also in a nanobeam electron diffraction pattern of the nc-OS film, a plurality of spots are shown in a ring-like region in some cases.

Figure 20:
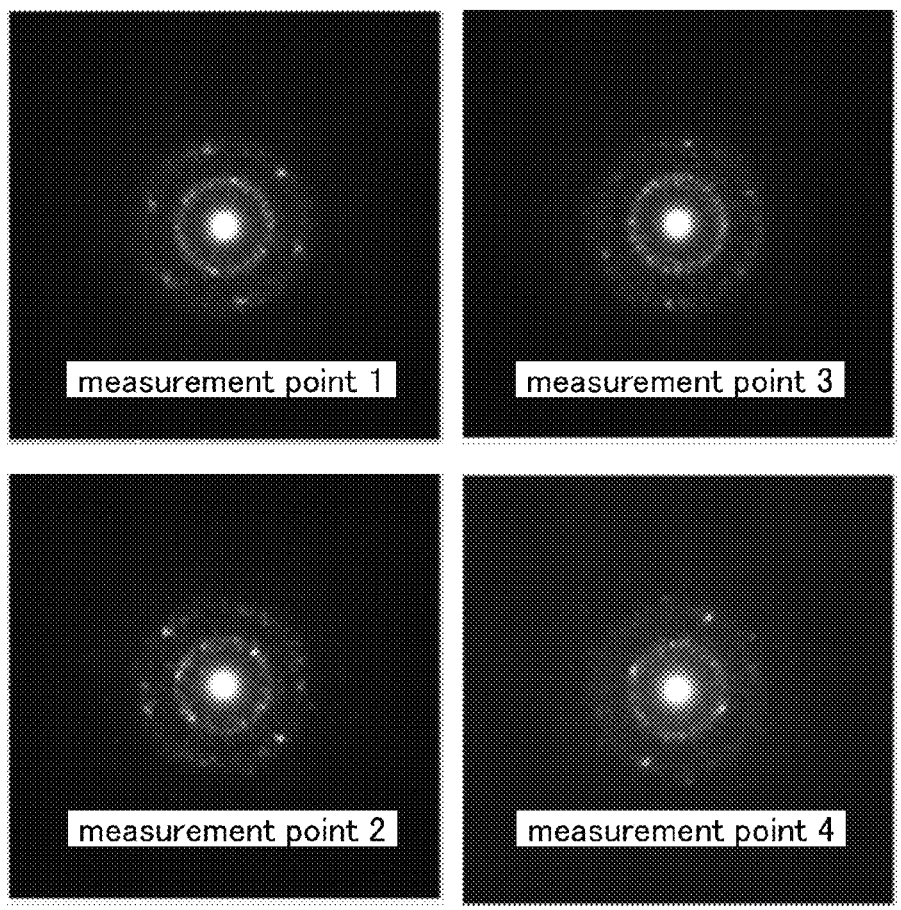
FIG. 20 shows nanobeam electron diffraction patterns of an oxide semiconductor.

FIG. 20 shows an example of nanobeam electron diffraction performed on a sample including an nc-OS film. The measurement position is changed. Here, the sample is cut in the direction perpendicular to a surface where an nc-OS film is formed and the thickness thereof is reduced to be less than or equal to 10 nm. Further, an electron beam with a diameter of 1 nm enters from the direction perpendicular to the cut surface of the sample. FIG. 20 shows that, when a nanobeam electron diffraction is performed on the sample including the nc-OS film, a diffraction pattern exhibiting a crystal plane is obtained, but orientation along a crystal plane in a particular direction is not observed.

Since the nc-OS film is an oxide semiconductor film having more regularity than the amorphous oxide semiconductor film, the nc-OS film has a lower density of defect states than the amorphous oxide semiconductor film. However, there is no regularity of crystal orientation between different crystal parts in the nc-OS film; hence, the nc-OS film has a higher density of defect states than the CAAC-OS film.

Note that the structures, methods, and the like described in this embodiment can be used as appropriate in combination with any of the structures, methods, and the like described in the other embodiments.

Embodiment 8

In the method for manufacturing any of the transistors described in the above embodiments, after the conductive films 21a and 21b serving as a pair of electrodes are formed, the oxide semiconductor film 19a may be exposed to plasma generated in an oxidizing atmosphere, so that oxygen may be supplied to the oxide semiconductor film 19a. Atmospheres of oxygen, ozone, dinitrogen monoxide, nitrogen dioxide, and the like can be given as examples of oxidizing atmospheres. Further, in the plasma treatment, the oxide semiconductor film 19a is preferably exposed to plasma generated with no bias applied to the substrate 11 side. Consequently, the oxide semiconductor film 19a can be supplied with oxygen without being damaged; accordingly, the number of oxygen vacancies in the oxide semiconductor film 19a can be reduced. Moreover, impurities, e.g., halogen such as fluorine or chlorine remaining on a surface of the oxide semiconductor film 19a due to the etching treatment can be removed. The plasma treatment is preferably performed while heating is performed at a temperature higher than or equal to 300° C. Oxygen in the plasma is bonded to hydrogen contained in the oxide semiconductor film 19a to form water. Since the substrate is heated, the water is released from the oxide semiconductor film 19a. Consequently, the amount of hydrogen and water in the oxide semiconductor film 19a can be reduced.

Note that the structures, methods, and the like described in this embodiment can be used as appropriate in combination with any of the structures, methods, and the like described in the other embodiments.

Embodiment 9

Although the oxide semiconductor films that are described in the above embodiments can be formed by a sputtering method, such films may be formed by another method, e.g., a thermal CVD method. A metal organic chemical vapor deposition (MOCVD) method or an atomic layer deposition (ALD) method may be employed as an example of a thermal CVD method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time, the pressure in a chamber is set to an atmospheric pressure or a reduced pressure, and reaction is caused in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on a surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the metal film, the oxide semiconductor film, and the inorganic insulating film that are described in the above embodiment can be formed by a thermal CVD method such as a MOCVD method or an ALD method. For example, in the case where an In—Ga—Zn—O film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where an oxide semiconductor film, e.g., an In—Ga—Zn—O film is formed using a deposition apparatus employing ALD, an $In(CH_3)_3$ gas and an $O_3$ gas are sequentially introduced plural times to form an In—O layer, a $Ga(CH_3)_3$ gas and an $O_3$ gas are introduced at a time to form a GaO layer, and then a $Zn(CH_3)_2$ gas and an $O_3$ gas are introduced at a time to form a ZnO layer. Note that the order of these layers is not limited to this example.

A mixed compound layer such as an In—Ga—O layer, an In—Zn—O layer or a Ga—Zn—O layer may be formed by mixing of these gases. Note that although an H$_2$O gas that is obtained by bubbling with an inert gas such as Ar may be used instead of an O$_3$ gas, it is preferable to use an O$_3$ gas, which does not contain H. Further, instead of an In(CH$_3$)$_3$ gas, an In(C$_2$H$_5$)$_3$ gas may be used. Instead of a Ga(CH$_3$)$_3$ gas, a Ga(C$_2$H$_5$)$_3$ gas may be used. Instead of an In(CH$_3$)$_3$ gas, an In(C$_2$H$_5$)$_3$ gas may be used. Furthermore, a Zn(CH$_3$)$_2$ gas may be used.

Note that the structures, methods, and the like described in this embodiment can be used as appropriate in combination with any of the structures, methods, and the like described in the other embodiments.

Embodiment 10

A semiconductor device (also referred to as a display device) having a display function can be manufactured using the transistor examples of which are shown in the above embodiments. Moreover, some or all of the driver circuits that include the transistor can be formed over a substrate where the pixel portion is formed, whereby a system-on-panel can be obtained. In this embodiment, an example of a display device using the transistor examples of which are shown in the above embodiments is described with reference to FIGS. 21A to 21C and FIGS. 22A and 22B. FIGS. 22A and 22B are cross-sectional views illustrating cross-sectional structures taken along dashed-dotted line M-N in FIG. 21B.

Figure 21A:
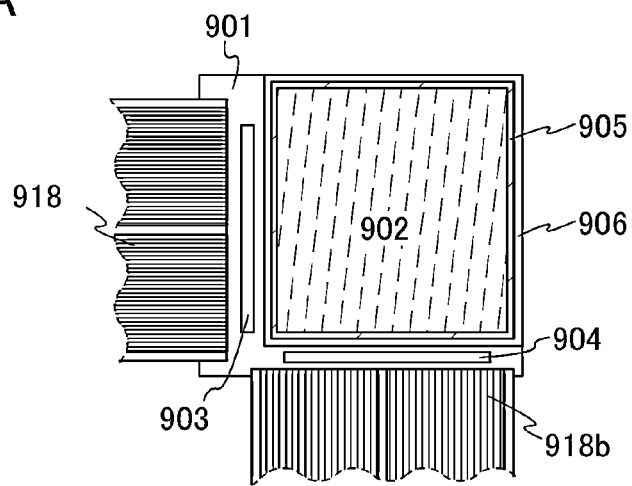
FIGS. 21A to 21C are top views each illustrating one embodiment of a semiconductor device.
Figure 22A:
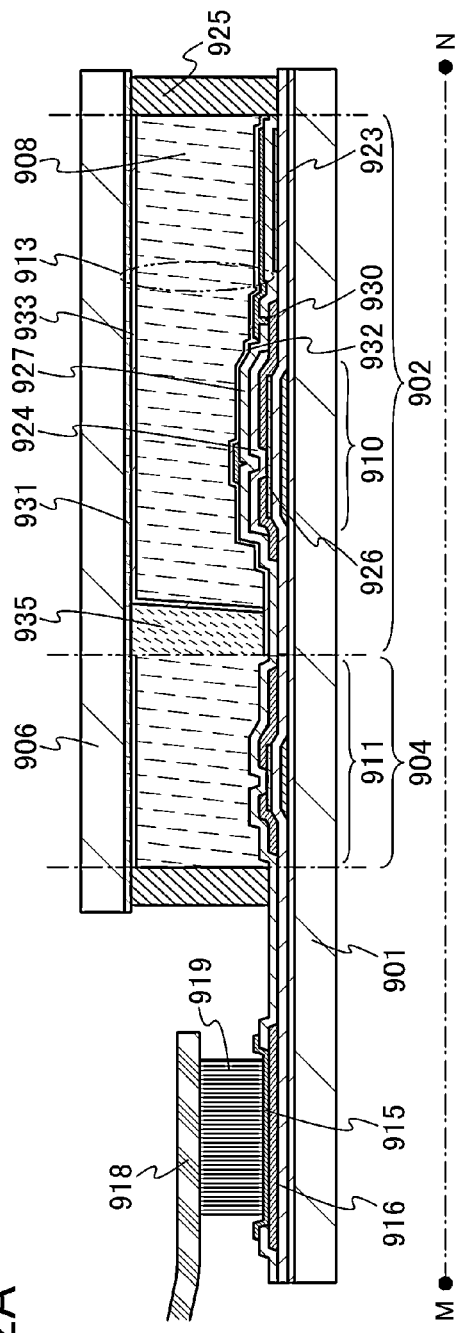
FIGS. 22A and 22B are cross-sectionals views each illustrating one embodiment of a semiconductor device.
Figure 22B:
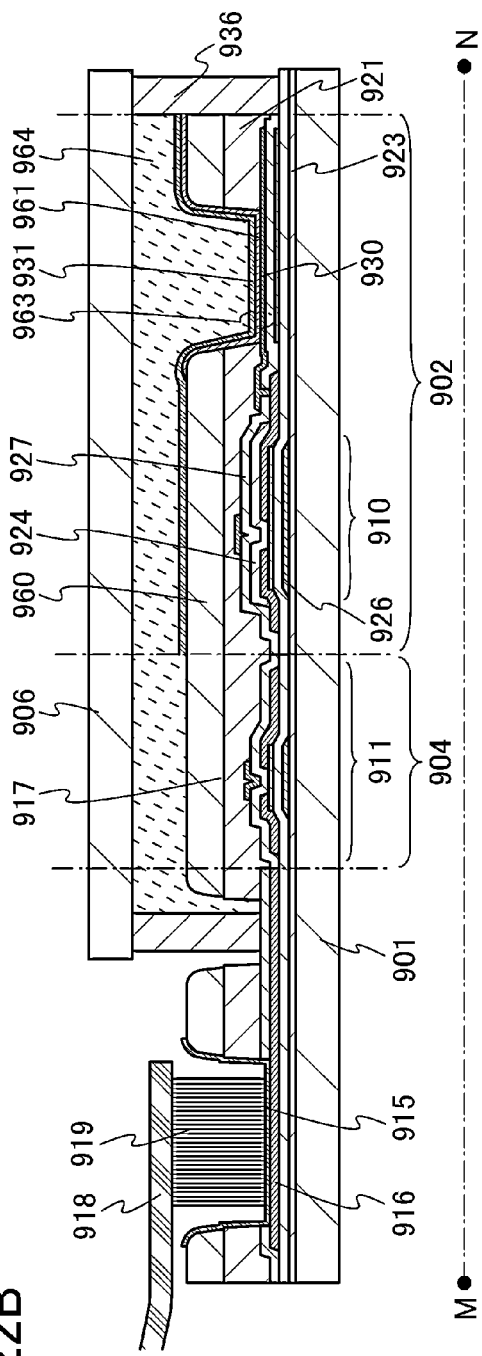

In FIG. 21A, a sealant 905 is provided so as to surround a pixel portion 902 provided over a first substrate 901, and the pixel portion 902 is sealed with a second substrate 906. In FIG. 21A, a signal line driver circuit 903 and a scan line driver circuit 904 each are formed using a single crystal semiconductor or a polycrystalline semiconductor over a substrate prepared separately, and mounted in a region different from the region surrounded by the sealant 905 over the first substrate 901. Further, various signals and potentials are supplied to the signal line driver circuit 903, the scan line driver circuit 904, and the pixel portion 902 from a flexible printed circuit (FPC) 918.

Figure 21B:
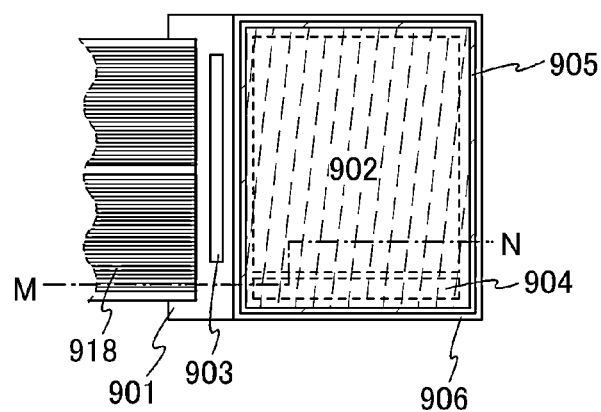
Figure 21C:
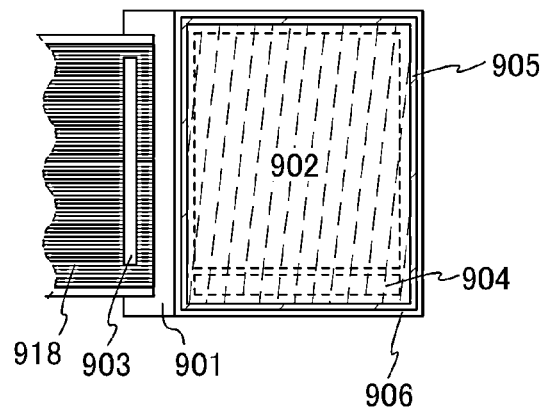

In FIGS. 21B and 21C, the sealant 905 is provided so as to surround the pixel portion 902 and the scan line driver circuit 904 that are provided over the first substrate 901. The second substrate 906 is provided over the pixel portion 902 and the scan line driver circuit 904. Thus, the pixel portion 902 and the scan line driver circuit 904 are sealed together with a display element by the first substrate 901, the sealant 905, and the second substrate 906. In FIGS. 21B and 21C, a signal line driver circuit 903 that is formed using a single crystal semiconductor or a polycrystalline semiconductor over a substrate separately prepared is mounted in a region different from the region surrounded by the sealant 905 over the first substrate 901. In FIGS. 21B and 21C, various signals and potentials are supplied to the signal line driver circuit 903, the scan line driver circuit 904, and the pixel portion 902 from an FPC 918.

Although FIGS. 21B and 21C each show an example in which the signal line driver circuit 903 is formed separately and mounted on the first substrate 901, one embodiment of the present invention is not limited to this structure. The scan line driver circuit may be separately formed and then mounted, or only part of the signal line driver circuit or part of the scan line driver circuit may be separately formed and then mounted.

Note that a connection method of a separately formed driver circuit is not particularly limited, and a chip on glass (COG) method, a wire bonding method, a tape automated bonding (TAB) method, or the like can be used. FIG. 21A shows an example in which the signal line driver circuit 903 and the scan line driver circuit 904 are mounted by a COG method. FIG. 21B shows an example in which the signal line driver circuit 903 is mounted by a COG method. FIG. 21C shows an example in which the signal line driver circuit 903 is mounted by a TAB method.

The display device includes in its category a panel in which a display element is sealed and a module in which an IC including a controller or the like is mounted on the panel.

A display device in this specification refers to an image display device or a display device. Further, the display device also includes the following modules in its category: a module to which a connector such as an FPC or a TCP is attached; a module having a TCP at the tip of which a printed wiring board is provided; and a module in which an integrated circuit (IC) is directly mounted on a display element by a COG method.

The pixel portion and the scan line driver circuit provided over the first substrate include a plurality of transistors and any of the transistors that are described in the above embodiments can be used. Any of the transistors described in the above embodiments can be applied to a buffer circuit included in the scan line driver circuit.

As the display element provided in the display device, a liquid crystal element (also referred to as a liquid crystal display element) or a light-emitting element (also referred to as a light-emitting display element) can be used. A light emitting element includes, in its scope, an element whose luminance is controlled by current or voltage, and specifically includes an inorganic electroluminescent (EL) element, an organic EL element, and the like. Further, a display medium whose contrast is changed by an electric effect, such as electronic ink, can be used. FIG. 22A illustrates an example of a liquid crystal display device using a liquid crystal element as the display element and FIG. 22B illustrates an example of a light-emitting display device using a light-emitting element as the display element.

As illustrated in FIGS. 22A and 22B, the display device includes a connection terminal electrode 915 and a terminal electrode 916. The connection terminal electrode 915 and the terminal electrode 916 are electrically connected to a terminal included in the FPC 918 through an anisotropic conductive agent 919.

The connection terminal electrode 915 is formed using the same conductive film as a first electrode 930, and the terminal electrode 916 is formed using the same conductive film as a pair of electrodes in each of a transistor 910 and a transistor 911.

Each of the pixel portion 902 and the scan line driver circuit 904 that are provided over the first substrate 901 includes a plurality of transistors. FIGS. 22A and 22B illustrate the transistor 910 included in the pixel portion 902 and the transistor 911 included in the scan line driver circuit 904. In FIG. 22A, an oxide insulating film 924 is provided over each of the transistors 910 and 911, and an oxygen barrier film 927 is provided over the oxide insulating film 924, and in FIG. 22B, a planarization film 921 is further provided over the oxygen barrier film 927.

In this embodiment, any of the transistors described in the above embodiments can be used as the transistors 910 and 911 as appropriate. By using any of the transistors described in the above embodiments as the transistors 910 and 911, a display device with high image quality can be fabricated.

Moreover, FIG. 22B shows an example in which a conductive film 917 is provided over the oxygen barrier film 927 so as to overlap a channel region of an oxide semiconductor film 926 of the transistor 911 for the driver circuit. In this embodiment, the conductive film 917 is formed using the conductive film that is used as the first electrode 930. By providing the conductive film 917 so as to overlap the channel region of the oxide semiconductor film, the amount of change in the threshold voltage of the transistor 911 between before and after a BT stress test can be further reduced. The conductive film 917 may have the same potential as or a potential different from that of the gate electrode of the transistor 911, and the conductive film 917 can serve as a second gate electrode. The potential of the conductive film 917 may be GND, 0 V, in a floating state, or the same potential or substantially the same potential as the minimum potential (Vss; for example, the potential of the source electrode in the case where the potential of the source electrode is a reference potential) of the driver circuit.

In addition, the conductive film 917 has a function of blocking an external electric field. In other words, the conductive film 917 has a function of preventing an external electric field (particularly, a function of preventing static electricity) from affecting the inside (a circuit portion including the transistor). Such a blocking function of the conductive film 917 can prevent change in electrical characteristics of the transistor due to the influence of an external electric field such as static electricity. The conductive film 917 can be used for any of the transistors described in the above embodiments.

In the display panel, the transistor 910 included in the pixel portion 902 is electrically connected to a display element. There is no particular limitation on the kind of the display element as long as display can be performed, and various kinds of display elements can be used.

In FIG. 22A, a liquid crystal element 913 that is a display element includes the first electrode 930, a second electrode 931, and a liquid crystal layer 908. Note that an insulating film 932 and an insulating film 933 that serve as alignment films are provided so that the liquid crystal layer 908 is provided therebetween. The second electrode 931 is provided on the second substrate 906 side. The second electrode 931 overlaps the first electrode 930 with the liquid crystal layer 908 provided therebetween.

A spacer 935 is a columnar spacer obtained by selective etching of an insulating film and is provided in order to control the distance between the first electrode 930 and the second electrode 931 (a cell gap). Alternatively, a spherical spacer may be used.

Alternatively, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is raised. Since the blue phase appears only in a narrow temperature range, a liquid crystal composition in which a chiral material is mixed is used for the liquid crystal layer in order to improve the temperature range. The liquid crystal composition that includes a liquid crystal showing a blue phase and a chiral material has a short response time of 1 msec or less, and has optical isotropy, which makes the alignment process unneeded and viewing angle dependence small. In addition, since an alignment film does not need to be provided and rubbing treatment is unnecessary, electrostatic discharge damage caused by the rubbing treatment can be prevented and defects and damage of the liquid crystal display device in the manufacturing process can be reduced. Thus, the productivity of the liquid crystal display device can be increased.

The first substrate 901 and the second substrate 906 are fixed in place by a sealant 925. As the sealant 925, an organic resin such as a thermosetting resin or a photocurable resin can be used.

Further, the transistor including an oxide semiconductor film used in the above embodiments has excellent switching characteristics. Furthermore, relatively high field-effect mobility is obtained, which enables high-speed operation. Consequently, when the above transistor is used in a pixel portion of a semiconductor device having a display function, high-quality images can be obtained. Since a driver circuit portion and the pixel portion can be formed over one substrate with the use of the above transistor, the number of components of the semiconductor device can be reduced.

The size of storage capacitor formed in the liquid crystal display device is set considering the leakage current of the transistor provided in the pixel portion or the like so that charges can be held for a predetermined period. By using the transistor including the highly-purified oxide semiconductor film, it is enough to provide a storage capacitor having a capacitance that is ⅓ or less, or ⅕ or less of a liquid crystal capacitance of each pixel; therefore, the aperture ratio of a pixel can be increased.

In the display device, a black matrix (a light-blocking film), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

As a display method in the pixel portion, a progressive method, an interlace method, or the like can be used. Further, color elements controlled in a pixel at the time of color display are not limited to three colors: R, G, and B (R, G, and B correspond to red, green, and blue, respectively). For example, R, G, B, and W (W corresponds to white), or R, G, B, and one or more of yellow, cyan, magenta, and the like can be used. Further, the sizes of display regions may be different between respective dots of color elements. One embodiment of the present invention is not limited to the application to a display device for color display but can also be applied to a display device for monochrome display.

In FIG. 22B, a light-emitting element 963 that is a display element is electrically connected to the transistor 910 provided in the pixel portion 902. Note that although the structure of the light-emitting element 963 is a stacked-layer structure of the first electrode 930, a light-emitting layer 961, and the second electrode 931, the structure is not limited thereto. The structure of the light-emitting element 963 can be changed as appropriate depending on the direction in which light is extracted from the light-emitting element 963, or the like.

A partition wall 960 can be formed using an organic insulating material or an inorganic insulating material. It is particularly preferable that the partition wall 960 be formed using a photosensitive resin material to have an opening over the first electrode 930 so that a sidewall of the opening has an inclined surface with a continuous curvature.

The light-emitting layer 961 may be formed to have a single-layer structure or a stacked-layer structure including a plurality of layers.

A protective film may be formed over the second electrode 931 and the partition wall 960 in order to prevent oxygen, hydrogen, moisture, carbon dioxide, or the like from entering the light-emitting element 963. As the protective film, a silicon nitride film, a silicon nitride oxide film, an aluminum oxide film, an aluminum nitride film, an aluminum oxynitride film, an aluminum nitride oxide film, a DLC film, or the like can be formed. In addition, in a space that is sealed with the first substrate 901, the second substrate 906, and a sealant 936, a filler 964 is provided and sealed. It is preferable that, in this manner, the light-emitting element be packaged (sealed) with a protective film (such as a laminate film or an ultraviolet curable resin film) or a cover material with high air-tightness and little degasification so that the panel is not exposed to the outside air.

As the sealant 936, an organic resin such as a thermosetting resin or a photocurable resin, fritted glass including low-melting glass, or the like can be used. The fritted glass is preferable because of its high barrier property against impurities such as water and oxygen. Further, in the case where the fitted glass is used as the sealant 936, as illustrated in FIG. 22B, the fritted glass is provided over the oxide insulating film 924, whereby adhesion of the oxide insulating film 924 to the fritted glass becomes high, which is preferable.

As the filler 964, as well as an inert gas such as nitrogen or argon, an ultraviolet curable resin or a thermosetting resin can be used: polyvinyl chloride (PVC), an acrylic resin, polyimide, an epoxy resin, a silicone resin, polyvinyl butyral (PVB), ethylene vinyl acetate (EVA), or the like can be used. For example, nitrogen is used for the filler.

If necessary, an optical film such as a polarizing plate, a circularly polarizing plate (including an elliptically polarizing plate), a retardation plate (a quarter-wave plate or a half-wave plate), or a color filter may be provided as appropriate for a light-emitting surface of the light-emitting element. Further, a polarizing plate or a circularly polarizing plate may be provided with an anti-reflection film. For example, anti-glare treatment by which reflected light can be diffused by projections and depressions on the surface so as to reduce the glare can be performed.

The first electrode and the second electrode (each of which may be called a pixel electrode, a common electrode, a counter electrode, or the like) for applying voltage to the display element may have light-transmitting properties or light-reflecting properties, which depends on the direction in which light is extracted, the position where the electrode is provided, and the pattern structure of the electrode.

The first electrode 930 and the second electrode 931 can be formed using a light-transmitting conductive material such as indium oxide including tungsten oxide, indium zinc oxide including tungsten oxide, indium oxide including titanium oxide, indium tin oxide including titanium oxide, ITO, indium zinc oxide, or indium tin oxide to which silicon oxide is added.

Alternatively, the first electrode 930 and the second electrode 931 can be formed using one or more materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); an alloy of any of these metals; and a nitride of any of these metals.

The first electrode 930 and the second electrode 931 can be formed using a conductive composition including a conductive macromolecule (also referred to as a conductive polymer). As the conductive high molecule, what is called a π-electron conjugated conductive polymer can be used. For example, polyaniline or a derivative thereof, polypyrrole or a derivative thereof, a copolymer of two or more of aniline, pyrrole, and thiophene, and the like can be given.

Since the transistor is easily broken owing to static electricity or the like, a protective circuit for protecting the driver circuit is preferably provided. The protection circuit is preferably formed using a nonlinear element.

As described above, by using any of the transistors described in the above embodiments, a highly reliable semiconductor device having a display function can be provided.

Note that the structures, methods, and the like described in this embodiment can be used as appropriate in combination with any of the structures, methods, and the like described in the other embodiments.

This application is based on Japanese Patent Application serial no. 2013-103716 filed with Japan Patent Office on May 16, 2013, the entire contents of which are hereby incorporated by reference.

What is claimed is:

1. A semiconductor device comprising:
a first insulating film over a substrate;
a first oxide insulating film over the first insulating film;
an oxide semiconductor film including a channel formation region over and in contact with the first oxide insulating film;
a second oxide insulating film over and in contact with the oxide semiconductor film; and
a second insulating film over the second oxide insulating film,
wherein the first insulating film and the second insulating film are in physical contact with each other, and
wherein the oxide semiconductor film, the second oxide insulating film, and a part of the first oxide insulating film are provided on an inner side of the first insulating film and the second insulating film.

2. The semiconductor device according to claim 1, further comprising:
a first gate electrode between the substrate and the first insulating film; and
a second gate electrode over the second insulating film,
wherein the first gate electrode and the second gate electrode are in contact with each other in an opening in the first insulating film and the second insulating film.

3. The semiconductor device according to claim 2, wherein a side surface of the oxide semiconductor film faces the second gate electrode with the second oxide insulating film and the second insulating film provided therebetween.

4. The semiconductor device according to claim 1, wherein each of the first insulating film and the second insulating film is one selected from a silicon nitride film, a silicon nitride oxide film, an aluminum nitride film, an aluminum nitride oxide film, an aluminum oxide film, an aluminum oxynitride film, a gallium oxide film, a gallium oxynitride film, an yttrium oxide film, an yttrium oxynitride film, a hafnium oxide film, and a hafnium oxynitride film.

5. The semiconductor device according to claim 1,
wherein the second oxide insulating film includes an oxide film containing more oxygen than that in a stoichiometric composition,
wherein a released amount of oxygen atoms from the oxide film in thermal desorption spectroscopy analysis is greater than or equal to $1.0 \times 10^{18}$ atoms/cm$^3$, and
wherein a surface temperature of the oxide film in the thermal desorption spectroscopy is higher than or equal to 100° C. and lower than or equal to 700° C.

6. A semiconductor device comprising:
a transistor comprising:
an first insulating film over a substrate;
a first oxide insulating film over the first insulating film;
an oxide semiconductor film over and in contact with the first oxide insulating film;
source and drain electrodes in contact with the oxide semiconductor film;
a second oxide insulating film over and in contact with the oxide semiconductor film; and
a second insulating film over the second oxide insulating film;
a pixel electrode over the second insulating film; and
a capacitor comprising;
a film having conductivity over the first oxide insulating film;
the second insulating film over and in contact with the film having conductivity; and
the pixel electrode,
wherein the first insulating film and the second insulating film are in physical contact with each other, and
wherein the pixel electrode is in contact with one of the source and drain electrodes in an opening in the second insulating film.

7. The semiconductor device according to claim 6,
wherein the film having conductivity is a metal oxide film including a metal element contained in the oxide semiconductor film and an impurity.

8. The semiconductor device according to claim 7, wherein the impurity is hydrogen.

9. The semiconductor device according to claim 6, further comprising a gate electrode over the second insulating film,
wherein the gate electrode and the pixel electrode include a same material.

10. The semiconductor device according to claim 9, wherein a side surface of the oxide semiconductor film faces the gate electrode with the second oxide insulating film and the second insulating film provided therebetween.

11. The semiconductor device according to claim 6,
wherein each of the first insulating film and the second insulating film is one selected from a silicon nitride film, a silicon nitride oxide film, an aluminum nitride film, an aluminum nitride oxide film, an aluminum oxide film, an aluminum oxynitride film, a gallium oxide film, a gallium oxynitride film, an yttrium oxide film, an yttrium oxynitride film, a hafnium oxide film, and a hafnium oxynitride film.

12. The semiconductor device according to claim 6,
wherein the second oxide insulating film includes an oxide film containing more oxygen than that in a stoichiometric composition,
wherein a released amount of oxygen atoms from the oxide film in thermal desorption spectroscopy analysis is greater than or equal to $1.0 \times 10^{18}$ atoms/cm$^3$, and
wherein a surface temperature of the oxide film in the thermal desorption spectroscopy is higher than or equal to 100° C. and lower than or equal to 700° C.

13. A semiconductor device comprising:
a transistor comprising:
a first gate electrode over a substrate;
a first insulating film over the first gate electrode;
a first oxide insulating film over the first insulating film;
an oxide semiconductor film over and in contact with the first oxide insulating film;
source and drain electrodes in contact with the oxide semiconductor film;
a second oxide insulating film over and in contact with the oxide semiconductor film;
a second insulating film over the second oxide insulating film; and
a second gate electrode over the second insulating film;
a pixel electrode over the second insulating film; and
a capacitor comprising;
a film having conductivity over the first oxide insulating film;
the second insulating film over and in contact with the film having conductivity; and
the pixel electrode,
wherein the first insulating film and the second insulating film are in physical contact with each other,
wherein the first gate electrode and the second gate electrode overlap each other with the oxide semiconductor film provided therebetween, and
wherein the pixel electrode is in contact with one of the source and drain electrodes in a first opening in the second insulating film.

14. The semiconductor device according to claim 13, wherein the first gate electrode and the second gate electrode are in contact with each other in a second opening in the first insulating film and the second insulating film.

15. The semiconductor device according to claim 13,
wherein the film having conductivity is a metal oxide film including a metal element contained in the oxide semiconductor film and an impurity.

16. The semiconductor device according to claim 15, wherein the impurity is hydrogen.

17. The semiconductor device according to claim 13, wherein the second gate electrode and the pixel electrode include a same material.

18. The semiconductor device according to claim 13, wherein a side surface of the oxide semiconductor film faces the second gate electrode with the second oxide insulating film and the second insulating film provided therebetween.

19. The semiconductor device according to claim 13,
wherein each of the first insulating film and the second insulating film is one selected from a silicon nitride film, a silicon nitride oxide film, an aluminum nitride film, an aluminum nitride oxide film, an aluminum oxide film, an aluminum oxynitride film, a gallium oxide film, a gallium oxynitride film, an yttrium oxide film, an yttrium oxynitride film, a hafnium oxide film, and a hafnium oxynitride film.

20. The semiconductor device according to claim 13,
wherein the second oxide insulating film includes an oxide film containing more oxygen than that in a stoichiometric composition,
wherein a released amount of oxygen atoms from the oxide film in thermal desorption spectroscopy analysis is greater than or equal to $1.0 \times 10^{18}$ atoms/cm$^3$, and
wherein a surface temperature of the oxide film in the thermal desorption spectroscopy is higher than or equal to 100° C. and lower than or equal to 700° C.

* * * * *